(12) United States Patent
Zhong et al.

(10) Patent No.: US 7,910,836 B2
(45) Date of Patent: Mar. 22, 2011

(54) MULTILAYERED PRINTED CIRCUIT BOARD, SOLDER RESIST COMPOSITION, AND SEMICONDUCTOR DEVICE

(75) Inventors: Hui Zhong, Ibi-gun (JP); Kenichi Shimada, Ibi-gun (JP); Yukihiko Toyoda, Ibi-gun (JP); Motoo Asai, Ibi-gun (JP); Dongdong Wang, Ibi-gun (JP); Koji Sekine, Ibi-gun (JP); Yoshitaka Ono, Ibi-gun (JP)

(73) Assignee: Ibiden Co. Ltd., Ogaki-shi (JP)

( * ) Notice: Subject to any disclaimer, the term of this patent is extended or adjusted under 35 U.S.C. 154(b) by 0 days.

(21) Appl. No.: 11/838,365

(22) Filed: Aug. 14, 2007

(65) Prior Publication Data
US 2008/0041615 A1 Feb. 21, 2008

Related U.S. Application Data

(62) Division of application No. 10/049,270, filed as application No. PCT/JP00/05044 on Jul. 28, 2000.

(30) Foreign Application Priority Data

Aug. 12, 1999 (JP) .................................. 11-228852
Aug. 17, 1999 (JP) .................................. 11-230875
Sep. 21, 1999 (JP) .................................. 11-266932
Sep. 22, 1999 (JP) .................................. 11-269320
Apr. 4, 2000 (JP) ............................... 2000-102769

(51) Int. Cl.
*H05K 1/03* (2006.01)

(52) U.S. Cl. ......................... 174/255; 174/257; 174/258

(58) Field of Classification Search .......... 174/255–258; 361/792–795
See application file for complete search history.

(56) References Cited

U.S. PATENT DOCUMENTS

| | | |
|---|---|---|
| 2,577,485 A | 12/1951 | Rule |
| 3,672,986 A | 6/1972 | Schneble, Jr. et al. |
| 3,825,430 A | 7/1974 | Kurka |
| 3,869,340 A | 3/1975 | Kotzsch et al. |
| 4,211,603 A | 7/1980 | Reed |
| 4,240,945 A | 12/1980 | Gabrick |
| 4,510,276 A | 4/1985 | Leech et al. |
| 4,555,532 A | 11/1985 | Tanaka et al. |

(Continued)

FOREIGN PATENT DOCUMENTS

EP 0 382 312 A2 8/1990

(Continued)

OTHER PUBLICATIONS

Ryusuke Kawano, et al., "A 100-Gb/s Throughput ATM Switch MCM with a 320-Channel Parallel Optical I/O Interface", 1999 Electronic Components and Technology Conference, pp. 753-758.

(Continued)

*Primary Examiner* — Tuan T Dinh
(74) *Attorney, Agent, or Firm* — Oblon, Spivak, McClelland, Maier & Neustadt, L.L.P.

(57) ABSTRACT

The present invention is to provide a multilayered printed circuit board free from cracks attributed to thermal expansion difference between a solder resist layer and another part and a multilayered printed circuit board of the present invention comprises a conductor circuit and a resin insulating layer serially formed on a substrate in an alternate fashion and in repetition and a solder resist layer formed as an outermost layer, and the solder resist layer contains an inorganic filler.

7 Claims, 36 Drawing Sheets

U.S. PATENT DOCUMENTS

| | | | |
|---|---|---|---|
| 5,049,596 A | 9/1991 | Fujimoto et al. | |
| 5,055,378 A | 10/1991 | Miyamura et al. | |
| 5,218,030 A | 6/1993 | Katayose et al. | |
| 5,665,795 A * | 9/1997 | Koushima et al. | 523/223 |
| 5,783,639 A | 7/1998 | Kataoka et al. | |
| 5,798,563 A | 8/1998 | Feilchenfeld et al. | |
| 5,827,604 A | 10/1998 | Uno | |
| 5,834,565 A | 11/1998 | Tracy et al. | |
| 5,990,190 A | 11/1999 | Nakamura et al. | |
| 6,001,488 A | 12/1999 | Kataoka et al. | |
| 6,331,593 B1 * | 12/2001 | Johoji et al. | 525/191 |
| 6,477,038 B2 | 11/2002 | Iwasaki et al. | |
| 6,506,495 B1 | 1/2003 | Enami et al. | |
| 6,526,859 B1 | 3/2003 | Azawa et al. | |
| 6,981,317 B1 | 1/2006 | Nishida | |

FOREIGN PATENT DOCUMENTS

| | | |
|---|---|---|
| EP | 0 844 809 A2 | 5/1998 |
| EP | 0 919 873 | 6/1999 |
| EP | 0957664 | 11/1999 |
| EP | 0 997 935 | 5/2000 |
| EP | 1030544 | 8/2000 |
| EP | 1 207 730 A1 | 5/2002 |
| GB | 2 097 998 | 11/1982 |
| GB | 2288404 | 10/1995 |
| JP | 51-143620 | 12/1976 |
| JP | 62-041223 | 2/1987 |
| JP | 01-209442 | 8/1989 |
| JP | 2-269730 | 11/1990 |
| JP | 03-008388 | 1/1991 |
| JP | 4-504332 | 7/1992 |
| JP | 5-039345 | 2/1993 |
| JP | 05-039345 | 2/1993 |
| JP | 05-160558 | 6/1993 |
| JP | 6-19129 | 1/1994 |
| JP | 6-167806 | 6/1994 |
| JP | 07-333848 | 12/1995 |
| JP | 8-20692 | 1/1996 |
| JP | 8-181458 | 7/1996 |
| JP | 8-507813 | 8/1996 |
| JP | 8-236906 | 9/1996 |
| JP | 8-259784 | 10/1996 |
| JP | 9-040751 | 2/1997 |
| JP | 09-130050 | 5/1997 |
| JP | 9-136931 | 5/1997 |
| JP | 9-137109 | 5/1997 |
| JP | 9-157316 | 6/1997 |
| JP | 9-219588 | 8/1997 |
| JP | 9-258446 | 10/1997 |
| JP | 09-258446 | 10/1997 |
| JP | 10-152545 | 6/1998 |
| JP | 11-012499 | 1/1999 |
| JP | 11-060689 | 3/1999 |
| JP | 11-140134 | 5/1999 |
| JP | 11-143073 | 5/1999 |
| JP | 11-181250 | 7/1999 |
| JP | 11-181398 | 7/1999 |
| JP | 11-199852 | 7/1999 |
| JP | 11-251752 | 9/1999 |
| WO | WO 91/06423 | 5/1991 |
| WO | WO 99/20090 | 4/1999 |
| WO | WO 01/11932 A1 | 2/2001 |

OTHER PUBLICATIONS

Alexander J. MacKinnon, et al. "Dielectric, mechanical and rheological studies of phase separation and cure of a thermoplastic modified epoxy resin: incorporation of reactively terminated polysulfones" Polymer, Elsevier Science Publishers, vol. 34, No. 14, Jan. 1, 1993, pp. 3252-3263, XP024120672.

G. Robert Traut, Ph.D. "Electrical performace of microwave boards" Proceedings of the Electronic Components and Technology Conference, Washington, May 1-4, 1994, vol. Conf. 44, May 1, 1994, pp. 557-563, XP 010126222.

* cited by examiner

Fig. 19
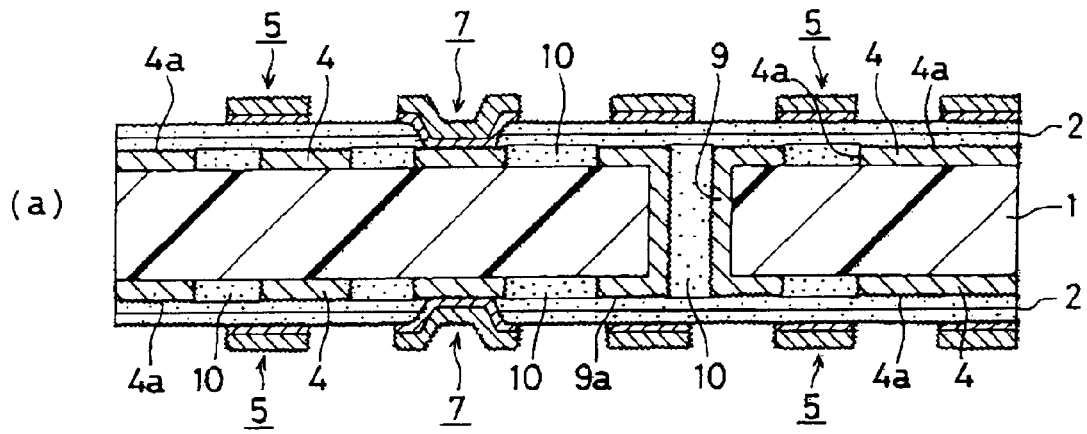
(a)
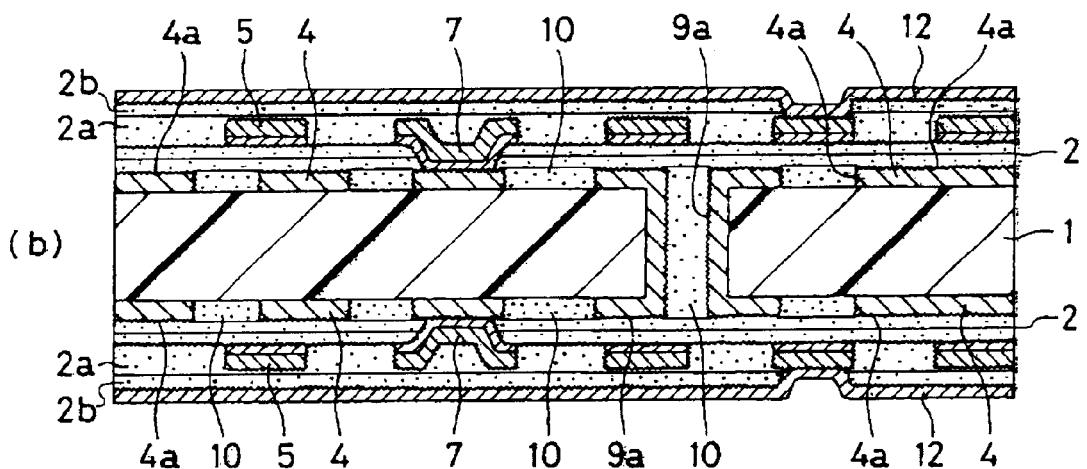
(b)
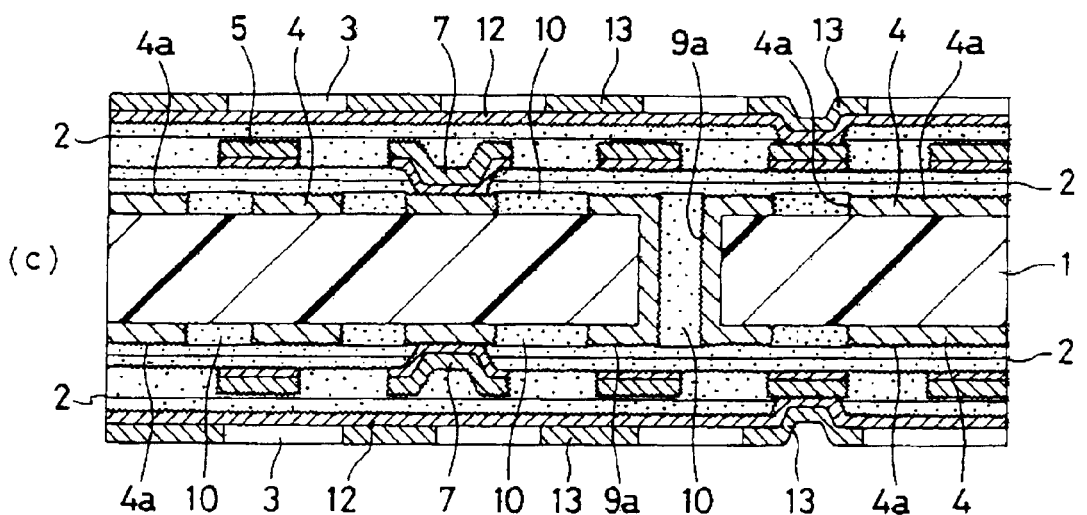
(c)

MULTILAYERED PRINTED CIRCUIT BOARD, SOLDER RESIST COMPOSITION, AND SEMICONDUCTOR DEVICE

CROSS REFERENCE TO RELATED APPLICATIONS

This application is a divisional of U.S. application Ser. No. 10/049,270, filed on Jun. 27, 2002, which is a National Stage entry under 35 U.S.C. §371 of International Application No. PCT/JP00/05044, filed on Jul. 28, 2000, the entire contents of each of which is hereby incorporated by reference. This application is further based on and claims the benefit of priority from the prior Japanese Patent Application Nos. 11-228852 filed on Aug. 12, 1999, 11-230875 filed on Aug. 17, 1999, 11-266932 filed on Sep. 21, 1999, 11-269320 filed on Sep. 22, 1999 and 2000-102769 filed on Apr. 4, 2000.

FIELD OF THE INVENTION

The present invention relates to a multilayered printed circuit board, a method for manufacturing the multilayered printed circuit board, a solder resist composition, and a semiconductor device.

BACKGROUND OF THE INVENTION

A multilayered printed circuit board so-called a multilayered built-up circuit substrate is manufactured by a semi-additive method and the like and produced by reciprocally layering conductor circuits of copper and the like and interlaminar resin insulating layers on a resin substrate reinforced with a 0.5 to 1.5 mm-thick glass cloth so-called a core. The interlaminar connection of the conductor circuits through the interlaminar resin insulating layers of the multilayered printed circuit board is performed by a via-hole.

Conventionally, the built-up multilayered printed circuit board has been manufactured by a method, for example, disclosed in Japanese H09-130050 A.

That is, at first, a through hole is formed in a copper-laminated laminate board bearing a copper foil and successively, the substrate is subjected to electroless copper plating treatment to form copper plating treatment to form a plated-through hole. Next, a conductor circuit is formed by etching the surface of the substrate in a conductor pattern and then the surface of the conductor circuit is roughened by electroless plating or etching and the like. Continuously, a resin insulating layer is formed on the conductor circuit having a roughened surface and then subjected to exposure and development treatment to form an opening part for a via-hole and after that, the interlaminar resin insulating layer is formed by UV curing and main curing.

Further, after the interlaminar resin insulating layer is subjected to roughening treatment by an acid or an oxidizing agent, a thin electroless plating film is formed and, then after a plating resist is formed on the electroless plating film, the thin electroless plating film is thickened by electroplating and after the plating resist is parted, etching is carried out to form a conductor circuit connected with a under-level conductor circuit through the via-hole.

After repeating these steps, finally a solder resist layer for protecting the conductor circuit is formed and the parts exposing the conductor circuit for connection with electronic parts, e.g. an IC chip, or a mother board and the like, are plated and then a solder bump is formed by printing a solder paste to complete the manufacture of a built-up multilayered printed circuit board.

A multilayered printed circuit board manufactured in such a manner is subjected to reflowing treatment after an IC chip is mounted thereon as to connect the solder bump to pads of the IC chip, and then, an under-fill (a resin layer) under the IC chip and a sealing layer of a resin or the like are formed on the IC chip to complete manufacture of a semiconductor device comprising the IC chip mounted thereon.

In the semiconductor device manufactured in such a manner, generally, a respective layer has different thermal expansion coefficients (linear expansion coefficients) attributed to the materials thereof. That is, the linear expansion coefficients of the IC chip, the under-fill and the interlaminar resin insulating layers are generally $20 \times 10^{-6}$/K or lower, whereas the solder resist layer has the linear expansion coefficient as high as $60 \times 10^{-6}$/K to $80 \times 10^{-6}$/K because resins to be used are different and because of other reasons, and at highest, some have the linear expansion coefficient exceeding $100 \times 10^{-6}$/K.

When a semiconductor device having such a constitution is operated, the IC chip radiates heat and the generated heat is transmitted through the under-fill to the solder resist layer, the interlaminar resin insulating layers and the like. Hence, these layers are thermally expanded owing to the temperature increase.

On this occasion, since the IC chip and the under-fill have very close linear expansion coefficients and since their degree of expansion owing to the temperature increase are very close, no significant stress which is attributed to the difference of their thermal expansion coefficients is generated. On the other hand, since the difference of the linear expansion coefficient between the under-fill or the interlaminar resin insulating layer and the solder resist layer sandwiched by those is large, the degrees of expansion owing to the temperature increase differ considerably. Hence, considerable stress is generated to the solder resist layer and, in some cases, cracks take place in the solder resist layer, or the solder resist layer is peeled from the under-fill or the interlaminar resin insulating layer.

Such cracking and peeling even take place with the heat at the time of forming the solder bump. Also, cracking occurs more easily in a heat cycle test and in a reliability test under a high temperature and a high humidity, in which the multilayered printed circuit board is tried in severe condition.

If cracks are once formed in the solder resist layer, the insulation between the conductor circuit under the solder resist layer and the solder bump cannot be retained, thus to result in a degradation of the high insulating property and the reliability.

Further, since a mixture of an epoxy resin, an acrylic resin and the like is used for the interlaminar resin insulating layer in a conventional multilayered printed circuit board manufactured by the above described method, the dielectric constant and the dielectric loss tangent are high in a GHz band and, in this case, if a LSI chip and the like using high frequency signals in the GHz band are mounted on this, signal delay and signal error sometimes occur attributed to the high dielectric constant of the interlaminar resin insulating layer.

Hence, in order to solve the above mentioned problems, proposed is a multilayered printed circuit board in which a polyolefin type resin, a polyphenylene ether resin, a fluororesin and the like having low dielectric constants are used for the interlaminar resin insulating layer.

In such a multilayered printed circuit board, the problem of generation of signal delay and signal error can be solved to some extent since most part of conductor circuits are formed in the interlaminar resin insulating layers.

However, as the frequency of the IC chip tends to be increased to a higher frequency, the density of the circuits in the IC chip is increased and the circuit pitches are narrowed, consequently, it is required to narrow the intervals of pads for outer terminals of a printed circuit board which is to be connected with the IC chip and also the number of the pad for the outer terminals per unit surface area is increased to lead to a high density thereof.

Therefore, if the dielectric constant and the dielectric loss tangent of a solder resist layer are high, it sometimes occurs a problem that signal delay and the like: in the bumps for the outer terminals of the solder resist layer; and in the inter-circuits are caused attributed to electromagnetic inter-reaction among circuits and the high dielectric property of the insulating layers existing in the surrounding of the circuits.

Further, even in the case that a multilayered printed circuit board for which a polyphenylene ether resin with a low dielectric loss tangent and a low dielectric constant and which does not induce easily the signal delay and signal error just as described above is used for the interlaminar resin insulating layers, such an effect is offset if the dielectric constant of a solder resist layer is high, therefore, signal delay and signal error sometimes take place.

Further, in a conventional manufacture of a multilayered printed circuit board, a solder resist layer is formed by using a paste-like fluid as a solder resist composition which is containing thermosetting resins such as a novolak type epoxy resin (meth)acrylate, an imidazole curing agent, a bifunctional (meth)acrylic acid ester monomer, a (meth)acrylic acid ester polymer with a molecular weight of 500 to 5000, thermosetting resin comprising a bisphenol type epoxy resin and the like, photosensitive monomers such as polyvalent acrylic monomers, and glycol ether type solvents and by applying and curing the fluid.

A multilayered printed circuit board comprising such a solder resist layer is to be used with electronic parts such as an IC chip being mounted thereon. Hence, the multilayered printed circuit board is desired to be durable even if the IC chip fires owing to a variety of causes. Practically, it is desired for the multilayered printed circuit board to clear the judgment standard of UL94 of a UL test standard and to clear especially the judgment standard of combustion time in 94V-0.

Further, while satisfying the above described flame retardancy, the multilayered printed circuit board is required to keep the openability of holes of the resin insulating layers or the solder resist layer without deterioration, as compared with those of an existing multilayered printed circuit board, at the time of forming an opening of a via-hole and an opening for a solder pad. It is moreover required to keep the adhesion strength between the resin insulating layers and the like and the conductor circuits without deterioration. Furthermore, the multilayered printed circuit board is required to keep its performance without deterioration at the time of a reliability test.

However, the multilayered printed circuit board comprising a solder resist layer formed by using a conventional solder resist composition has not been satisfactory in terms of flame retardancy.

SUMMARY OF THE INVENTION

The present invention is developed to solve the above described problems and an objective of the present invention is to provide a multilayered printed circuit board free from cracks attributed to thermal expansion difference between a solder resist layer and another part during the manufacturing process of the multilayered printed circuit board or after an IC chip is mounted on the multilayered printed circuit board, to provide a solder resist composition to be used for the manufacture of the multilayered printed circuit board, and to provide a method for manufacturing a multilayered printed circuit board using said solder resist composition.

Further, another objective of the present invention is to provide a multilayered printed circuit board and a semiconductor device which have a solder resist layer with which signal delay and signal error do not easily take place even if high frequency signals in the GHz band are used.

Further, the other purpose of the prevent invention is to provide a multilayered printed circuit board having a solder resist layer having excellent flame retardancy, high adhesion strength to a conductor circuit, and an opening with desired shapes.

A first invention of a first group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer contains an inorganic filler.

Further, a second invention of the first group of the present invention is a solder resist composition to be used for manufacturing the multilayered printed circuit board of the first invention of the first group of the present invention, wherein an inorganic filler is mixed with a paste containing a resin for a solder resist layer.

A third invention of the first group of the present invention is a method for manufacturing a multilayered printed circuit board comprising a conductor circuit and a resin insulating layer serially formed on a substrate in an alternate fashion and in repetition and a solder resist layer formed as an outermost layer, wherein the foregoing solder resist composition is used.

A first invention of a second group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer contains an elastomer component.

A second invention of the second group of the present invention is a solder resist composition to be used for manufacturing the multilayered printed circuit board of the first invention of the second group of the present invention, wherein an elastomer component is mixed with a paste containing a resin for a solder resist layer.

A third invention of the second group of the present invention is a method for manufacturing a multilayered printed circuit board comprising a conductor circuit and a resin insulating layer serially formed on a substrate in an alternate fashion and in repetition and a solder resist layer as an uppermost layer, wherein the foregoing solder resist composition of the second invention of the second group of the present invention is used.

A first invention of a third group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer has a dielectric constant of 3.0 or lower at 1 GHz.

A second invention of the third group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer is comprising a polyolefin type resin.

A third invention of the third group of the present invention is a semiconductor device comprising:

a multilayered printed circuit board wherein a conductor circuit and a resin insulating layer are serially formed on a substrate in an alternate fashion and in repetition, and a solder resist layer having a solder bump is formed as an uppermost layer; and an IC chip connected with the foregoing multilayered printed circuit board through the solder bump, wherein the foregoing solder resist layer is comprising a polyolefin type resin and the foregoing resin insulating layer is comprising a polyolefin type resin, a polyphenylene type resin or a fluoro type resin.

A first invention of a fourth group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer has a dielectric loss tangent of 0.01 or lower at 1 GHz.

A second invention of the fourth group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer is comprising a polyphenylene ether resin.

A third invention of the fourth group of the present invention is a semiconductor device comprising:

a multilayered printed circuit board wherein a conductor circuit and a resin insulating layer are serially formed on a substrate in an alternate fashion and in repetition, and a solder resist layer having a solder bump as an uppermost layer; and an IC chip connected with the foregoing multilayered printed circuit board through the solder bump, wherein the foregoing solder resist layer is comprising a polyphenylene ether resin and the foregoing resin insulating layer is comprising a polyphenylene ether resin, a polyolefin type resin or a fluoro type resin.

A fifth group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer contains a P atom-containing epoxy resin.

BRIEF DESCRIPTION OF DRAWINGS

FIGS. 19 (*a*) to (*c*) are cross-section figures showing a part of a manufacturing processes of a multilayered printed circuit board of the present invention.

FIGS. 21 (*a*) to (*c*) are cross-section figures showing a part of a manufacturing processes of a multilayered printed circuit board of the present invention.

FIGS. 22 (*a*) to (*d*) are cross-section figures showing a part of a manufacturing processes of a multilayered printed circuit board of the present invention.

Figure 1:
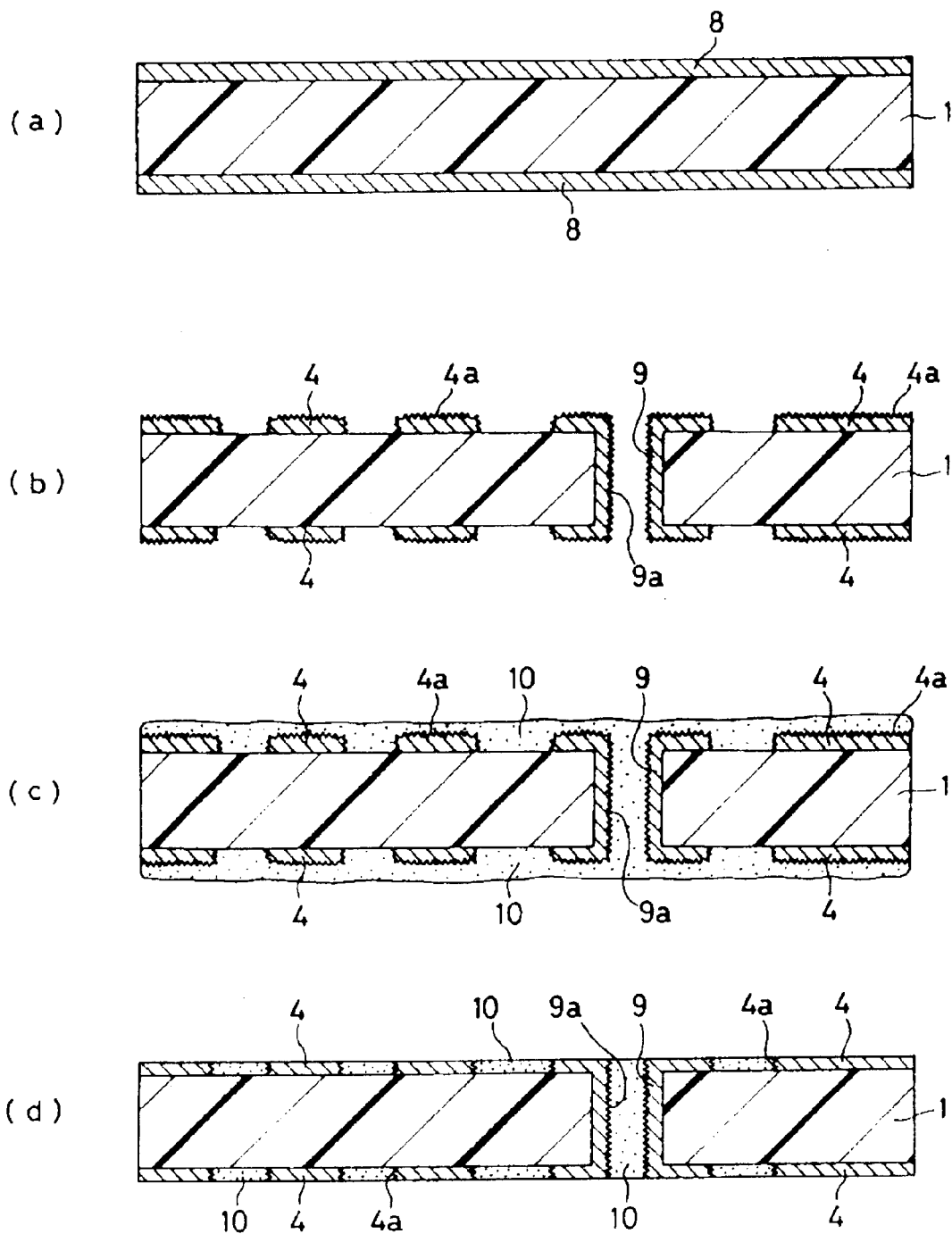
FIGS. 1 (*a*) to (*d*) are cross-section figures showing a part of a manufacturing processes of a multilayered printed circuit board of the present invention.

DESCRIPTION OF SYMBOLS 1 a substrate
2*a*, 2*b* a layer of a resin composition for roughened-surface formation
2 an interlaminar resin insulating layer
4 an under-level conductor circuit
4*a* a roughened surface
5 an upper level conductor circuit
6 an opening part for a via-hole
7 a via-hole
8 a copper foil
9 a through hole
9*a* a roughened surface
10 a resin filler
11 a roughened layer
12 an electroless plating layer
13 an electroplating layer
14 a solder resist layer
15 a nickel plating film
16 a gold plating film
17 a solder bump
19 a solder
20 a pin

DETAILED DESCRIPTION OF THE INVENTION

At first, the first group of the present invention will be described in details.

The first invention of a first group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer contains an inorganic filler.

In the multilayered printed circuit board of the first invention of the first group of the present invention, since the solder resist layer contains the inorganic filler, the foregoing solder resist layer has a lowered thermal expansion coefficient attributed to the inorganic filler. Hence, linear expansion coefficient difference with the interlaminar resin insulating layer and an under-fill existing in the surroundings becomes small. Consequently, cracking in the solder resist layer and peeling of the solder resist layer from other layers can be prevented during a manufacturing process of the multilayered printed circuit board and after electronic parts such as an IC chip are mounted on the multilayered printed circuit board.

That is, since the foregoing inorganic filler has a low linear expansion coefficient as compared with that of a resin composing the solder resist layer, when the solder resist layer is expanded by the heat and a relatively high inner stress is caused in the solder resist layer attributed to the difference of the linear expansion coefficient with the under-fill or the interlaminar resin insulating layer, it works as to moderate the stress. In such a manner, the inner stress in the solder resist layer can be moderated by the inorganic filler, so that generation of cracking and peeling in the solder resist layer can be prevented.

The foregoing inorganic filler is not specifically limited and examples are an aluminum compound, a calcium compound, a potassium compound, a magnesium compound, a silicon compound and the like. These compounds may be used solely or as a mixture of two or more of them.

As the foregoing aluminum compound, examples are alumina, aluminum hydroxide and the like and as the foregoing calcium compound, examples are calcium carbonate, calcium hydroxide and the like.

As the foregoing potassium compound, examples are potassium carbonate and the like and as the foregoing magnesium compound, examples are magnesia, dolomite, a basic magnesium carbonate and the like and as the foregoing silicon compound, examples are silica, a zeolite and the like.

Although the shape of the foregoing inorganic filler is not specifically limited, for example, available are a spherical shape, an elliptically spherical shape, a polygonal shape and the like. Among them, the spherical shape and the elliptically spherical shape are preferable since cracking easily takes place if it has a sharp tip.

The size of the foregoing inorganic filler is preferably within a range from 0.1 to 5.0 μm for the length of the longest part (or the diameter). In case of being shorter than 0.1 μm, it is difficult to moderate the inner stress generated at the time when the solder resist layer is thermally expanded and to control the thermal expansion coefficient. In case of being longer than 5.0 μm, the solder resist layer itself becomes stiff and fragile, and further at the time of photocuring or thermosetting process, the inorganic filler inhibits the reaction between the resins and consequently, cracking is easily caused. From such points of view, the inorganic filler is more preferably to be transparent.

In case of adding $SiO_2$ as the foregoing inorganic filler, the mixing ratio of the filler is preferably within a range from 3 to 50% by weight. In case of the ratio thereof being less than 3% by weight, the thermal expansion coefficient of the solder resist layer is sometimes not sufficiently decreased and on the other hand, in case of the ratio thereof being more than 50% by weight, the resolution is lowered and the opening part sometimes becomes abnormal. More preferably, it is within a range from 5 to 40% by weight.

The content of the inorganic filler in the solder resist layer is more preferably 5 to 40% by weight. By using the inorganic filler within the forgoing range, the linear expansion coefficient of the solder resist layer can effectively be lowered and the stress to be generated by the thermal expansion can effectively be moderated.

That is because the linear expansion coefficient of the resins or the resin complex composing the solder resist layer, which is generally as high as $60\times10^{-6}$ to $80\times10^{-6}$/K, can be lowered to about $40\times10^{-6}$ to $50\times10^{-6}$/K by adding the foregoing inorganic filler to the layer.

Further, the solder resist layer is preferable to be mixed with a resin of an elastomer. The elastomer itself is excellent in the flexibility and the resilient elasticity, so that even if receiving the stress, the elastomer can absorb the stress or moderate the stress to prevent cracking and peeling. Also, by forming an island-in-sea structure, the cracking and peeling attributed to the stress can be prevented. Incidentally, the island-in-sea structure means the state that the elastomer component exists like islands dispersed in the sea of the solder resist composition other than the elastomer component.

As the foregoing elastomer, usable are natural rubber, synthetic rubber, thermoplastic resins, thermosetting resins and the like. The one especially capable of sufficiently moderating the stress is an elastomer of a thermosetting resin.

As the foregoing elastomer of the thermosetting resin, examples are an polyester type elastomer, a styrene type elastomer, a vinyl chloride type elastomer, a fluoro type elastomer, an amide type elastomer, an olefinic elastomer and the like.

The solder resist layer composing the first invention of the first group of the present invention may further contain, for example, a thermosetting resin, a thermoplastic resin, a complex of a thermosetting resin and a thermoplastic resin other than the foregoing inorganic filler and elastomer. As such a resin layer, examples are: those formed by polymerizing and curing compositions comprising novolak type epoxy resin (meth)acrylate, a bifunctional (meth)acrylic acid ester monomer, a (meth)acrylic acid ester polymer with a molecular weight of 500 to 5000, a thermosetting resin comprising a bisphenol type epoxy resin, and photosensitive monomers such as polyvalent acrylic monomers; and the like.

The foregoing bifunctional (meth)acrylic acid ester monomer is not specifically limited, and examples are esters of acrylic acid or methacrylic acid with a variety of diols. Products available on the market are R-604, PM2, PM21 and the like produced by Nippon Kayaku Co., Ltd.

As the foregoing novolak type epoxy resin (meth)acrylate, examples are epoxy resins produced by reaction of glycidyl ether of phenol novolak and cresol novolak with acrylic acid or methacrylic acid. Incidentally, a method for manufacturing such a multilayered printed circuit board will be described somewhere later.

Next, a solder resist composition of the second invention of the first group of the present invention will be described below.

The solder resist composition of the second invention of the first group of the present invention is a solder resist composition to be employed for manufacturing the multilayered printed circuit board of the first invention of the first group of the present invention, wherein an inorganic filler is mixed with a paste containing a resin for solder resist a layer.

As the inorganic filler, the foregoing ones can be used. The adding ratio of the filler is preferable to be 5 to 20% by weight in the formed solder resist layer.

The solder resist composition of the second invention of the first group of the present invention is preferably a paste-like fluid containing, other than the foregoing inorganic filler, the foregoing novolak type epoxy resin (meth)acrylate, an imidazole curing agent, a bifunctional (meth)acrylic acid ester monomer, a (meth)acrylic acid ester polymer with a molecular weight of 500 to 5000, a thermosetting resin comprising a bisphenol type epoxy resin and the like, photosensitive monomers such as polyvalent acrylic monomers, and glycol ether type solvents, and the viscosity thereof is preferable to be controlled at 1 to 10 Pa·s at 25° C.

Although the foregoing imidazole curing agent is not specifically limited, it is preferable to use an imidazole curing agent in the liquid-state at 25° C. That is because if it is a powder, uniform mixing and kneading is difficult and if in the liquid phase, uniform mixing and kneading is easily carried out.

Examples of such a liquid-phase imidazole curing agent are 1-benzyl-2-methylimidazole (1B2MZ, made by Shikoku Chemicals Corp.), 1-cyanoethyl-2-ethyl-4-methylimidazole (2E4MZ-CN, made by Shikoku Chemicals Corp.), 4-methyl-2-ethylimidazole (2E4MZ, made by Shikoku Chemicals Corp.) and the like.

As the foregoing glycol ether type solvents, preferable are those having chemical structure defined with the following general formula [1] and practically, it is more preferable to use at least one selected from diethylene glycol dimethyl ether (DMDG) and triethylene glycol dimethyl ether (DMTG). Because these solvents can completely dissolve benzophenon, Michler's ketone, and ethylaminobenzophenone, which are polymerization initiators, by increasing the temperature by 30 to 50° C.

$$CH_3O-(CH_2CH_2O)_n-CH_3 \quad [1]$$

(wherein the reference character n represents an integer of 1 to 5)

At the time of forming the solder resist layer using such a solder resist component, at first a paste having the foregoing composition is applied to a substrate, on which a plurality of conductor circuits and a plurality of interlaminar resin insulating layers are formed and a conductor circuit is formed on the uppermost layer by the steps to be described somewhere later: by a roll coater method or the like and then dried; or the solder resist composition is formed into a film and the film is pressure-stuck to the substrate with above mentioned structure. After that, an opening part for a solder bump is formed at points in a solder resist layer corresponding to the prescribed positions of the under-level conductor circuit and, if necessary, curing treatment is carried out to form a solder resist layer.

The method for manufacturing a multilayered printed circuit board of the third invention of the first group of the present invention is a method for manufacturing a multilayered printed circuit board comprising a conductor circuit and a resin insulating layer serially formed on a substrate in an alternate fashion and in repetition and a solder resist layer formed as an outermost layer, wherein the foregoing solder resist composition of the second invention of the first group of the present invention is used.

The method for manufacturing a multilayered printed circuit board of the third invention of the first group of the present invention will be described along the processes in order.

(1) In the foregoing method for manufacturing a multilayered printed circuit board of the present invention, at first a substrate comprising an insulating substrate bearing a conductor circuit formed on the surface is produced.

As the foregoing insulating substrate, a resin substrate is desirable. Practically usable are, for example, a glass epoxy substrate, a polyester substrate, a polyimide substrate, a bismaleimide-triazine resin substrate, a thermosetting polyphenylene ether substrate, a fluororesin substrate, a ceramic substrate, a copper-laminated laminate board, an RCC substrate and the like.

At that time, a through hole may be formed in the insulating substrate. In this case, the through hole is preferably formed using a drill or laser beam of 100 to 300 μm diameter.

(2) Next, after electroless plating is carried out, an etching resist with a conductor circuit pattern is formed on the substrate and etched to form a conductor circuit. Copper plating is desirable for the electroless plating. Further, in case of forming a through hole for a plated-through hole in the insulating substrate, the side walls of the a through hole for a plated-through hole may simultaneously be plated by the electroless plating to form the plated-through hole to electrically connect the conductor circuits on both sides of the substrate.

Further, after the electroless plating, generally, the surface of the electroless plating layer and, in the case that the plated-through hole is formed, the inner wall of the plated-through hole are subjected to the roughening treatment. The roughening treatment method includes, for example, a blackening (oxidation)-reduction treatment, a spraying treatment with an aqueous mixed solution of an organic acid and a cupric complex, a Cu—Ni—P acicular alloy plating and the like.

Practical methods for the foregoing blackening (oxidation)-reduction treatment are, for example, those for carrying out blackening treatment using an aqueous solution containing NaOH (10 g/l), NaClO$_2$ (40 g/l), and Na$_3$PO$_4$ (6 g/l) as a blackening bath (an oxidizing bath) and reducing treatment using an aqueous solution containing NaOH (10 g/l) and NaBH$_4$ (6 g/l) as a reducing bath.

Regarding the aqueous mixed solution containing the organic acid and the cupric complex to be used for the foregoing spraying treatment, examples of the organic acid are formic acid, acetic acid, propionic acid, butyric acid, valeric acid, caproic acid, acrylic acid, crotonic acid, oxalic acid, malonic acid, succinic acid, glutaric acid, maleic acid, benzoic acid, glycolic acid, lactic acid, malic acid, sulfamic acid, and the like.

They may be used solely or as a mixture of two or more of them. In the foregoing mixed solution, the content of the foregoing organic acid is preferably 0.1 to 30% by weight. Because the solubility of the oxidized copper can be maintained and the catalytic stability can be assured.

As the foregoing cupric complex, cupric complexes with azoles are preferable. The cupric complexes with azoles work as oxidizing agent to oxidize the metal copper and the like. Examples of the azoles are diazole, triazole, tetrazole and the like. Among them, especially desirable are imidazole, 2-methylimidazole, 2-ethylimidazole, 2-ethyl-4-methylimidazole, 2-phenylimidazole, 2-undecylimidazole. In the foregoing etching solution, the content of the foregoing cupric complex is preferably 1 to 15% by weight. That is because the solubility and the stability are kept excellent and also a noble metal such as Pd composing a catalyst core can be dissolved.

An example of the practical method for the foregoing plating treatment is a method for carrying out an electroless plating in an electroless plating bath containing copper sulfate (1 to 40 g/l), nickel sulfate (0.1 to 6.0 g/l), citric acid (10 to 20 g/l), sodium hypophosphite (10 to 100 g/l), boric acid (10 to 40 g/l), and a surfactant (Surfynol 465, made by Nisshin Chemical Industry Co., Ltd.) (0.01 to 10 g/l) at pH 9 or the like.

In the case where the plated-through hole is formed in that process, the plated-through hole are filled with a resin filler. Further, based on necessity, recessed parts of the surface of the insulating substrate where no under-level conductor circuit is formed are also filled with the resin filler and after that the insulating substrate surface may be leveled by polishing.

In the case where the plated-through hole is filled with the resin filler, the resin filler is dried at 100° C. for 20 minutes and then cured.

The curing is preferably carried out at a temperature between 50° C. and 250° C. The curing conditions may be, for example, heating at 100° C. for 1 hour and then at 150° C. for 1 hour. Based on necessity, curing may be carried out step by step by changing the temperature from a lower level to a higher level.

Further, in the case where the surface of the conductor circuit is leveled by polishing, if necessary, the roughening treatment for the under-level conductor circuit may be carried out. As the roughening treatment, applicable are, for example, a blackening (oxidation)-reduction treatment, a spraying treatment with an aqueous mixed solution of an organic acid and a cupric complex, a Cu—Ni—P alloy plating and the like.

(3) Next, a layer of a resin composition is formed on the substrate on which the conductor circuit is formed, and in the layer of the resin composition, an opening part for a via-hole and, if necessary, a through hole is formed to form an interlaminar resin insulating layer.

As a material for the foregoing interlaminar resin insulating layer, examples are a resin composition for roughened-surface formation, a polyphenyl ether resin, a polyolefin type resin, a fluororesin, a thermoplastic elastomer and the like.

The foregoing layer of the resin composition may be formed by applying an un-cured resin or thermally pressure-laminating an un-cured resin film. Further, an un-cured resin film with a metal layer of such as a copper foil or the like formed on one side may be laminated.

As the foregoing resin composition for the roughened-surface formation, usable is, for example, a dispersion in which a particle soluble in an acid or an oxidizing agent (hereinafter referred to as a soluble particle) dispersed in a resin hardly soluble in an acid or an oxidizing agent (hereinafter referred to as a hardly soluble resin).

Incidentally, for the sake of convenience, the foregoing terms, hardly soluble and soluble, mean that those dissolved at a relatively high dissolution speed are defined soluble and those at a relatively low dissolution speed are defined hardly soluble when they are soaked in the same solution for the same time.

Examples of the foregoing soluble particle are a resin particle soluble in an acid or an oxidizing agent (hereinafter referred to as a soluble resin particle), an inorganic particle soluble in an acid or an oxidizing agent (hereinafter referred to as a soluble inorganic particle), and a metal particle soluble in an acid or an oxidizing agent (hereinafter referred to as a soluble metal particle). These soluble particles may be used solely or two or more of them in combination.

The shape (particle diameter and the like) of the foregoing soluble particle are not specifically limited, however the following are preferable; (a) a soluble particle with the average particle diameter of 10 μm or smaller, (b) an agglomerated particle formed by agglomerating a soluble particle which has the average particle diameter of 2 μm or smaller, (c) a mixture of a soluble particle with the average particle diameter of 2 to 10 μm and a soluble particle with the average particle diameter of 2 μm or smaller, (d) a pseudo-particle formed by sticking at least one of a heat resistant resin powder or an inorganic powder with the average particle diameter of 2 μm or smaller to the surface of a soluble particle with the average particle diameter of 2 to 10 μm, (e) a mixture of a soluble particle with the average particle diameter of 0.1 to 0.8 μm and a soluble particle with the average particle diameter larger than 0.8 μm and smaller than 2 μm, and (f) a soluble particle with the average particle diameter of 0.1 to 1.0 μm. Because these are capable of forming further complicated anchors.

Examples of the soluble resin particle are those comprising a thermosetting resin, a thermoplastic resin, and the like and any can be used without restriction as long as they have higher dissolution speed than the foregoing hardly soluble resin when they are immersed in a solution comprising an acid or an oxidizing agent.

Practical examples of the foregoing soluble resin particle are those comprising an epoxy resin, a phenol resin, a polyimide resin, a polyphenylene resin, a polyolefin resin, a fluororesin, an amino resin (a melamine resin, an urea resin, a guanamine resin) and the like and the soluble resin particle may be of one of these resins or of a mixture of two or more of the resins.

Further, as the foregoing soluble resin particle, a resin particle comprising rubber can be employed. As the foregoing rubber, examples are polybutadiene rubber, a variety of modified polybutadiene rubber such as an epoxy-modified, an urethane-modified, a (meth)acrylonitrile-modified ones, a (meth)acrylonitrile-butadiene rubber containing carboxyl group and the like. By using such a rubber, the soluble resin particle becomes easy to be dissolved in an acid or an oxidizing agent. That is, at the time when the soluble resin particle is dissolved using an acid, it can be dissolved in an acid other than a strong acid. Also, at the time when the soluble resin particle is dissolved using an oxidizing agent, it can be dissolved even in a permanganic acid with a relatively weak oxidizing ability. Further, in case of using a chromic acid, dissolution can be carried out in a low concentration. Hence, no acid and no oxidizing agent remain on the resin surface. Also, at the time when a catalyst such as palladium chloride and the like is supplied after roughened-surface formation, as described later, such a case where no catalyst is supplied or that the catalyst is oxidized can be avoided.

As the foregoing soluble inorganic particle, examples are particles of at least one member selected from the group consisting of an aluminum compound, a calcium compound, a potassium compound, a magnesium compound, a silicon compound and the like.

As the foregoing aluminum compound, examples are alumina, aluminum hydroxide and the like and as the foregoing calcium compound, examples are calcium carbonate, calcium hydroxide and the like. As the foregoing potassium compound, examples are potassium carbonate and the like and as the foregoing magnesium compound, examples are magnesia, dolomite, a basic magnesium carbonate and the like and as the foregoing silicon compound, examples are silica, a zeolite and the like. These compounds may be used solely or two or more of them in combination.

As the foregoing soluble metal particle, examples are particles of at least one of metals selected from the group consisting of copper, nickel, iron, zinc, lead, gold, silver, aluminum, magnesium, calcium, and silicon. Further, these soluble metal particles may be coated with a resin and the like on the surface in order to reliably keep the high insulating property.

In case of mixing two or more of the foregoing soluble particles to be used, the combination of two types of the soluble particles to be mixed is preferably a combination of a resin particle and an inorganic particle. Because both have low conductivity enough to reliably keep the high insulating property of a resin film, are easy to arrange the thermal expansion between a hardly soluble resin and them, and thus cause no crack in an interlaminar resin insulating layer formed by using the resin film and no peeling between an interlaminar resin insulating layer and a conductor circuit.

The foregoing hardly soluble resin is not specifically restricted as long as it can retain the roughened surface shape at the time of forming a roughened surface on an interlaminar resin insulating layer using an acid or an oxidizing agent and examples are a thermosetting resin, a thermoplastic resin, a complex of them and the like. Further, a photosensitive resin obtained by providing these resins with photosensitivity may be used.

Among them, those containing a thermosetting resin are preferable. Because, attributed to them, the shape of the roughened surface can be maintained even by immersing in a plating solution or various heating treatments.

As the foregoing thermosetting resin, examples are an epoxy resin, a phenol resin, a polyimide resin and the like. Further, as the photosensitized resin, those produced by acrylic reaction of methacrylic acid or acrylic acid with a thermosetting group are examples. Especially, acrylated epoxy resin are preferable. Among them, epoxy resins having 2 or more of epoxy groups in one molecule are preferable. That is because they are not only able to form the foregoing roughened surface but also excellent in heat resistance, so that the concentration of the stress upon the metal layer can be avoided and the metal layer is not peeled easily even in heat cycle conditions.

Examples of the foregoing epoxy resins are a cresol novolak type epoxy resin, a bisphenol A type epoxy resin, a bisphenol F type epoxy resin, a phenol novolak type epoxy resin, an alkylphenol novolak type epoxy resin, a biphenol F type epoxy resin, a naphthalene type epoxy resin, a dicyclopentadiene type epoxy resin, epoxy compounds of condensates of phenols and aromatic aldehydes having phenolic hydroxyl groups, triglycidyl isocyanurate, an alicyclic epoxy resin and the like. They may be used solely or two or more of them in combination. Heat resistance is therefore made high.

Examples of the foregoing thermoplastic resin are a polyether sulfone (PES), a polysulfone (PSF), a polyphenylene sulfone (PPS), a polyphenylene sulfide (PPES), a polyphenylene ether (PPE), a polyether imide (PI), a phenoxy resin, a fluororesin and the like.

The mixing ratio of the foregoing thermosetting resin and thermoplastic resin is preferably the thermosetting resin/the thermoplastic resin=(95/5) to (50/50). Because with the ratio, a high rigidity value can surely be obtained without deteriorating the heat resistance.

The mixing ratio of the foregoing soluble particle by weight is preferably 5 to 50% by weight, more preferably 10 to 40% by weight, on the bases of solid content of the hardly soluble resin.

In case of using an un-cured resin film to form the foregoing interlaminar resin insulating layer, the soluble particle is preferable to be evenly dispersed in the foregoing hardly soluble resin in the foregoing film. Because a roughened surface with uniform roughness can be formed and a high adhesion strength to a metal layer of a conductor circuit to be formed can reliably be obtained even if a via-hole and a plated-through hole are formed in the resin film. Further, a resin film containing the soluble particle only in the surface layer part where the roughened surface is to be formed may be used. Consequently, since the parts other than the surface layer part of the resin film are not exposed to an acid or an oxidizing agent, the high insulating property between neighboring conductor circuits through the interlaminar resin insulating layer can reliably be maintained.

The mixing ratio of the soluble particle dispersed in the hardly soluble resin particle in the foregoing resin film is preferably 3 to 40% by weight. If the mixing ratio of the soluble particle is less than 3% by weight, a roughened surface with a desired roughness is sometimes not formed and if the mixing ratio is more than 40% by weight, the resin film is dissolved even to a deep depth when the soluble particle is dissolved with an acid or an oxidizing agent. Hence, it sometimes leads to short circuit since the high insulating property cannot be maintained between neighboring conductor circuits through the interlaminar resin insulating layer formed using the foregoing resin film.

The foregoing resin film may further contain a curing agent, a solvent, and other components based on necessity, other than the foregoing soluble particle and the hardly soluble resin.

The foregoing polyphenylene ether resin is not particularly restricted and the examples are polyphenylene oxide (PPO), polyphenylene ether (PPE) and the like.

The foregoing polyolefin type resin is, for example, polyethylene, polypropylene, polyisobutylene, polybutadiene, polyisoprene, a cycloolefin type resin, copolymers of these resins and the like.

Among them, the cycloolefin type resin is preferable since it has a low dielectric constant and dielectric loss tangent, does not easily cause the signal delay and signal error even in case of using high frequency signals in a GHz band and further is excellent in the mechanical characteristics such as rigidity.

As the cycloolefin type resin, preferable are homopolymers or copolymers of monomers such as 2-norbornene, 5-ethylidene-2-norbornene or their derivatives. As the foregoing derivatives, examples are those obtained by bonding amino group and maleic anhydride residue or maleic acid-modified ones, those are for cross-linking formation, with cycloolefins such as the foregoing 2-norbornene and the like.

As monomers used for the case of forming the foregoing copolymers, examples are ethylene, propylene and the like.

The foregoing cycloolefin type resin may be a mixture of two or more of the foregoing resins and also may contain a resin other than the cycloolefin type resin.

In the case where the foregoing cycloolefin type resin is a copolymer, it may be a block copolymer or a random copolymer.

Further, the foregoing cycloolefin type resin is preferably a thermosetting cycloolefin type resin. Because the rigidity and the mechanical characteristics are improved by cross-linking by heating.

The glass transition temperature (Tg) of the foregoing cycloolefin type resin is preferably 130 to 200° C.

The foregoing cycloolefin type resin may be used in form of an already formed resin sheet (film) or in state of an un-cured solution containing monomers or polymers with low and defined molecular weight dispersed in a solvent such as xylene, cyclohexane and the like.

Further, in case of using a resin sheet, so-called RCC (RESIN COATED COPPER) may be used.

The foregoing cycloolefin type resin may contain no filler or the like and may contain a flame retardant such as aluminum hydroxide, magnesium hydroxide, a phosphoric acid ester and the like.

Examples of the foregoing fluorocarbon resin are ethyl/tetrafluoroethylene copolymer resin (ETFE), polychlorotrifluoroethylene (PCTFE), and the like.

The foregoing thermoplastic elastomer resin is not particularly restricted and for example, a styrene type thermoplastic elastomer, an olefin type thermoplastic elastomer, urethane type thermoplastic elastomer, polyester type thermoplastic elastomer, a polyamide type thermoplastic elastomer, 1,2-polybutadiene type thermoplastic elastomer, a vinyl chloride type thermoplastic elastomer, a fluoro type thermoplastic elastomer and the like. Among them, the olefin type thermoplastic elastomer and the fluoro type thermoplastic elastomer are desirable in terms of electric properties.

In case of forming the interlaminar resin insulating layer by laminating the foregoing resin film, it is preferable to form the interlaminar resin insulating layer using a vacuum laminator or the like by pressure-laminating a resin film at 60 to 120° C. and 0.2 to 1.0 MPa and then thermally curing the resin film.

Incidentally, the thermal curing may be carried out after formation of the opening part for a via-hole and the through hole.

After the foregoing layer of the resin composition is formed, the opening part for the via-hole and, if necessary, the through hole are formed to form the interlaminar resin insulating layer.

The foregoing opening part for the via-hole is formed by laser treatment and the like. In case that a layer of the resin composition is formed, the opening part for the via-hole may be formed by exposure and development treatment. The laser beam to be used in that case may be, for example, carbon dioxide gas ($CO_2$) laser, ultraviolet laser, excimer laser and the like and among them, excimer laser and the carbon dioxide gas laser of short pulses are preferable.

That is because the excimer laser, as described somewhere later, is capable of forming a large number of opening parts for via-holes at once using a mask or the like having through holes in the parts where the opening parts for via-holes are to be formed. That is also because the carbon dioxide gas laser of short pulses is capable of forming the opening part for a via-hole with little resin residue in the opening part and causes small damage on the resin in the peripheries of the opening part.

Further, regarding excimer laser, a hologram method excimer laser is preferable to be used. The hologram-method excimer laser is a manner of radiating laser to an object through a hologram, a condenser, a laser mask, a transfer lens, and the like. By employing the method, a large number of opening parts can efficiently be formed in the layer of the resin composition by one time radiation.

In case of using the carbon dioxide gas laser, the intervals of the pulses are preferably $10^{-4}$ to $10^{-8}$. Also, the duration of the radiation of the laser for forming the opening part is preferably 10 to 500µ second.

The through hole of the mask having the through hole in the part corresponding to the part where the opening part for a via-hole are to be formed is required to be truly round in order to make the spot shape of the laser beam true round and the diameter of the foregoing through hole is preferably 0.1 to 2 mm.

By radiating laser beam through the optical system lenses and the mask, a large number of opening parts for a via-hole can be formed at one time. Because laser beam can simultaneously be radiated to a plurality of parts with the same intensity and with the same radiation intensity by using the optical system lens and the mask.

When the opening part is formed by laser beam, especially by carbon dioxide gas laser, it is preferable to carry out de-smear treatment. The foregoing de-smear treatment can be carried out using an oxidizing agent of an aqueous solution of chromic acid, permanganate, and the like. Further, the treatment may be carried out by oxygen plasma, mixed plasma of $CF_4$ and oxygen, corona discharge and the like. The surface modification can also be carried out by radiating ultraviolet ray using a low pressure mercury lamp.

In case of forming through hole in the substrate in which the resin layer is formed, the through hole is formed using a drill, laser beam, and the like of 50 to 300 µm diameter.

(4) Next, the surface of the interlaminar resin insulating layer including the inner wall of the opening part for a via-hole and the inner wall of the through hole, in the case where the through hole is formed by the foregoing processes, are surface-roughened by an acid or an oxidizing agent.

Examples of the foregoing acid are sulfuric acid, nitric acid, hydrochloric acid, phosphoric acid, formic acid, and the like and examples of the foregoing oxidizing agent are chromic acid, chromic acid mixture, permanganate such as sodium permanganate, and the like.

After that, neutralization of the inside of the opening part for a via-hole and of the through hole is carried out using an aqueous alkaline solution or the like if the roughened surface is formed using an acid, and using a neutralization solution if the roughened surface is formed using the oxidizing agent. The acid and the oxidizing agent are removed by the operation to cause no effect on the next process. Incidentally, the average roughness Rz of the roughened surface formed in the process is preferably 0.1 to 5 µm.

(5) Next, if necessary, a catalyst is supplied to the formed roughened surface. The foregoing catalyst is, for example, palladium chloride or the like.

In this case, in order to reliably supply the catalyst, drying treatment such as treatment with oxygen, nitrogen or other plasma, corona discharge treatment, and the like is carried out to remove the residue of the acid or the oxidizing agent and modify the surface of the interlaminar resin insulating layer, so that the catalyst can surely be supplied and the adhesion strength of an electroless plating layer to the interlaminar resin insulating layer can be improved and especially significant effect can be achieved on the bottom faces of the opening part for a via-hole.

(6) Then, based on necessity, a thin film conductor layer comprising tin, zinc, copper, nickel, cobalt, thallium, lead and the like is formed on the formed interlaminar resin insulating layer by electroless plating, sputtering and the like. The foregoing thin film conductor layer may be single or layered in two or more layers.

Among them, the thin film conductor layer is preferably comprising copper, copper with nickel, and the like from a viewpoint of the electric characteristics and the economical advantage.

Further, in case of forming the through hole by the foregoing process (3), the thin film conductor layer comprising a metal may be formed also on the inner wall face of the through hole in the process (3) to form the plated-through hole.

In case of forming the plated-through hole in the foregoing process (6), the following treatment process is preferable to be carried out. That is, the electroless plating layer surface and the plated-through hole inner walls are subjected to the surface-roughening treatment by blackening (oxidation)-reduction treatment, a spraying treatment with an aqueous mixed solution of an organic acid and a cupric complex, a Cu—Ni—P acicular alloy plating and the like. After that, the plated-through hole is filled with a resin filler and then surface layer parts and the electroless plating layer surface are leveled by a polishing treatment method such as buffing.

Further, the electroless plating is carried out to form an electroless plating layer on the already formed thin film conductor layer comprising a metal and the surface layer parts of the resin filler, so that a cover plating layer is formed on the plated-through hole.

(7) Next, a plating resist is formed on some of the foregoing interlaminar resin insulating layer using a dry film and after that, electroplating is carried out using the foregoing thin film conductor layer as a lead to form an electroplating layer on the non plating resist formed area.

Copper plating is preferable to be employed for the foregoing electroplating.

At that time, the opening part for a via-hole may be filled with the electroplating to form a filled via structure or the opening part for a via-hole may be filled with a conductive paste and then coated with a covering plating layer to form a filled via structure. The formation of the filled via structure makes it possible to form a via-hole immediate above a via-hole.

(8) After the electroplating layer is formed, the plating resist is parted and the thin film conductor layer of a metal existing under the plating resist is removed by etching to form an independent conductor circuit. Copper plating is preferable to be employed for the foregoing electroplating layer.

The etching solutions usable are, for example, an aqueous sulfuric acid-hydrogen peroxide solution, an aqueous persulfuric acid salt solution of such as ammonium persulfate, sodium persulfate, potassium persulfate, and the like, an aqueous solution of ferric chloride, cupric chloride, hydrochloric acid, nitric acid, hot diluted sulfuric acid and the like. Further, simultaneously with the etching of the conductor circuit, surface-roughening may be carried out using an etching solution containing the foregoing cupric complex and an organic acid.

Further, if necessary, the catalyst on the interlaminar resin insulating layer may be removed using an acid or an oxidizing agent. Since a metal such as palladium used as a catalyst goes away by removing the catalyst, the electric characteristic deterioration can be prevented.

(9) After that, if necessary, the processes (3) to (8) are repeated and if the conductor circuit of the outermost layer is required to be roughened, the conductor circuit having the roughened surface is formed by the foregoing surface-roughening treatment method.

(10) Next, the foregoing solder resist layer is formed on the substrate on which the conductor circuit of the outermost layer.

The foregoing solder resist layer is formed by applying the foregoing solder resist composition by a roll coater method or by, firstly, forming a resin film of the foregoing solder resist composition and then thermally pressure bonding the resin film and after that, carrying out opening treatment by exposure and development treatment or laser treatment and further curing treatment.

(11) Next, a corrosion resistant metal layer of Ni, Au and the like is formed in the opening part of the solder resist layer by plating, sputtering, evaporating, or the like and after that, a solder bump is formed by printing a solder paste on the IC chip connection face and solder balls and pins are installed in the outside substrate connection face to complete the manufacture of the multilayered printed circuit board. Incidentally, the installation of the solder balls and pins is carried out by employing a conventionally well-known method.

Incidentally, in order to carry out the letter printing process for forming product identification letters and to modify the solder resist layer, treatment with oxygen or carbon tetrachloride plasma may properly be carried out.

Although the above described method is a semi-additive method, a full-additive method may also be employed.

Through those manufacturing processes, a multilayered printed circuit board of the first invention of the first group of the present invention can be manufactured.

Hereinafter, the invention of the second group will be described.

The first invention of the second group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer contains an elastomer component.

In the multilayered printed circuit board of the first invention of the second group of the present invention, since the solder resist layer contains the elastomer component, the foregoing solder resist layer is enabled to absorb or moderate the stress because of the flexibility and the resilient elasticity of the elastomer, hence, even when the stress is applied to the solder resist layer, cracking in the solder resist layer and peeling of the solder resist layer from other layers can be prevented, because of the flexibility and the resilient elasticity of the elastomer, during the manufacturing process of the multilayered printed circuit board and after electronic parts such as an IC chip are mounted on the multilayered printed circuit board and further even if cracking takes place, the cracks are prevented from becoming wide and big.

As the elastomer component to be use for the first invention of the second group of the present invention, examples usable are natural rubber, synthetic rubber, thermoplastic resins, thermosetting resins and the like. The one especially capable of sufficiently absorbing and moderating the stress is an elastomer comprising a thermosetting resin. These elastomer components may be used solely or in combination of two or more of them.

As the foregoing elastomer of the thermosetting resin, examples are an polyester type elastomer, a styrene type elastomer, a vinyl chloride type elastomer, a fluoro type elastomer, an amide type elastomer, an olefinic elastomer and the like.

Although the shape of the foregoing elastomer component is not particularly restricted, a spherical shape, an elliptically spherical shape, and the like are preferable since such a shape has an excellent effect to absorb and moderate the stress.

Although the size of the foregoing elastomer component is not particularly restricted, the length (or the diameter) of the longest part of the size of the foregoing inorganic filler is preferably within a range from 0.5 to 1.5 μm. That is because in case of being shorter than 0.5 μm, it becomes hard to absorb or moderate the stress to result in easy formation of cracks and in case of being longer than 1.5 μm, the degree of the resolution is lowered.

In the multilayered printed circuit board of the present invention, the foregoing elastomer component is desirably in micro-phase separated state as to form an island-in-sea structure after curing of the foregoing solder resist layer. That is because the dispersion of the elastomer component in such a state is most optimum to absorb or moderate the stress by the elastomer component to the highest extent.

The content of the elastomer component in the foregoing solder resist layer is desirably 1 to 20% by weight. If the foregoing content is less than 1% by weight, it becomes hard to moderate and absorb the stress to result in easy generation of cracking and if it is higher than 20% by weight, the degree of resolution is lowered.

The foregoing solder resist layer is preferable to be mixed with an inorganic filler other than the foregoing elastomer component. As the same reason as described in the description of the multilayered printed circuit board of the first invention of the first group of the present invention, that is because the linear expansion coefficient of the solder resist layer and that of the other layers (the interlaminar resin insulating layers and the like) can be well balanced so that generation of peeling and cracking attributed to the difference of the linear expansion coefficients can more efficiently be prevented.

The foregoing inorganic filler is not particularly restricted and examples are an aluminum compound, a calcium compound, a potassium compound, a magnesium compound, a silicon compound and the like. More practically, the examples are the same ones used for the multilayered printed circuit board of the first invention of the first group of the present invention. These compounds may be used solely or in combination of two or more of them.

The content of the inorganic filler in the foregoing solder resist layer is preferably 5 to 20% by weight. By using the inorganic filler in the foregoing content, the linear expansion coefficient of the solder resist layer can efficiently be lowered to significantly suppress generation of the stress owing to the thermal expansion.

The solder resist layer composing the multilayered printed circuit board of the first invention of the second group of the present invention may further contain a thermosetting resin, a thermoplastic resin, a complex of the thermosetting resin and the thermoplastic resin and the like other than the foregoing inorganic filler and the elastomer component, and their examples are the same as those contained in the solder resist layer constituting the multilayered printed circuit board of the first invention of the first group of the present invention.

Hereinafter, a solder resist composition of the second invention of the second group of the present invention will be described.

The solder resist composition of the second invention of the second group of the present invention is characterized by mixing an elastomer component in a paste containing a resin for a solder resist layer.

As the foregoing elastomer component, those described above can be employed. The content of the component is preferably to be 5 to 10% by weight in the solder resist composition.

The solder resist composition of the second invention of the second group of the present invention is preferably to be a paste type fluid containing the foregoing novolak type epoxy resin (meth)acrylate, an imidazole curing agent, a bifunctional (meth)acrylic acid ester monomer, a (meth)acrylic acid ester polymer with a molecular weight of 500 to 5000, thermosetting resins comprising a bisphenol type epoxy resin and the like, photosensitive monomers such as polyvalent acrylic monomers, and glycol ether type solvents, other than the foregoing elastomer component and inorganic filler, and the viscosity of the paste is preferably adjusted to be 1 to 10 Pa·s at 25° C.

Examples of the foregoing imidazole curing agent and the forgoing glycol ether type solvents are those same as described above for the solder resist composition of the second invention of the first group of the present invention.

At the time of forming a solder resist layer using such a solder resist composition, at first a substrate on which conductor circuits and interlaminar resin insulating layers are formed in a plurality of layers and a conductor circuit is formed in the uppermost layer is produced and then the paste having the foregoing composition is applied by a roll coater method or the like and dried. After that, an opening part for a solder bump is formed at the point of a solder resist layer corresponding to the prescribed positions of the under-level conductor circuit and if necessary, curing treatment is carried out to form a solder resist layer.

The method for manufacturing a multilayered printed circuit board of the third invention of the second group of the present invention is a method for manufacturing a multilayered printed circuit board comprising a conductor circuit and a resin insulating layer serially formed on a substrate in an alternate fashion and in repetition and a solder resist layer formed as an outermost layer, wherein the foregoing solder resist composition of the second invention of the second group of the present invention is used.

In the method for manufacturing a multilayered printed circuit board of the third invention of the second group of the present invention, at first a substrate comprising a conductor circuit in the outermost layer is produced in the same manner as the manufacturing processes (1) to (9) of the method for manufacturing the multilayered printed circuit board of the third invention of the first group of the present invention.

Then, a solder resist layer is formed by the foregoing method using the solder resist composition of the second invention of the second group of the present invention, that is, by applying the solder resist composition or by thermally-laminating a film of the solder resist composition and then carrying out opening treatment by exposure and development treatment and further curing treatment.

Further, a multilayered printed circuit board can be manufactured in the same manner as described in the manufacturing processes (10) and (11) in the method for manufacturing the multilayered printed circuit board of the first invention of the second group of the present invention.

Hereinafter, a multilayered printed circuit board of the third group of the present invention will be described.

The first invention of the third group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer has a dielectric constant of 3.0 or lower at 1 GHz.

In such a multilayered printed circuit board of the first invention of the third group of the present invention, since the dielectric constant of the foregoing solder resist layer is 3.0 at highest, even if high frequency signals in the GHz band are used, signal errors attributed to signal transmission delay and transmission loss of the signals occurring in the solder resist layer can be prevented.

Further, in case of using a solder resist layer with a low dielectric loss tangent, in addition to the foregoing characteristics, the signal errors attributed to signal transmission loss and the like of the signals occurring in the solder resist layer can be prevented regardless of the number of the pads of the outer terminals even if the distances between neighboring solder bumps are narrowed.

Furthermore, in the foregoing multilayered printed circuit board, in case that using a polyolefin type resin or a polyphenylene type resin is used for the interlaminar resin insulating layer, the difference of the thermal expansion coefficients between the solder resist layer and the interlaminar resin insulating layer is made small, so that generation of cracking and peeling can be prevented.

In the multilayered printed circuit board of the first invention of the third group of the present invention, the dielectric constant of the solder resist layer at 1 GHz is 3.0 or lower. Attributed to such a low dielectric constant, signal errors attributed to signal transmission delay and transmission loss of the signals can be prevented. The foregoing dielectric constant is preferably 2.4 to 2.7.

In the multilayered printed circuit board of the first invention of the third group of the present invention, the dielectric loss tangent of the solder resist layer at 1 GHz is 0.01 or lower. By employing such a low dielectric loss tangent, signal errors attributed to signal transmission delay and transmission loss of the signals can be prevented.

The solder resist layer having the foregoing low dielectric constant and low dielectric loss tangent in the multilayered printed circuit board of the first invention of the third group of the present invention is preferable to contain at least one member selected from the group consisting of a polyolefin type resin, a polyphenylene ether, and a fluorotype resin.

Examples of the polyolefin type resin are polyethylene, polypropylene, polyisobutylene, polybutadiene, polyisoprene, a cycloolefin type resin, copolymers of these resins and the like.

Available as a product of the foregoing polyolefin type resin sold in a market, is 1592 (trade name) made by Sumitomo 3M Ltd. Also, available as products of the foregoing thermoplastic polyolefin type resin with 200° C. or higher melting point and sold in a market are trade name, TPX (melting point of 240° C.), made by Mitsui Petrochemical Industries Ltd. and trade name, SPS (melting point of 270° C.), made by Idemitsu Petrochemical Co., Ltd. and the like.

Among them, cycloolefin type resin is preferable since it has a low dielectric constant and dielectric loss tangent, does not easily cause the signal delay and signal error even in case of using high frequency signals in a GHz band and further is excellent in the mechanical characteristics such as rigidity.

As the cycloolefin type resin, preferable are homopolymers or copolymers of monomers such as 2-norbornene, 5-ethylidene-2-norbornene, and their derivatives. As the foregoing derivatives, examples are those obtained by bonding amino group and maleic anhydride residue, those are for cross-linking formation, with cycloolefins such as the foregoing 2-norbornene or maleic acid-modified cycloolefins and the like.

As monomers used for the case of forming the foregoing copolymers, examples are ethylene, propylene and the like.

The foregoing cycloolefin type resin may be a mixture of two or more of the foregoing resins and also may contain a resin other than the cycloolefin type resin.

In the case where the foregoing cycloolefin type resin is a copolymer, it may be a block copolymer or a random copolymer.

Further, the foregoing cycloolefin type resin is preferably a thermosetting type cycloolefin type resin. Because the rigidity and the mechanical characteristics are improved by cross-linking by heating.

The glass transition temperature (Tg) of the foregoing cycloolefin type resin is preferably 130 to 200° C.

The foregoing cycloolefin type resin may be used in form of an already formed resin sheet (film) or in state of an un-cured solution containing monomers or polymers thereof with low and certain molecular weight dispersed in a solvent such as xylene, cyclohexane and the like.

Further, in case of using a resin sheet, so-called RCC (RESIN COATED COPPER) may be used.

The foregoing cycloolefin type resin may contain no filler or the like and may contain a flame retardant such as aluminum hydroxide, magnesium hydroxide, a phosphoric acid ester and the like.

The olefin type resin to be used for the foregoing solder resist layer is generally transparent.

For that, if such polyolefin type resin is used as it is for the solder resist layer, there is a probability that an inner conductor circuit or target mark can be erroneously read out at the time of mounting it, or cutting it in fragments, so that it is preferable for the polyolefin type resin to be used for formation of a solder resist layer to be colored in green or dark blue color. In such a manner, the alignment marks of an inner layer and the surface layer of a multilayered printed circuit board can be discriminated.

Preferable as the resin composing the interlaminar resin insulating layer of the multilayered printed circuit board of the first invention of the third group of the present invention are a polyolefin type resin, a polyphenylene type resin (PPE, PPO, etc.), a fluorotype resin and the like.

Examples of the olefin type resin are the foregoing polyethylene, polypropylene, and the like and examples of the foregoing fluorotype resin are ethyl/tetrafluoroethylene copolymer resin (ETFE), polychlorotrifluoroethylene (PCTFE) and the like.

By using such resins, the dielectric constant and the dielectric loss tangent of the multilayered printed circuit board as a whole can be lowered and signal delay and signal errors do not take place easily even in case of using high frequency signals in the GHz band. Further, since the thermal expansion coefficient of the resin to be used for the foregoing resin insulating layer is not so much different from the thermal expansion coefficient of the polyolefin type resin or the like to be used of the solder resist layer, peeling and cracking do not easily take place.

The second invention of the third group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer is comprising a polyolefin type resin.

In such a multilayered printed circuit board of the second invention of the third group of the present invention, since the polyolefin type resin is used for the foregoing solder resist layer, even if high frequency signals in the GHz band are used, signal errors attributed to signal transmission delay and transmission loss of the signals occurring in the solder resist layer can be prevented.

Further, in case that a solder resist layer with a low dielectric constant is used, even if high frequency signals in the GHz band are used, signal errors attributed to signal transmission delay and transmission loss of the signals occurring in the solder resist layer can be further prevented.

Further, in case of using a solder resist layer with a low dielectric loss tangent, in addition to the foregoing characteristics, the signal errors attributed to signal transmission loss and the like of the signals occurring in the solder resist layer can be prevented regardless of the number of pads even if the distance between neighboring solder bumps are narrowed.

Furthermore, in the foregoing multilayered printed circuit board, in case that a polyolefin type resin or a polyphenylene type resin is used for the interlaminar resin insulating layer, the difference of the thermal expansion coefficients between the solder resist layer and the interlaminar resin insulating layer is made small, so that generation of cracking and peeling can be prevented.

In the multilayered printed circuit board of the second invention of the third group of the present invention, although the polyolefin type resin to be used for the solder resist layer is not particularly restricted, it is preferable to use those having the dielectric constant of 3.0 or lower at 1 GHz. By using such a resin with the specified low dielectric constant, signal errors attributed to signal transmission delay and transmission loss of the signals can be prevented. The foregoing dielectric constant is preferably 2.4 to 2.7.

In the multilayered printed circuit board of the second invention of the third group of the present invention, the dielectric loss tangent of the polyolefin type resin to be used for the solder resist layer is preferably is 0.01 or lower at 1 GHz. By using such a resin with such a low dielectric loss tangent, signal errors attributed to signal transmission delay and transmission loss of the signals can be prevented.

Examples of the foregoing polyolefin type resin are polyethylene, polypropylene, polyisobutylene, polybutadiene, polyisoprene, a cycloolefin type resin, copolymers of these resins and the like.

Products of the foregoing polyolefin type resin sold available in a market are the same as those exemplified in the first invention of the third group of the present invention.

Among them, cycloolefin type resin is preferable since: it has a low dielectric constant and dielectric loss tangent; it does not easily cause the signal delay and signal error even in case of using high frequency signals in a GHz band; and further it is excellent in the mechanical characteristics such as rigidity.

As the cycloolefin type resin, examples are those same as exemplified in the first invention of the third group of the present invention.

The resin composing the interlaminar resin insulating layer of the multilayered printed circuit board of the second invention of the third group of the present invention is preferable to be the same as that used in the first invention of the third group of the present invention.

By using such resins, the dielectric constant and the dielectric loss tangent of the multilayered printed circuit board as a whole can be lowered as the same in the case of the multilayered printed circuit board of the first invention of the third group of the present invention and signal delay and signal errors do not easily take place even in case of using high frequency signals in the GHz band. Further, since the thermal expansion coefficient of the resin to be used for the foregoing resin insulating layer is not so much different from the thermal expansion coefficient of the polyolefin type resin and the like to be used of the solder resist layer, peeling and cracking do not easily take place.

Next, a method for manufacturing the multilayered printed circuit board of the third group of the present invention will be described. The multilayered printed circuit boards of the first and the second inventions of the third group of the present invention can be manufactured in the same method as the method for manufacturing the multilayered printed circuit board of the third invention of the first group of the present invention except that the solder resist composition containing the forgoing resin (a polyolefin type resin and the like) is used.

Further, in the method for manufacturing the multilayered printed circuit boards of the first and the second inventions of the third group of the present invention, an opening is preferably formed using laser at the time of forming the solder resist layer having the opening part. That is because the polyolefin type resin or the like are suitable for forming the opening by laser treatment.

Incidentally, as described above, a polyolefin type resin, a polyphenylene type resin, or a fluorotype resin are preferable to be employed in the manufacture of the multilayered printed circuit boards of the first and the second inventions of the third group of the present invention. Further, in case of forming an interlaminar resin insulating layer using such a material, it is preferable to form an opening part for a via-hole using laser.

Hereinafter, a semiconductor device of the third invention of the third group of the present invention will be described.

The third invention of the third group of the present invention is a semiconductor device comprising:

a multilayered printed circuit board wherein a conductor circuit and a resin insulating layer are serially formed on a substrate in an alternate fashion and in repetition and a solder resist layer having a solder bump is formed as an uppermost layer; and an IC chip connected with the foregoing multilayered printed circuit board through the solder bump, wherein the foregoing solder resist layer is comprising a polyolefin type resin and the foregoing resin insulating layer is comprising a polyolefin type resin, a polyphenylene type resin or a fluororesin.

Examples of the polyolefin type resin to be employed for the solder resist layer of the semiconductor device of third invention of the third group of the present invention are those same as the polyolefin type resin used for the multilayered printed circuit board of the first invention of the third group of the present invention. The foregoing polyolefin resin is preferably a cycloolefin type resin. Because it has a low dielectric constant and a low dielectric loss tangent and is excellent in mechanical characteristics.

The resin insulating layer of the semiconductor device of third invention of the third group of the present invention is comprising a polyolefin type resin, a polyphenylene type resin, or a fluoro type resin. By using such a resin, the dielectric constant and the dielectric loss tangent of the entire multilayered printed circuit board are lowered and the signal delay and the signal errors do not easily take place even if high frequency signals in the GHz band are used. Further, since the thermal expansion coefficient of the resin used for the foregoing resin insulating layer is not so much different from the thermal expansion coefficient of the polyolefin type resin to be used for the solder resist layer, peeling and cracking do not easily take place.

At the time of manufacturing the semiconductor device of third invention of the third group of the present invention, after the multilayered printed circuit board having a solder bump is manufactured, an IC chip is mounted on the prescribed position of the solder resist layer having the solder bump and the IC chip and the circuit of the printed circuit board are connected by re-flow of the solder by heating. Successively, an under-fill is filled in the printed circuit board with which the IC chip is connected, and thus sealing with a resin is carried out to complete the manufacture of the semiconductor device.

In the semiconductor device of third invention of the third group of the present invention, even if the frequency of the IC chip is in a signal region of a high frequency of 1 GHz or higher, no signal error attributed to signal transmission delay and transmission loss of signals takes place.

Hereinafter, the present invention of the fourth group will be described.

The first invention of the fourth group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer has a dielectric loss tangent of 0.01 or lower at 1 GHz.

In the multilayered printed circuit board of the first invention of the fourth group of the present invention, since the electric loss tangent of the foregoing solder resist layer at 1 GHz is 0.01 or lower, the signal errors attributed to signal transmission delay and transmission loss of the signals occurring in the solder resist layer can be prevented.

Further, in the case where both of the dielectric loss tangent and the dielectric constant of the foregoing solder resist layer are low, in addition to the foregoing characteristics, the signal errors attributed to signal transmission loss and the like of the signals occurring in the solder resist layer can be prevented regardless of the number of the pads of the outer terminals even if the distances between neighboring solder bumps are narrowed.

The solder resist layer of the multilayered printed circuit board of the first invention of the fourth group of the present invention has a dielectric loss tangent of 0.01 or lower at 1 GHz. By using a solder resist layer with such a low dielectric loss tangent, the foregoing signal errors attributed to signal transmission loss and the like of the signals occurring in the solder resist layer can be prevented. A desirable dielectric loss tangent is 0.001 or lower.

Further, the dielectric constant of the foregoing solder resist layer at 1 GHz is preferably 3.0 or lower. By employing the solder resist layer having both low dielectric loss tangent and low dielectric constant, the signal errors attributed to signal transmission loss and the like of the signals occurring in the solder resist layer can further reliably be prevented.

In the multilayered printed circuit board of the first invention of the fourth group of the present invention, the forgoing solder resist layer having a low dielectric loss tangent and a low dielectric constant is preferably a layer containing at least one of the group consisting of a polyphenylene ether resin, a polyolefin type resin, and a fluoro type resin.

As the foregoing polyphenylene ether resin, examples are the same as those exemplified as the polyphenylene ether to be used for the multilayered printed circuit board of the second invention of the fourth group of the present invention to be described somewhere later.

Further, as the foregoing polyolefin resin, examples are the same as those exemplified as the polyolefin resin to be used for a solder resist layer of the multilayered printed circuit board of the first invention of the third group of the present invention.

As the foregoing fluorotype resin, examples are ethyl/tetrafluoroethylene copolymer resin (ETFE), polychlorotrifluoroethylene (PCTFE), and the like.

Examples of the resin to be used for the resin insulating layer of the multilayered printed circuit board of the present invention are a polyphenylene ether resin, a polyolefin type resin, and a fluorotype resin.

As the foregoing polyphenylene ether resin, examples are the same as those exemplified as the polyphenylene ether resin to be used for the solder resist layer of the second invention of the fourth group of the present invention to be described somewhere later.

As the foregoing polyolefin resin and fluorotype resin, examples are the same as those to be used for the foregoing solder resist layer.

By using such resins, the dielectric loss tangent and the dielectric constant of the entire body of the multilayered printed circuit board can be lowered and thus signal delay and signal errors do not easily takes place even in case of using high frequency signals in the GHz band. In addition to that, especially in case of using a polyphenylene resin for both of the interlaminar resin insulating layer and the solder resist layer, generation of cracking and peeling can further reliably be prevented owing to little difference of the thermal expansion coefficients of the solder resist layer and the interlaminar resin insulating layer.

The second invention of the fourth group of the present invention is a multilayered printed circuit board comprising a conductor circuit and a resin insulating layer serially formed on a substrate in an alternate fashion and in repetition and a solder resist layer formed as an outermost layer, wherein the foregoing solder resist layer is comprising a polyphenylene ether resin.

In the multilayered printed circuit board of the second invention of the fourth group of the present invention, since the polyphenylene resin is used for the foregoing solder resist layer, signal errors attributed to signal transmission delay and transmission loss of the signals occurring in the solder resist layer can be prevented even if high frequency signals in the GHz band are used.

Further, in case of employing a solder resist layer with a low dielectric loss tangent, signal errors attributed to signal transmission delay and transmission loss of the signals occurring in the solder resist layer can be prevented even if high frequency signals in the GHz band are used.

Further, in case of employing a solder resist layer with a low dielectric constant, in addition to the foregoing characteristics, signal errors attributed to signal transmission delay and transmission loss of the signals occurring in the solder resist layer can be prevented regardless of the number of the pads of the outer terminals even if the distances between neighboring solder bumps are narrowed.

Further, in case of using a polyphenylene ether resin for the interlaminar resin insulating layer in the foregoing multilayered printed circuit board, since the difference of the thermal expansion coefficients between the solder resist layer and the interlaminar resin insulating layer is made small, generation of cracking and peeling can be prevented.

In the multilayered printed circuit board of second invention of the fourth group of the present invention, the polyphenylene ether resin to be used for the solder resist layer is not particularly restricted and usable examples are a thermoplastic polyphenylene ether resin having a repeating monomer unit having the following chemical formula [2], a thermosetting polyphenylene ether resin having a repeating monomer unit having the following chemical formula [3] and the like:

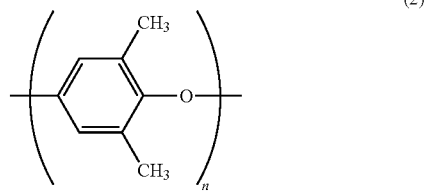

(2)

(wherein, the reference character n represents an integer of 2 or higher)

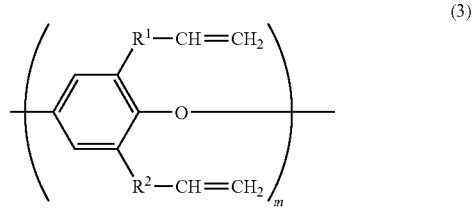

(3)

(wherein, the reference character m represents an integer of 2 or higher; $R^1$, $R^2$ separately represent methylene, ethylene, or —$CH_2$—O—$CH_2$— and both may be the same or dissimilar.).

The thermoplastic polyphenylene ether resin having the repeating monomer unit of the foregoing chemical formula [2] has the structure that methyl groups are bonded to the benzen ring, however the polyphenylene ether resin usable for the present invention may be derivatives obtained by substituting the methyl group with other alkyl group such as ethyl group or by substituting hydrogen of the methyl group with fluorine.

These polyphenylene ether resins may be used solely or in combination of two or more of them.

Among these polyphenylene ether resins, the thermosetting polyphenylene ether resin having the chemical formula [3] is preferable from a viewpoint that the rigidity and the mechanical characteristics are improved by heating.

Further, the foregoing polyphenylene ether resin is preferable to have a dielectric loss tangent of 0.01 or lower and a dielectric constant of 3.0 or lower at 1 GHz.

The representative ones of the foregoing polyphenylene ether resin (including the thermosetting polyphenylene ether resin) have: a dielectric constant as low as 2.45 to 2.50 (1 MHz); and a dielectric loss tangent of $(0.7 \times 10^{-3})$ to $(1.0 \times 10^{-3})$ (1 MHz), which are both low and within the foregoing ranges. They also have a glass transition temperature about 210 to 250° C., a water absorption rate as low as 0.05% or less and thus they are suitable to be employed for the solder resist layer.

By using the polyphenylene ether resin having the foregoing dielectric constant and dielectric loss tangent, even if high frequency signals in the GHz band are used, signal errors attributed to signal transmission delay and transmission loss can be prevented.

The polyphenylene ether resin may be used in form of an already formed resin sheet (film) or in state of an un-cured solution containing monomers or polymers thereof with low and defined molecular weight dispersed in an aromatic hydrocarbon type solvent such as xylene, toluene, cyclohexane and the like.

Further, in case of using the resin sheet, so-called RCC (RESIN COATED COPPER) may be used.

The resin to be used for the solder resist layer may be solely comprising the foregoing polyphenylene ether resin or may be mixed with other components unless they do not deteriorate the low dielectric constant and dielectric loss tangent.

Examples of the resin used for the resin insulating layer of the multilayered printed circuit board of second invention of the fourth group of the present invention are a polyphenylene ether resin, a polyolefin type resin, or a fluoro type resin and the like. As the polyphenylene ether resin, examples are the same as those of the polyphenylene ether resin used for the foregoing solder resist layer. Further as the foregoing polyolefin type resin and fluoro type resin, examples are the same as those to be used in the first invention of the fourth group of the present invention.

Among them, the polyphenylene ether resin is preferable.

By using the polyphenylene ether resin as an insulating resin, both of the dielectric loss tangent and the dielectric constant of the entire multilayered printed circuit board are lowered and the signal delay and the signal errors does not easily take place even if high frequency signals in the GHz band are used. Further, since the thermal expansion coefficient of the resin used for the resin insulating layer is not so much different from the thermal expansion coefficient of the solder resist layer, peeling and cracking can further reliably be prevented.

Hereinafter, description will be given of a method for manufacturing a multilayered printed circuit board of the fourth group of the present invention.

The multilayered printed circuit boards of the first and the second inventions of the fourth group of the present invention can be manufactured by the same method for manufacturing the multilayered printed circuit board of the third invention of the first group of the present invention except that the solder resist composition contains the foregoing resins (polyphenylene ether resin). Further, in manufacture of the multilayered printed circuit boards of the first and the second inventions of the fourth group of the present invention, it is preferable to form an opening part using laser at the time of forming a solder resist layer having the opening part. That is because the polyphenylene ether resin and the like are suitable for forming an opening for a via hole by laser treatment.

Incidentally, in manufacture of the multilayered printed circuit boards of the first and the second inventions of the fourth group of the present invention, as described above, it is preferable to use a polyphenylene ether resin, a polyolefin type resin, or a fluorotype resin for the materials of interlaminar resin insulating layer. Further, an opening part for a viahole are preferably formed by using laser in case of forming the interlaminar resin insulating layer using such materials.

Hereinafter, description will be given of a semiconductor device of the third invention of the fourth group of the present invention.

The third invention of the fourth group of the present invention is a semiconductor device comprising:

a multilayered printed circuit board wherein a conductor circuit and a resin insulating layer are serially formed on a substrate in an alternate fashion and in repetition and a solder resist layer having a solder bump is formed as an uppermost layer; and an IC chip connected with the foregoing multilayered printed circuit board through the solder bump, wherein the foregoing solder resist layer is comprising a polyphenylene ether resin and the foregoing resin insulating layer is comprising a polyphenylene ether resin, a polyolefin type resin, or a fluoro type resin.

As the polyphenylene type resin to be used for the solder resist layer of the semiconductor device of the third invention of the fourth group of the present invention, examples are the same as the polyphenylene ether resin to be used for the first invention of the fourth group of the present invention. As the foregoing polyphenylene ether resin, a thermosetting type polyphenylene ether resin is preferable because it has a low dielectric constant and a low dielectric loss tangent and excellent mechanical characteristics.

The resin insulating layer of the semiconductor device of the third invention of the fourth group of the present invention are comprising a polyphenylene ether resin, a polyolefin type resin, or a fluoro type resin. By using such a resin, the dielectric constant and the dielectric loss tangent of the entire multilayered printed circuit board are lowered and the signal delay and the signal errors do not easily take place even if high frequency signals in the GHz band are used. Further, since the thermal expansion coefficient of the resin used for the foregoing resin insulating layer is not so much different from the thermal expansion coefficient of the polyphenylene type resin to be used for the solder resist layer, peeling and cracking do not easily take place.

At the time of manufacturing the semiconductor device of the third invention of the fourth group of the present invention, after the multilayered printed circuit board having a solder bump is manufactured by the above mentioned method, an IC chip is mounted on prescribed positions of the solder resist layer having the solder bump, the solder is heated for reflow to connect the circuits of the printed circuit board and the IC chip. Successively, the resultant printed circuit board connected with the IC chip is filled with an under-fill (a resin layer) and sealing with a resin is carried out to complete manufacture of a semiconductor device.

In the semiconductor device of the third invention of the fourth group of the present invention, even if high frequency signals in the GHz band are used for the frequency of an IC chip, signal errors attributed to signal transmission delay and transmission loss of the signals are not generated.

Next, the present invention of the fifth group will be explained.

The present invention of the fifth group is a multilayered printed circuit board comprising a conductor circuit and a resin insulating layer serially formed on a substrate in an alternate fashion and in repetition and a solder resist layer formed as an outermost layer, wherein the foregoing solder resist layer contains a P atom-containing epoxy resin.

In the multilayered printed circuit board of the fifth group of the present invention, since the solder resist layer contains a P atom-containing epoxy resin, the multilayered printed circuit board is provided with excellent flame retardancy due to its existence. That is because even if the resin starts burning at the time of ignition, the burning can be stopped at the points of P atoms since the solder resist layer contains a P atom-containing epoxy resin.

Further, since the solder resist layer formed on the multilayered printed circuit board of the fifth group of the present invention is formed by using an epoxy resin excellent in the close adhesion strength as a raw material, the adhesion strength between the solder resist layer and the conductor circuit is high.

Further, as raw materials for the foregoing solder resist layer, other than the foregoing P atom-containing epoxy resin, commonly used ones or the like are used so that an opening part with desired shapes is formed in the foregoing solder resist layer by exposure and development treatment and the like.

In the multilayered printed circuit board of the fifth group of the present invention, the solder resist layer contains the P atom-containing epoxy resin.

As the foregoing P atom-containing epoxy resin, although there is no particular restriction as long as epoxy resins contain phosphorus, however an epoxy resin having phosphoric acid residue is preferable and an epoxy resin having phosphoric acid ester bond is further preferable.

Specifically, an epoxy resin containing divalent phosphoric acid residues and having epoxy groups in both terminals, and an epoxy resin having a monovalent phosphoric acid residue in one terminal and an epoxy group in the other terminal are preferable.

As the foregoing epoxy resin containing divalent phosphoric acid residues and having epoxy groups in both terminals, examples are P atom-containing epoxy resins having the following general formula [4]

(wherein $X^1$, $X^2$ respectively represent O or a single bond.).

(4)

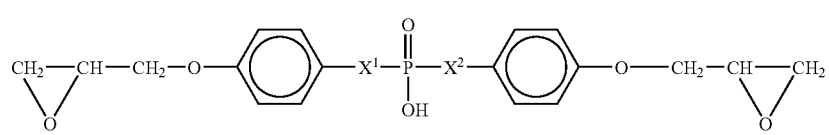

In the case where $X^1$ and/or $X^2$ is O (oxygen), the P atom-containing epoxy resin having the foregoing general formula [4] has phosphoric acid ester bonds.

In the epoxy resins having the foregoing general formula [4], compounds having the following chemical formula [6]:

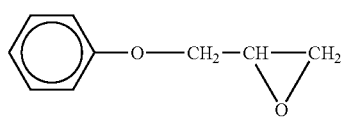

(6)

are bonded to the phosphoric acid residue and the compounds bonded with the foregoing phosphoric acid residue may be compounds, for example, having the following chemical formula [7]:

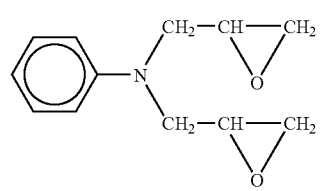

(7)

or the compounds bonded to the phosphoric acid residue may be dissimilar to one another.

Further, as the epoxy resin having a monovalent phosphoric acid residue in one terminal and an epoxy group in the other terminal, examples are P atom-containing epoxy resins having the following general formula [5]:

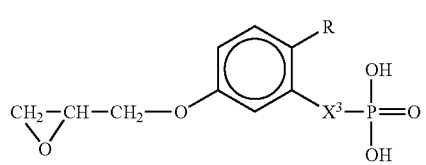

(5)

(wherein $X^3$ represents O or a single bond; and R represents an alkyl of 2 to 8 carbons).

In the case where $X^3$ is O (oxygen), the P atom-containing epoxy resins having the foregoing general formula [5] have phosphoric acid ester bond.

In the epoxy resins defined with the foregoing general formula [5], the compounds bonded with the foregoing phosphoric acid residue may be compounds defined with the chemical formula [7] which has epoxy groups in the terminals.

Further, examples of the foregoing alkyl group are ethyl group, propyl group, isopropyl group, butyl group, sec-butyl group, tert-butyl group, and the like and among them, butyl group is preferable.

The content of the foregoing P atom-containing epoxy resin in the solder resist layer is preferably 0.1 to 70% by weight. If it is less than 0.1% by weight, the multilayered printed circuit board is sometimes not provided with the flame retardancy and on the other hand, if it is more than 70% by weight, the flame retardancy is not so much improved.

The solder resist layer is preferable to contain a silicon compound, an aluminum compound, a magnesium compound and the like as an inorganic filler. Practical examples of these compounds are the same as the inorganic fillers usable for the multilayered printed circuit board of the first invention of the first group of the present invention.

These compounds may be contained solely or two or more of them may be contained.

If these compounds are contained in the solder resist layer, as described in the description of multilayered printed circuit board of the first invention of the first group of the present invention, the stress generated in the solder resist layer is easily moderated and as a result, cracking in the solder resist layer and peeling from the conductor circuits do not easily take place.

The particle diameter of the foregoing inorganic filler is desirably 0.1 to 5.0 μm. If the foregoing particle diameter is smaller than 0.1 μm, the stress generated in the solder resist layer is not so effectively moderated and on the other hand, if bigger than 5.0 μm, the curing property of the layer of the solder resist composition is sometimes badly affected and further the openability of holes is sometimes badly affected at the time of forming the opening part for the solder pad in the layer of the solder resist composition.

The shape of the foregoing inorganic filler is not particularly restricted and, for example, it may be spherical, elliptically spherical, crushed, polygonal shape and the like.

Among them, the spherical shape is desirable since with the shape, the inorganic filler can easily moderate the stress generated in the solder resist layer and does not easily form projected parts in the surface of the solder resist layer.

The content of the inorganic filler in the foregoing solder resist layer is preferably 0.1 to 15% by weight.

If the foregoing content of solder resist layer is lower than 0.1% by weight, the effect of moderating the stress generated in the solder resist layer is scarce and if higher than 15% by weight, an adversely effect on the curing property of the layer of the solder resist composition is sometimes caused and also an adversely effect on the openability of holes is sometimes caused at the time of forming an opening for a solder pad in the layer of the solder resist layer.

The solder resist layer composing the multilayered printed circuit board of the fifth group of the present invention may further contain, for example, a thermosetting resin, a thermoplastic resin, a complex of a thermosetting resin and a thermoplastic resin, other than the foregoing P atom-containing epoxy resin and the inorganic filler. As such a resin layer, examples are: those formed by polymerizing and curing the composition containing a novolak type epoxy resin (meth) acrylate, a bifunctional (meth)acrylic acid ester monomer, a (meth)acrylic acid ester polymer with a molecular weight of 500 to 5000, thermosetting resins comprising a bisphenol type epoxy resin and photosensitive monomers such as polyvalent acrylic monomers; and the like, as the same as those to be used for the multilayered printed circuit board of the first invention of the first group of the present invention.

Applicable of the method for forming a layer of such a solder resist composition is; a method comprising steps of preparing un-cured solder resist composition containing the foregoing P atom-containing epoxy resin and applying the composition by an roll coater or the like; or a method comprising steps of forming a resin film of the un-cured solder resist composition and then thermally laminating the resin film.

Further, in case that the foregoing inorganic filler is contained in the solder resist layer, the foregoing inorganic filler is preferable to be added after being dispersed in a solvent such as methyl ethyl ketone and the like, at the time of producing the foregoing solder resist composition.

That is because the inorganic filler can evenly be dispersed in the solder resist layer without being agglomerated.

The foregoing solder resist composition is preferably a paste-like fluid containing a novolak type epoxy resin (meth) acrylate, an imidazole curing agent, a bifunctional (meth) acrylic acid ester monomer, a (meth)acrylic acid ester polymer with a molecular weight of 500 to 5000, thermosetting resins comprising a bisphenol type epoxy resin and the like, photosensitive monomers such as polyvalent acrylic monomers and the like, and glycol ether type solvents and the like, other than the inorganic filler, phosphorus and phosphorus compound. Further, the viscosity thereof is preferably adjusted to be 1 to 10 Pa·s at 25° C.

Examples of the foregoing imidazole curing agent and the foregoing glycol ether type solvent are the same as those to be used for the solder resist composition of the second invention of the first group of the present invention and the like.

The solder resist layer with such a constitution is excellent in the flame retardancy owing to the addition of the foregoing P atom-containing epoxy resin, so that the multilayered printed circuit board formed with the solder resist layer can satisfy the judgment standard of UL94 (a flame retardancy test of a polymer material) of a UL test standard and especially to satisfy the judgment standard of combustion time in 94V-0.

The multilayered printed circuit board of the fifth group of the present invention can be manufactured in the same manner as the method for manufacturing the multilayered printed circuit board of the first group of the present invention except that the solder resist composition containing the P atom-containing epoxy resin is employed. Incidentally, in the manufacture of the multilayered printed circuit board of the multilayered printed circuit board of the fifth group of the present invention, the resin to be used for forming the resin insulating layer preferably contains the foregoing P atom-containing epoxy resin. The flame retardancy of the multilayered printed circuit board is further improved owing to the existence of the P atom-containing epoxy resin not only in the solder resist layer but also the resin insulating layers.

BEST MODE FOR CARRYING OUT THE INVENTION

The first to fifth groups of the present invention will be described further in details below.

Example 1

A. Preparation of a Resin Composition for Roughened-Surface Formation for an Upper Layer (i) A mixture composition was produced by blending 35 parts by weight of a resin solution produced by dissolving a cresol novolak type epoxy resin acrylated in 25% (made by Nippon Kayaku Co., Ltd.: molecular weight 2,500) of 80 wt. % concentration in diethylene glycol dimethyl ether (DMDG), 3.15 parts by weight of a photosensitive monomer (made by Toagosei Chemical Industry Co., Ltd.: Aronix M 315), 0.5 parts by weight of a defoaming agent (made by San Nopco Ltd.: S-65), and 3.6 parts by weight of N-methylpyrrolidone (NMP) in a container and mixing and stirring them.

(ii) Another mixture composition was produced by blending 12 parts by weight of polyether sulfone (PES), 7.2 parts by weight of an epoxy resin particle (made by Sanyo Chemical Industries, Ltd.: Polymerpol) with the average particle size of 1.0 μm and 3.09 parts by weight of the particle with the average particle size of 0.5 μm in another container and mixing and stirring the mixture and then further adding 30 parts by weight of NMP and mixing and stirring the resultant mixture by a bead mill.

(iii) A mixture composition was produced by blending 2 parts by weight of an imidazole curing agent (made by Shikoku Chemicals Corp.: 2E4MZ-CN), 2 parts by weight of a photopolymerization initiator (made by Chiba Speciality Chemicals Corp.: Irgacure I-907), 0.2 parts by weight of a photosensitizer (made by Nippon Kayaku Co., Ltd.: DETX-S) and 1.5 parts by weight of NMP in further another container and mixing and stirring the mixture.

A resin composition for roughened-surface formation for an upper layer was produced by mixing the mixture compositions produced as (i), (ii) and (iii).

B. Preparation of a Resin Composition for Roughened-Surface Formation for an Under Layer (i) A mixture composition was produced by blending 35 parts by weight of a resin solution produced by dissolving 80 wt. % of a cresol novolak type epoxy resin acrylated in 25% (made by Nippon Kayaku Co., Ltd.: molecular weight 2,500) in diethylene glycol dimethyl ether (DMDG), 4 parts by weight of a photosensitive monomer (made by Toagosei Chemical Industry Co., Ltd.: Aronix M 315), 0.5 parts by weight of a defoaming agent (made by San Nopco Ltd.: S-65), and 3.6 parts by weight of N-methylpyrrolidone (NMP) in a container and mixing and stirring them.

(ii) Another mixture composition was produced by blending 12 parts by weight of polyether sulfone (PES) and 14.49 parts by weight of an epoxy resin particle (made by Sanyo Chemical Industries, Ltd.: Polymerpol) with the average particle size of 0.5 μm in another container, mixing and stirring the mixture, and then further adding 30 parts by weight of NMP and mixing and stirring the resultant mixture by a bead mill.

(iii) A mixture composition was produced by blending 2 parts by weight of an imidazole curing agent (made by Shikoku Chemicals Corp.: 2E4MZ-CN), 2 parts by weight of a photopolymerization initiator (made by Chiba Speciality Chemicals Corp.: Irgacure I-907), 0.2 parts by weight of a photosensitizer (made by Nippon Kayaku Co., Ltd.: DETX-S) and 1.5 parts by weight of NMP in further another container and mixing and stirring the mixture.

A resin composition for roughened-surface formation for an under layer was produced by mixing the mixture compositions produced as (i), (ii) and (iii).

C. Preparation of a Resin Filler (i) A resin filler with the viscosity of 40 to 50 Pa·s at 23±1° C. was produced by blending 100 parts by weight of a bisphenol F type epoxy monomer (made by Yuka Shell Epoxy Co.: molecular weight 310: YL 983U), 170 parts by weight of a $SiO_2$ spherical particle (made by Admatechs Co., Ltd.: CRS 1101-CE) coated with a silane coupling agent on the surface and having the average particle size of 1.6 μm and the diameter of the maximum particle of 15 μm or smaller and 1.5 parts by weight of a levelling agent (made by San Nopco Ltd.: Perenol S4) in a container and mixing and stirring the mixture.

Incidentally, 6.5 parts by weight of an imidazole curing agent (made by Shikoku Chemicals Corp.: 2E4MZ-CN) was used as a curing agent.

D. A Method for Manufacturing a Multilayer Printed Circuit Board (1) A copper-laminated laminate plate composed of a substrate 1 which is made of a 1 mm-thick glass epoxy resin or BT (bismaleimide triazine) resin with a 18 μm-thick copper foil 8 laminated on both sides of the substrate 1 was used as a starting material (reference to FIG. 1(*a*)). At first, the copper-laminated laminate plate was drilled to form a through hole, subjected to electroless plating treatment and then etching treatment in a pattern to form an under-level conductor circuit 4 in both sides of the substrate 1 and a plated-through hole 9.

(2) After the resultant substrate in which the plated-through hole 9 and the under-level conductor circuits 4 are formed was washed with water and dried, the substrate was blackened in a blackening bath (an oxidizing bath) containing an aqueous solution containing NaOH (10 g/L), NaClO$_2$ (40 g/L) and Na$_3$PO$_4$ (6 g/L) and reduced in a reducing bath containing NaOH (10 g/L) an NaBH$_4$ (6 g/L) to form roughened faces 4a, 9a on the entire surfaces of the under-level conductor circuits 4 including the plated-through hole 9 (reference to FIG. 1(b)).

(3) After the resin filler was produced as described in the foregoing description C, the resin filler 10 was applied to one side of the substrate by a roll coater to fill the space between the under-level conductor circuits 4 and inside the plated-through holes 9 and heated and dried. After that, the space between the under-level conductor circuits 4 and inside the plated-through holes 9 on the other side were filled with the resin filler 10 in the same manner and heated and dried (reference to FIG. 1 (c)).

(4) One side of the resultant substrate already subjected to the above described treatment (3) was subjected to polishing to polish the layer of the resin filler 10 formed in the outer peripheries of the conductor circuits and the upper part of the resin filler 10 formed in the non conductor circuit formed area by a belt sander polishing using #600 belt polishing paper (made by Sankyo Chemical Engineering Co.) and then subjected to buffing to remove the scars formed by the foregoing belt sander polishing. A series of such polishing steps were carried out for the other side in the same manner.

Incidentally, if necessary, etching might be carried out before and after the polishing to level a land 9a of the though hole 9 and the roughened faces 4a formed in the under-level conductor circuits 4.

After that, heating treatment at 100° C. for 1 hour and successively at 150° C. for 1 hour was carried out to completely cure the layer of the resin filler.

In such a way, the surface layer part of the resin filler 10 formed in the plated-through hole 9 and in the non conductor circuit formed area and the surfaces of the under-level conductor circuits 4 were leveled to obtain an insulating substrate where the resin filler 10 and the side faces 4a of the under-level conductor circuits 4 were firmly stuck to each other through the roughened faces, and the inner wall face 9a of the plated-through hole 9 and the resin filler 10 were firmly stuck to each other through the roughened faces (reference to FIG. 1 (d)).

(5) Next, the insulating substrate on which conductor circuits were formed by the foregoing process was degreased with an alkaline substance and soft-etched and then treated with a catalyst solution containing palladium chloride and an organic acid to supply Pd catalyst and activate the catalyst.

Figure 2:
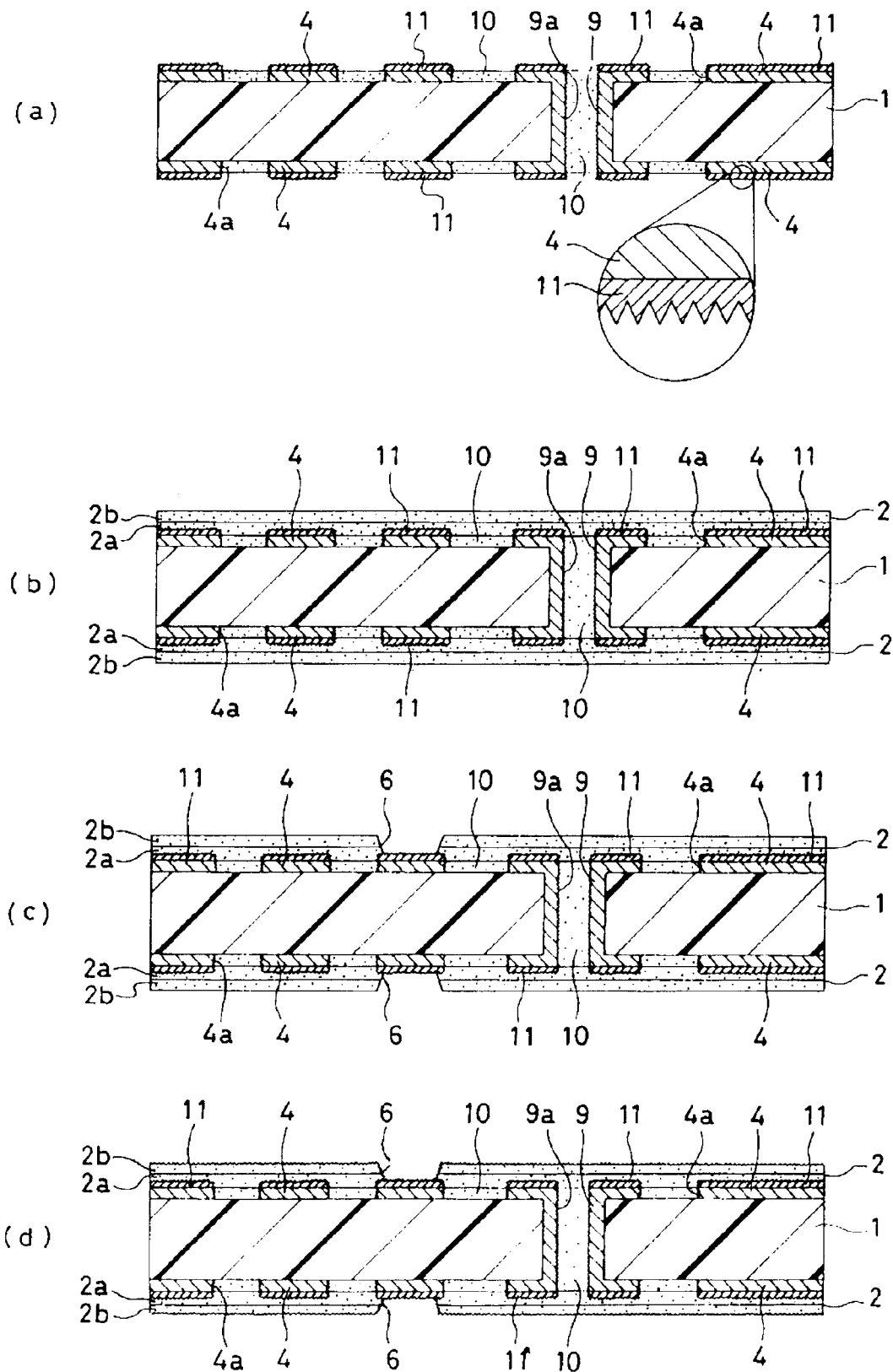
FIGS. 2 (*a*) to (*d*) are cross-section figures showing a part of a manufacturing processes of a multilayered printed circuit board of the present invention.

Next, the substrate was immersed in an electroless copper plating bath of an aqueous solution at pH 9 containing copper sulfate ($3.9 \times 10^{-2}$ mol/l), nickel sulfate ($3.8 \times 10^{-3}$ mol/l), sodium citrate ($7.8 \times 10^{-3}$ mol/l), sodium hypophosphite ($2.3 \times 10^{-1}$ mol/l), a surfactant (made by Nisshin Chemical Industry Co., Ltd.; Surfynol 465) (1.0 g/l) and shaken in vertical and transverse directions once every four seconds, starting from 1 minute after the immersion, to form roughened layers 11 of an acicular alloy of Cu—Ni—P on the under-level conductor circuits and the surfaces of the lands of the plated-through holes (reference to FIG. 2 (a)).

(6) Further, the surfaces of the roughened layers were subjected to Cu—Sn replacement reaction by being immersed in a tin replacement plating solution at pH 1.2 and 35° C. containing tin borofluoride (0.1 mol/l) and thiourea (1.0 mol/l) for 10 minutes to form 0.3 μm-thick Sn layers on the surfaces of the roughened layers. Incidentally, the Sn layers were not illustrated in Figs.

(7) To both sides of the substrate, the resin composition for roughened-surface formation (viscosity: 1.5 Pa·s) for an underlayer described in the foregoing description B was applied by a roll coater within 24 hours after its preparation and then was left for 20 minutes in horizontal state and dried at 60° C. for 30 minutes. After that, the resin composition for roughened-surface formation (viscosity: 7 Pa·s) for an upper layer described in the foregoing description A was applied using a roll coater within 24 hours after its preparation and then left for 20 minutes in horizontal state in the same manner and dried at 60° C. for 30 minutes to form the layers of resin composition for roughened-surface formation 2a, 2b with thickness of 35 μm (reference FIG. 2(b)).

(8) After a photomask film printed with black circles with the diameter of 85 μm was closely stuck to both sides of the resultant substrate on which the layers of resin composition for roughened-surface formation were formed as described in (7) the substrate was exposed to light of 500 mJ/cm$^2$ intensity by an ultra high pressure mercury lamp and then subjected to spray development with a DMDG solution. After that, further the obtained substrate was exposed to light of 3000 mJ/cm$^2$ intensity by an ultra high pressure mercury lamp, heated at 100° C. for 1 hour, at 120° C. for 1 hour, and at 150° C. for 3 hours to form a resin insulating layer with the thickness of 35 μm and having opening parts 6 for via-holes with the diameter of 85 μm and a high size precision corresponding to the circle of the photomask film (reference FIG. 2(c)). Incidentally, the tin plating layers were partly exposed in the opening parts to be via-holes.

(9) The obtained substrate formed with the opening parts 6 for via-holes was immersed in an aqueous chromic acid solution (7500 g/L) for 19 minutes to dissolve and remove the epoxy resin particle existing on the surface of the interlaminar resin insulating layer and roughen the surface to obtain a roughened face. After that, the substrate was immersed in a neutralization solution (made by a Shiplay Co., Inc.) and washed with water (reference FIG. 2 (d)).

Further, a palladium catalyst (made by Atotech Co.) was supplied to the surface of the substrate treated by the surface roughening treatment to stick the catalyst nuclei to the surface of the interlaminar resin insulating layer and to the inner wall face of the opening part for via-holes.

Figure 3:
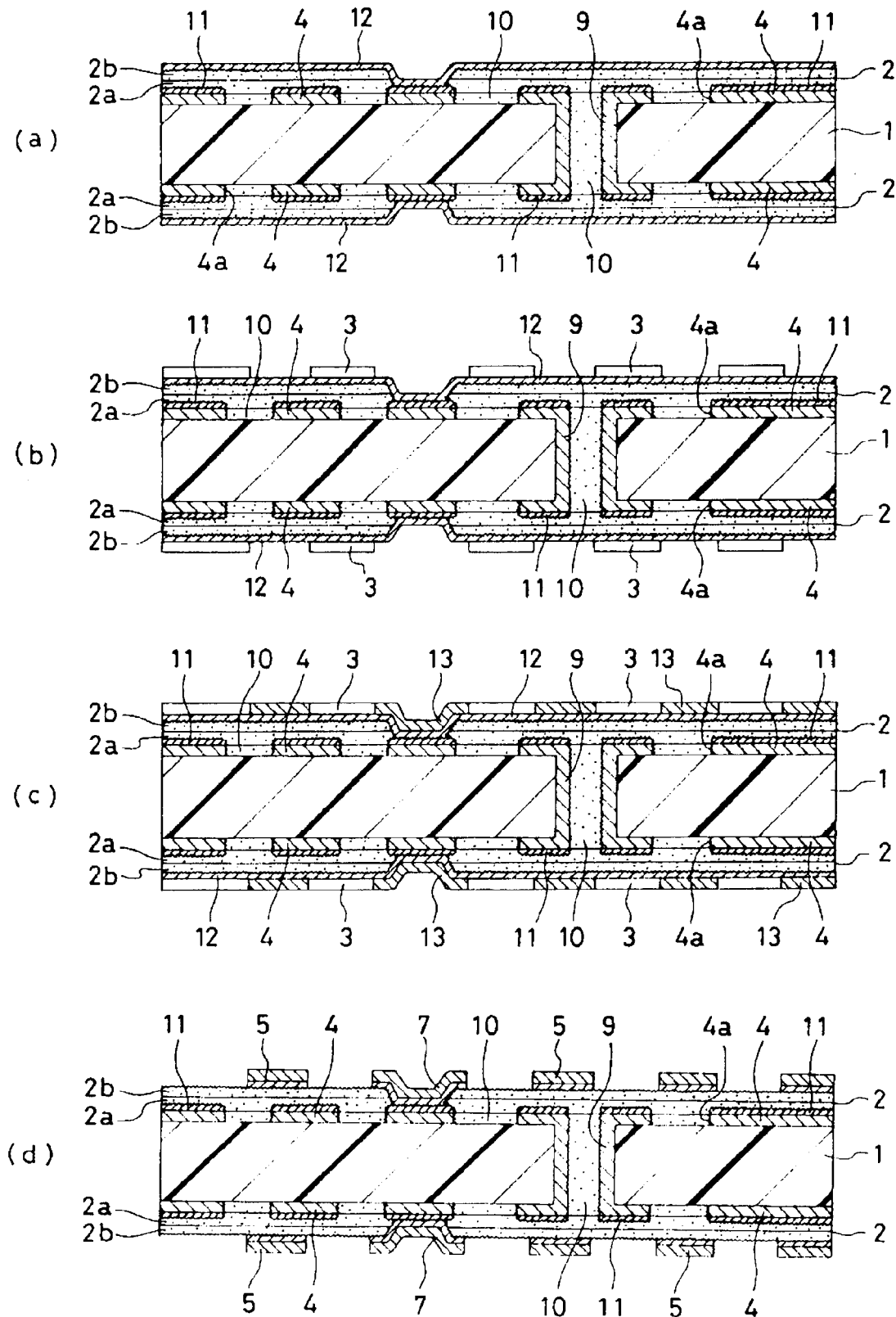
FIGS. 3 (*a*) to (*d*) are cross-section figures showing a part of a manufacturing processes of a multilayered printed circuit board of the present invention.

(10) Next, the substrate was immersed in an electroless copper plating solution of the following composition to form an electroless copper plating film 12 with the thickness of 0.6 to 1.2 μm on the entire roughened surface (reference FIG. 3 (a)):

[Electroless Plating Solution]

| | |
|---|---|
| EDTA | 0.08 mol/l |
| copper sulfate | 0.03 mol/l |
| HCHO | 0.05 mol/l |
| NaOH | 0.05 mol/l |
| α,α'-bipyridyl | 80 mg/l |
| PEG (polyethylene glycol) | 0.10 g/l |

[Electroless Plating Condition]
For 20 minutes at 65° C. of solution temperature.

(11) A photosensitive dry film sold in the market was stuck to the electroless copper plating films 12 and a mask was mounted thereon and exposure was carried out at 100 mJ/cm$^2$ and development treatment with an aqueous 0.8% sodium carbonate solution was carried out to form 15 μm-thick plating resist 3 (reference to FIG. 3 (b)).

(12) Next, electrolytic copper plating on the area where resist is not formed was carried out in the following conditions to form 15 μm-thick electrolytic copper plating films 13 (reference to FIG. 3 (c)).

[Electroplating Solution]

| sulfuric acid | 2.24 mol/l |
|---|---|
| copper sulfate | 0.26 mol/l | an additive (Cupracid HL; by Atotech Japan CO.) 19.5 mol/l

[Electroless Plating Condition]

| current density | 1 A/dm² |
|---|---|
| duration | 65 minutes |
| temperature | 22 ± 2° C. |

(13) After the plating resist was separated and removed with an aqueous 5% KOH solution, the electroless plating films used to be under the plating resist were dissolved and removed by etching with a mixed solution of sulfuric acid and hydrogen peroxide to form independent upper layer conductor circuits 5 (including via-holes 7) (reference to FIG. 3 (d)).

Figure 4:
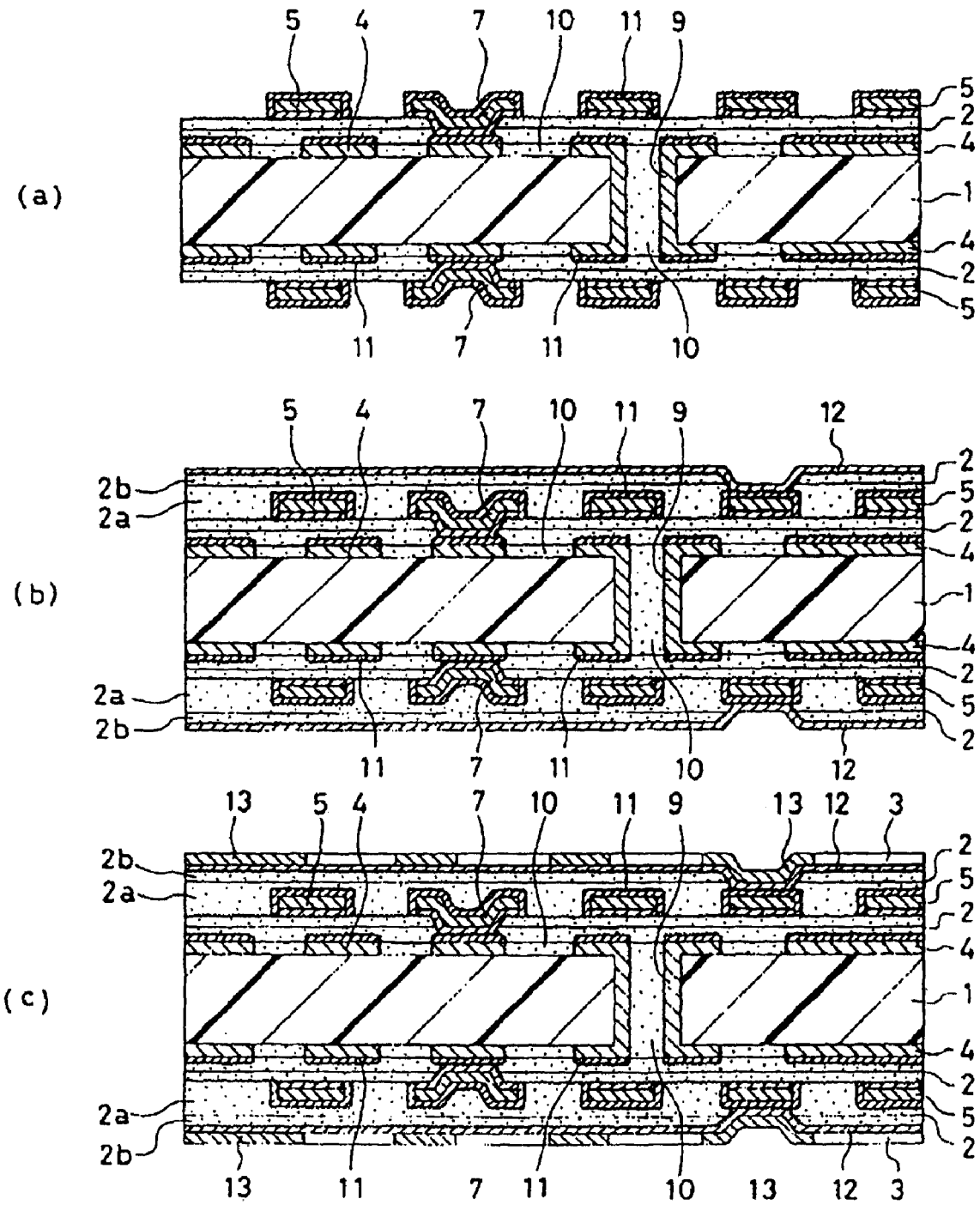
FIGS. 4 (*a*) to (*c*) are cross-section figures showing a part of a manufacturing processes of a multilayered printed circuit board of the present invention.

(14) The resultant substrate in which the conductor circuits were formed was subjected to the same treatment as described in the step (5) to form the 2 μm-thick roughened alloy layers 11 composed of Cu—Ni—P on the surfaces of the conductor circuits (reference to FIG. 4 (a)).

Figure 5:
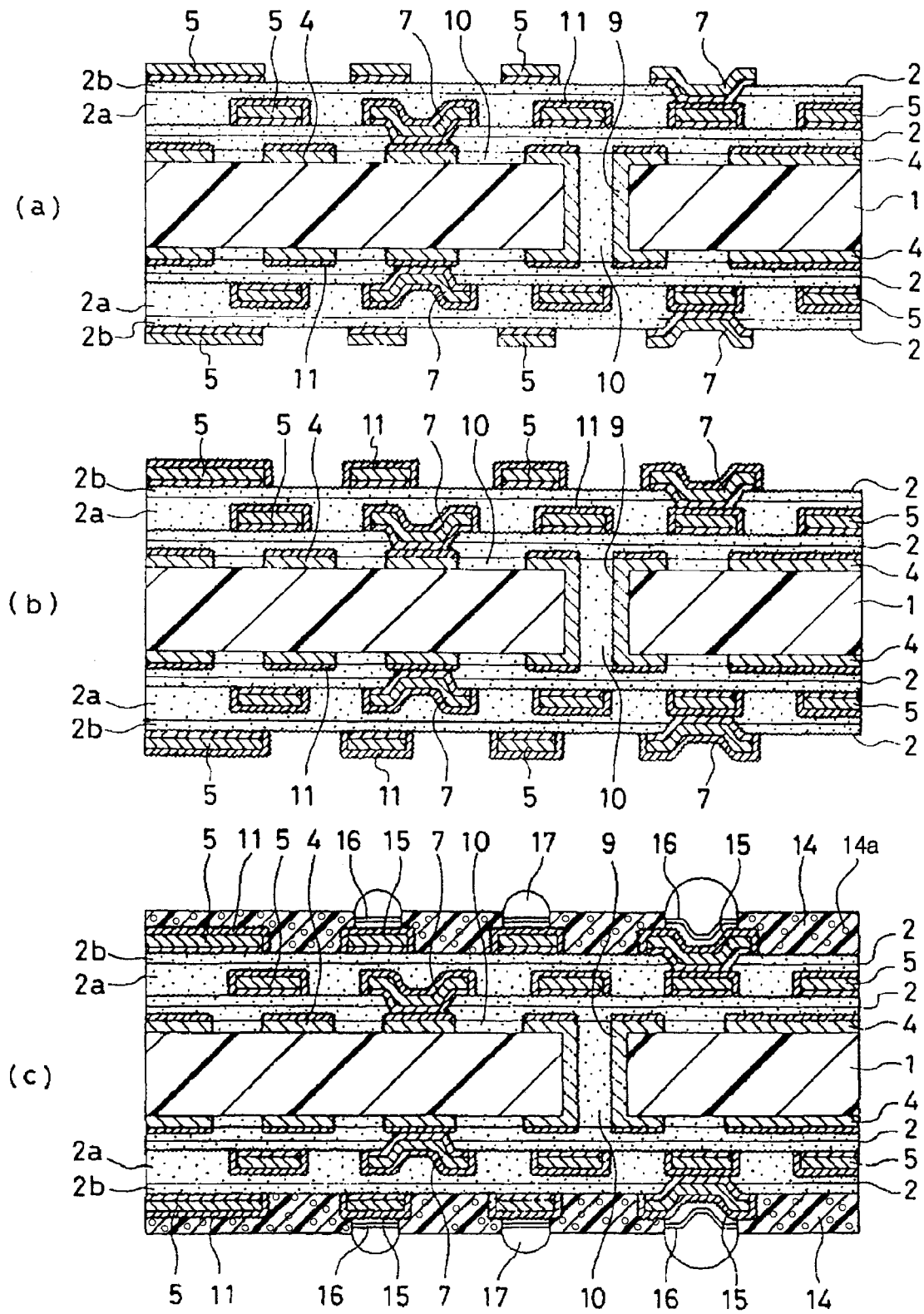
FIGS. 5 (*a*) to (*c*) are cross-section figures showing a part of a manufacturing processes of a multilayered printed circuit board of the present invention.

(15) Successively, the foregoing steps (6) to (14) were repeated to form further upper layer conductor circuits (reference to FIG. 4 (b) to FIG. 5 (b)).

(16) Next, a solder resist resin composition with the viscosity of 2.0 Pa·s at 25° C. was obtained by blending 46.67 parts by weight of photosensitivity provided oligomer (molecular weight: 4000) which was a cresol novolak type epoxy resin (made by Nippon Kayaku Co., Ltd.) whose 50% of epoxy group was acrylated and which was dissolved in 60 wt. % concentration in diethylene glycol methyl ether (DMDG), 15 parts by weight of a bisphenol A type epoxy resin (made by Yuka Shell Epoxy Co.: Epikote 1001) dissolved in 80 wt. % concentration in methyl ethyl ketone, 1.6 parts by weight of an imidazole curing agent (made by Shikoku Chemicals Corp.: 2E4MZ-CN), 3 parts by weight of a polyfunctional acrylic monomer, which is a photosensitive monomer, (made by Nippon Kayaku Co., Ltd.: R 604), 1.5 parts by weight of also a polyvalent acrylic monomer (made by Kyoei Chemical Co., Ltd.: DPE 6A), 12.0 part by weight of an elliptically spherical alumina particle 14(a) with 1.0 μm average particle diameter of the longest part as an inorganic filler and 0.71 parts by weight of a dispersion type defoaming agent (made by San Nopco Ltd.: S-65) in a container and mixing and stirring the obtained mixture and further adding 2.0 parts by weight of benzophenone (made by Kanto Chemical Co., Inc.) as a photopolymerization initiator to the obtained mixture composition and 0.2 parts by weight of Michler's ketone (made by Kanto Chemical Co., Inc.) as a photosensitizer.

Incidentally, the viscosity measurement was carried out by a B-type viscometer (DVL-B type; by Tokyo Instruments Co. Ltd.), using a rotor No. 4 for 60 rpm and a rotor No. 3 for 6 rpm.

(17) Next, the foregoing solder resist composition was applied in 20 μm thickness on both sides of the multilayer circuit substrate and dried at 70° C. for 20 minutes and 70° C. for 30 minutes and after that, a 5 mm-thick photomask drawing a pattern corresponding to the opening part of the solder resist was closely stuck to the solder resist layers and exposure by ultraviolet rays of 1000 mJ/cm² and development treatment by the DMTG solution were successively carried out to form opening parts with 200 μm diameter.

Further, the resultant solder resist layer was cured by heating in conditions: at 80° C. for 1 hour, at 100° C. for 1 hour, at 120° C. for 1 hour, and at 150° C. for 3 hours to form a solder resist layer 14 (an insulating organic resin layer) with the thickness of 20 μm and having openings corresponding to parts for solder pads.

(18) Next, the substrate bearing the solder resist layer (an insulating organic resin layer) 14 was immersed for 20 minutes in an electroless nickel plating solution at pH 4.5 containing nickel chloride ($2.3 \times 10^{-1}$ mol/L), sodium hypophosphite ($2.8 \times 10^{-1}$ mol/L), and sodium citrate ($1.6 \times 10^{-1}$ mol/L) to form a nickel plating layer 15 in the opening part with the thickness of 5 μm. Further, the resultant substrate was immersed for 7.5 minutes at 80° C. in an electroless plating solution containing potassium cyanoaurate ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/L) to form a gold plating layer 16 on the nickel plating layer 15 with the thickness of 0.03 μm.

(19) After that, a solder paste was printed in the openings of the solder resist layer 14 and subjected to reflow at 200° C. to form solder bumps 17 and to manufacture a multilayer printed circuit board having solder bumps 17 (reference to FIG. 5 (c)).

Example 2

A. Preparation of a Resin Composition for Roughened-Surface Formation for an Upper Layer and an Under Layer and Preparation of the Resin Filler were Carried Out in the Same Manner as Described in the Example 1

B. Method for Manufacturing a Multilayered Printed Circuit Board (1) A copper-laminated laminate plate composed of a substrate 1 which is made of a 1.0 mm-thick glass epoxy resin or BT (bismaleimide triazine) resin with a 18 μm-thick copper foil 8 laminated on both sides of the substrate 1 was used as a starting material (reference to FIG. 6(a)). At first, the copper-laminated laminate plate was drilled to form a through hole, subjected to electroless plating treatment and then etching treatment in a pattern to form an under-level conductor circuit 4 in both sides of the substrate 1 and a plated-through hole 9.

Figure 6:
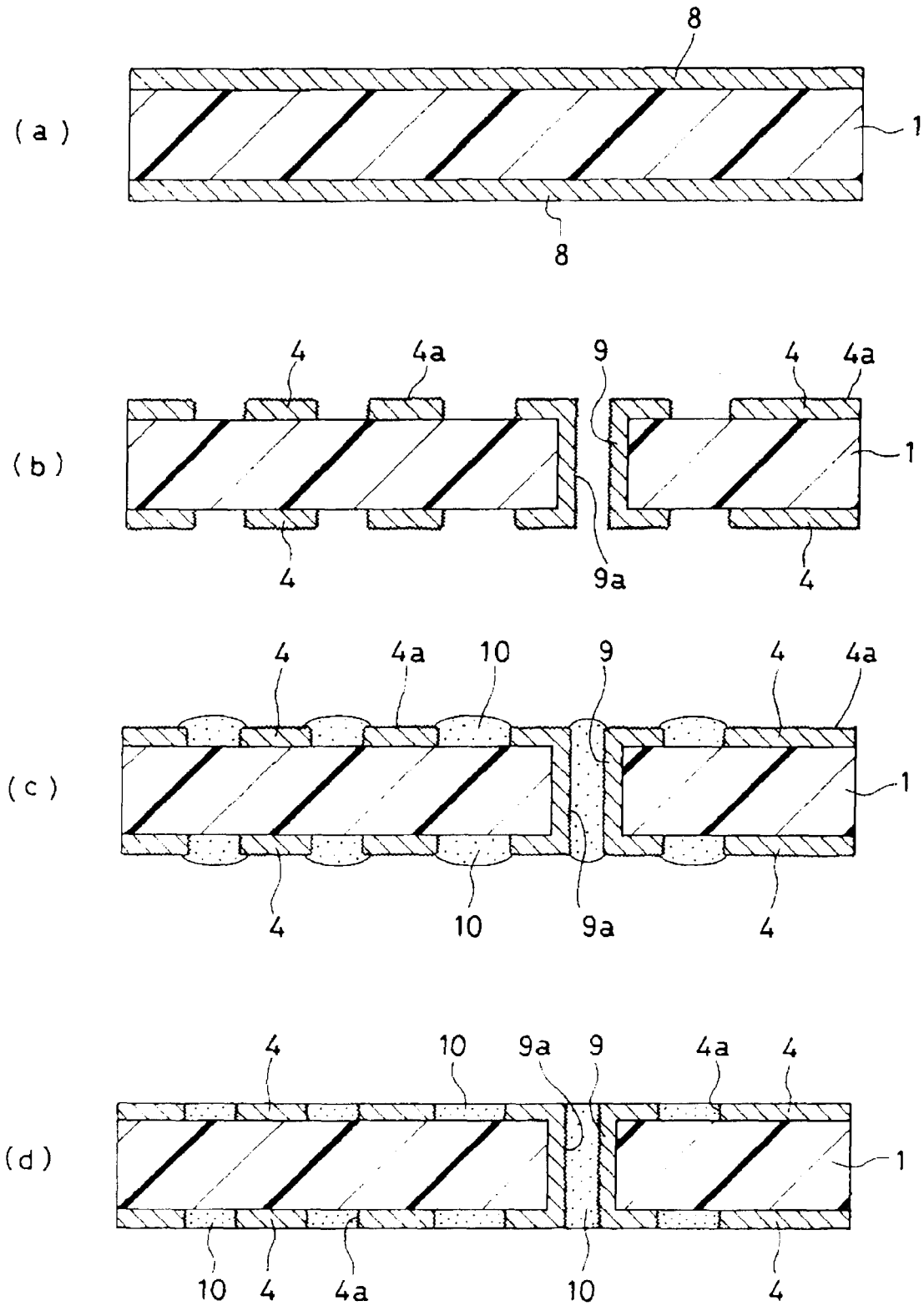
FIGS. 6 (*a*) to (*d*) are cross-section figures showing a part of a manufacturing processes of a multilayered printed circuit board of the present invention.

(2) After the resultant substrate in which the plated-through hole 9 and the under-level conductor circuits 4 are formed was washed with water and dried, the substrate was then subjected to blackening treatment in a blackening bath (an oxidizing bath) of an aqueous solution containing NaOH (10 g/l), $NaClO_2$ (40 g/l), and $Na_3PO_4$ (6 g/l) and reducing treatment in a reducing bath containing an aqueous solution containing NaOH (10 g/l) and $NaBH_4$ (6 g/l) to form roughened surfaces 4a, 9a on the entire surfaces of the under-level conductor circuits 4 including the plated-through holes 9 (reference to FIG. 6 (b)).

(3) After the foregoing resin filler was produced, layers of the resin filler 10 were formed in the plated-through holes 9, the non conductor circuit formed area and the outer rim area of the conductor circuit 4 in one side of the substrate 1 within 24 hours after preparation of the resin filler by the following method.

That is, at first the resin filler was squeezed into the through holes using a squeegee and then dried at 100° C. for 20 minutes. Next, a mask having opening parts in the portions corresponding to the non conductor circuit formed area was put on the substrate and layers of the resin filler 10 were formed in recessed parts, which was corresponding to the non conductor circuit formed area, using a squeegee and dried at 100° C. for 20 minutes (reference to FIG. 6 (c)).

(4) The one side of the substrate for which the foregoing step (3) was just finished was polished by a belt sander polishing using #600 belt polishing paper (made by Sankyo Chemical Engineering Co.) as to leave no resin filler 10 on the surface of the inner layer copper pattern 4 and on the land surfaces of the plated-through holes 9 and then buffed to eliminate the scars formed by the foregoing belt sander polishing. Such a series of steps were also carried out for the other side of the substrate.

After that, heating treatment was carried out at 100° C. for 1 hour, at 120° C. for 3 hours, at 150° C. for 1 hour, and 180° C. for 7 hours to cure the resin filler 10.

In such a manner, the surface layer parts of the resin filler 10 formed in the plated-through holes 9 and in the non-conductor circuit formed area and the surfaces of the under-level conductor circuits 4 were leveled to obtain an insulating substrate (reference to FIG. 6 (d)) where the resin filler 10 and the side faces 4a of the under-level conductor circuits 4 were firmly stuck to each other through the roughened surfaces, and the inner wall faces 9a of the plated-through holes 9 and the resin filler 10 were firmly stuck to each other by the roughened surfaces.

Figure 7:
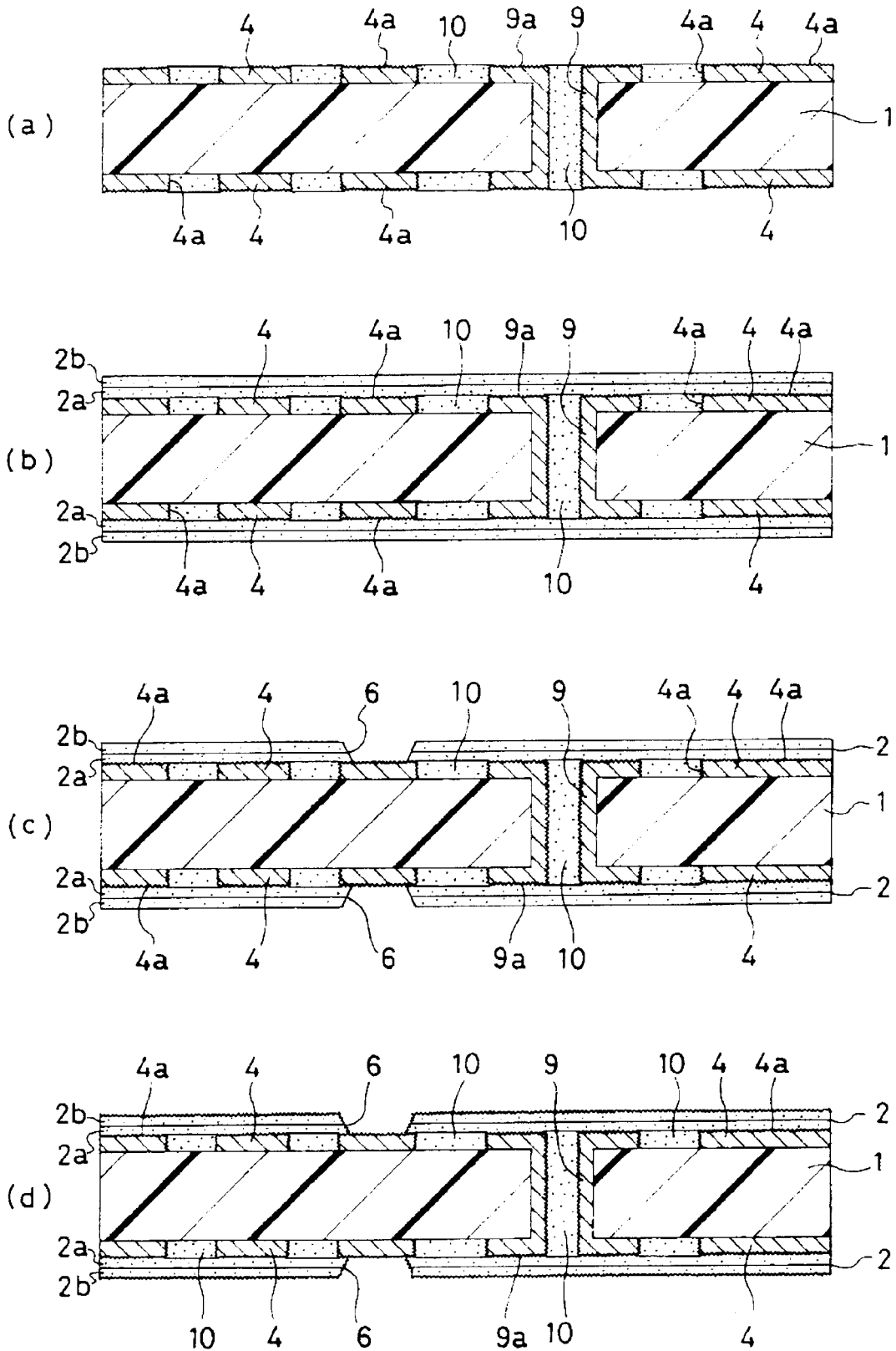
FIGS. 7 (*a*) to (*d*) are cross-section figures showing a part of a manufacturing processes of a multilayered printed circuit board of the present invention.

(5) Next, the foregoing substrate was washed with water, degreased by an acid, and then soft-etched and after that an etching solution was sprayed to both sides of the substrate to etch the surfaces of the under-level conductor circuits 4 and land surfaces and the inner walls of the plated-through holes 9 to form the roughened surfaces 4a, 9a in the entire surfaces of the under-level conductor circuits 4 (reference to FIG. 7 (a)). The etching solution used was an etching solution (made by Meck Co.; Meck etch bond) composed of 10 part by weight of imidazole-Cu(II) complex, 7 part by weight of glycoric acid, and 5 part by weight of potassium chloride.

(6) The resin composition (viscosity 1.5 Pa·s) for roughened-surface formation for an under layer was applied to both sides of the substrate by a roll coater within 24 hours after production of the composition and then, after being kept still horizontally for 20 minutes drying was carried out at 60° C. for 30 minutes. After that, the resin composition (viscosity 7 Pa·s) for roughened-surface formation for an upper layer was applied to the substrate by a roll coater within 24 hours after production of the composition, and then after being kept still horizontally for 20 minutes, drying was carried out at 60° C. for 30 minutes to form 35 μm-thick layers 2a, 2b of the resin composition for roughened-surface formation (reference to FIG. 7 (b)).

(7) Photomask films drawing black circles of 85 μm in diameter of a light shielding ink were closely stuck to both sides of the substrate 1 on which the layers 2a, 2b of the resin compositions for the roughened-surface formation were formed as described in the foregoing step (6) and the substrate was exposed to light in 3000 mJ/cm² intensity of an ultra high pressure mercury lamp and then subjected to heating treatment at 100° C. for 1 hour, at 120° C. for 1 hour, and at 150° C. for 3 hours to form 35 μm-thick interlaminar resulating layers 2 having opening parts 6 for via-holes of 85 μm in diameter with excellent size precision corresponding to the photomask films (reference to FIG. 7 (c)). Incidentally, the tin plating layers were partly exposed in the opening parts to be via-holes.

(8) The substrate in the which opening parts 6 for via-holes were formed was immersed in an aqueous chromic acid for 19 minutes to dissolve and remove the epoxy resin particles existing on the surfaces of the interlaminar resin insulating layers 2 and roughen the surfaces of the interlaminar resin insulating layers 2 to obtain the roughened surfaces (depth of 6 μm). After that, the resultant substrate was immersed in a neutralization solution (made by Shiplay Co., Inc.) and washed with water (reference to FIG. 7 (d)).

Further, a palladium catalyst (Atotech Japan CO.) was supplied on the surface of the substrate subjected to the surface roughening treatment to stick catalyst cores to the surfaces of the interlaminar resin insulating layers 2 and the inner wall faces of the opening parts 6 for via-holes.

Figure 8:
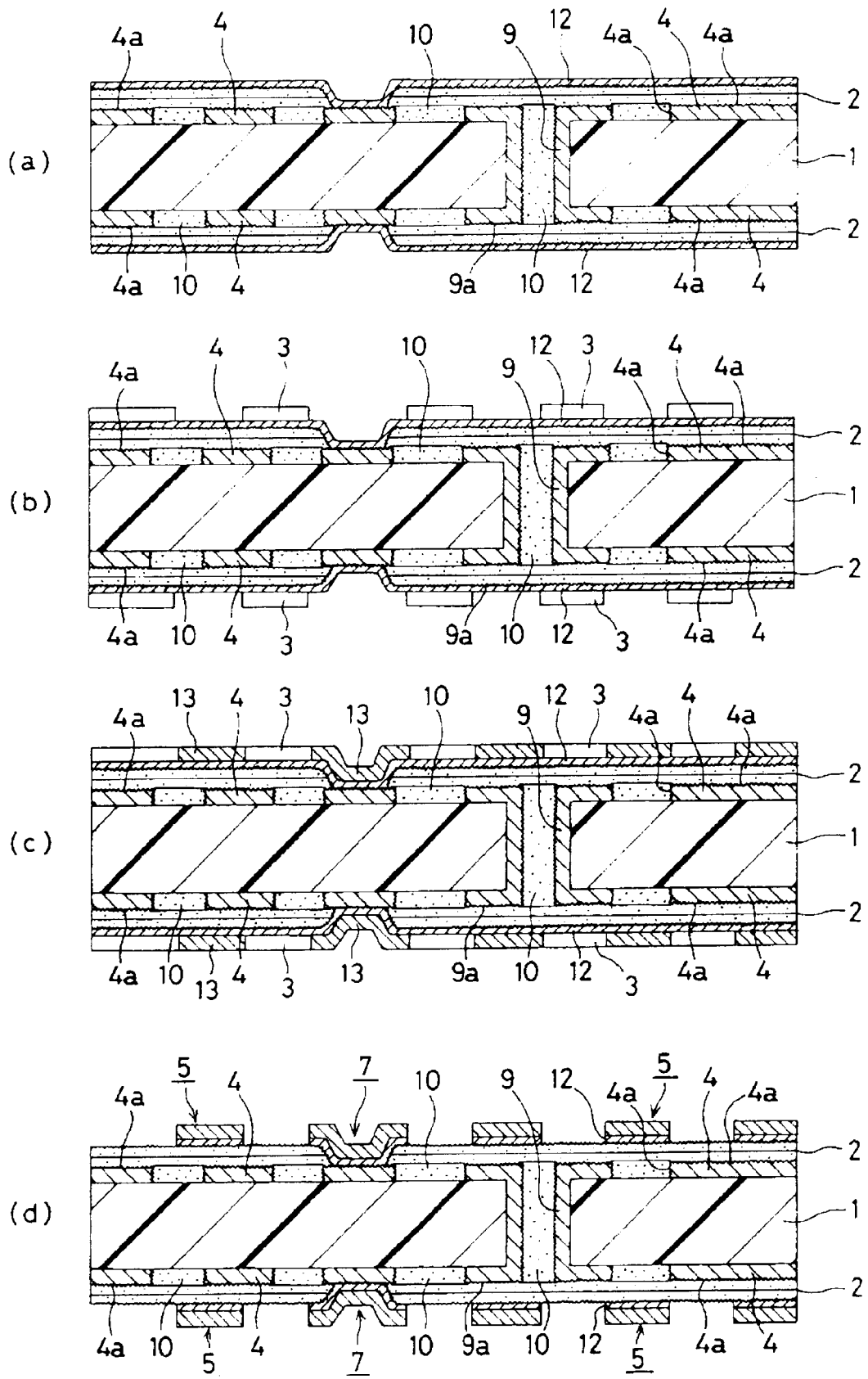
FIGS. 8 (*a*) to (*d*) are cross-section figures showing a part of a manufacturing processes of a multilayered printed circuit board of the present invention.

(9) Next, the substrate was immersed in an electroless copper plating solution with the following composition to form electroless copper plating films 12 of 0.6 to 1.2 μm thickness on the entire roughened surface (reference to FIG. 8 (a)).

[Electroless Plating Solution]

| NiSO$_4$ | 0.003 mol/l |
|---|---|
| tartaric acid | 0.200 mol/l |
| copper sulfate | 0.030 mol/l |
| HCHO | 0.050 mol/l |
| NaOH | 0.100 mol/l |
| α,α'-bipyridyl | 40 mg/l |
| PEG (polyethylene glycol) | 0.10 g/l |

[Electroless Plating Condition]
For 40 minutes at 65° C. of solution temperature.

(10) A photosensitive dry film sold on the market was thermally stuck to the electrolytic copper plating film 12, a mask was put thereon, exposure was carried out at 100 mJ/cm², and development treatment was carried out with an aqueous solution of 0.8% sodium carbonate to form an etching resist 3 with the thickness of 15 μm (reference to FIG. 8 (b)).

(11) Next, electrolytic copper plating was carried out in the following conditions to form 15 μm-thick electrolytic copper plating films 13 (reference to FIG. 8 (c)).

[Electroplating Solution]

| sulfuric acid | 2.24 mol/l |
|---|---|
| copper sulfate | 0.26 mol/l | an additive (Cupracid HL; by Atotech Japan CO.) 19.5 mol/l
[Electroless Plating Condition]

| current density | 1 A/dm² |
|---|---|
| duration | 65 minutes |
| temperature | 22 ± 2° C. |

(12) After the plating resist 3 was separated and removed with an aqueous 5% KOH solution, the electroless plating films 12 used to be under the plating resist 3 was dissolved and removed by etching treatment with a mixed solution of sulfuric acid and hydrogen peroxide to form independent conductor circuits 5 (including via-holes 7) comprising the electroless copper plating films 12 and the electrolytic copper plating films 13 (reference to FIG. 8 (*d*)).

Figure 9:
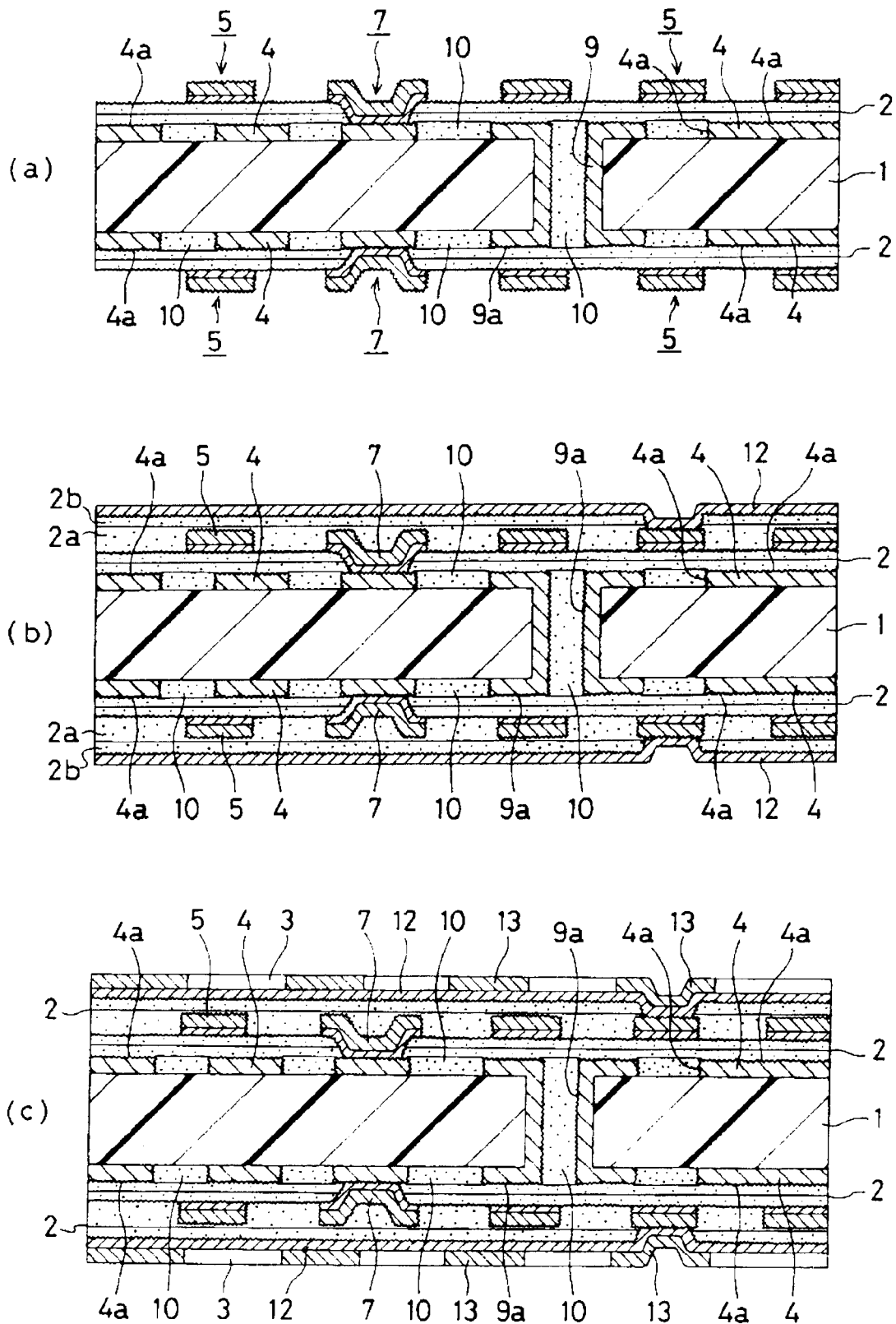
FIGS. 9 (*a*) to (*c*) are cross-section figures showing a part of a manufacturing processes of a multilayered printed circuit board of the present invention.

(13) The foregoing steps (5) to (12) were repeated to form further upper interlaminar resin insulating layers and conductor circuits and obtain a multilayered printed circuit board. Incidentally, no coating film was formed by replacement with Sn or the like on the roughened surface layers (reference to FIG. 9 (*a*) to FIG. 10 (*b*)).

(14) Next, a solder resist composition with the viscosity of 2.0 Pa·s at 25° C. was obtained by blending 46.67 parts by weight of photosensitivity provided oligomer (molecular weight: 4000) which was a cresol novolak type epoxy resin (made by Nippon Kayaku Co., Ltd.) whose 50% of epoxy group was acrylated and which was dissolved to be 60 wt. % concentration in diethylene glycol methyl ether (DMDG), 15.0 parts by weight of a bisphenol A type epoxy resin (made by Yuka Shell Epoxy Co.: Epikote 1001) dissolved in 80 wt. % concentration in methyl ethyl ketone, 1.6 parts by weight of an imidazole curing agent (made by Shikoku Chemicals Corp.: 2E4MZ-CN), 3 parts by weight of a polyvalent acrylic monomer, which is a photosensitive monomer, (made by Nippon Kayaku Co., Ltd.: R 604), 1.5 parts by weight of also a polyvalent acrylic monomer (made by Kyoei Chemical Co., Ltd.: DPE 6A), 10 parts by weight of a spherical silica with the average particle diameter of 1.0 μm as an inorganic filler and 0.71 parts by weight of a dispersion type defoaming agent (made by San Nopco Ltd.: S-65) in a container and mixing and stirring the obtained mixture and further adding 2.0 parts by weight of benzophenone (made by Kanto Chemical Co., Inc.) as a photopolymerization initiator to the obtained mixture composition and 0.2 parts by weight of Michler's ketone (made by Kanto Chemical Co., Inc.) as a photosensitizer.

Incidentally, the viscosity measurement was carried out by a B-type viscometer (DVL-B type; by Tokyo Instruments Co. Ltd.), using a rotor No. 4 for 60 rpm and a rotor No. 3 for 6 rpm.

(15) Next, the foregoing solder resist composition was applied to both sides of the multilayer circuit substrate in 20 μm thickness, dried at 70° C. for 20 minutes and at 70° C. for 30 minutes, exposed to UV rays of 1000 mJ/cm$^2$ intensity while being closely covered with a 5 mm-thick photomask drawing a pattern corresponding to the opening part of the solder resist, and developed with a DMTG solution to form an opening with the diameter of 200 μm.

Further, the resultant solder resist layer was cured by heating in conditions: at 80° C. for 1 hour, at 100° C. for 1 hour, at 120° C. for 1 hour, and at 150° C. for 3 hours to form a 20 μm-thick solder resist layer 14 having openings.

(16) After that, after the concentration of an etching solution mainly containing sodium persulfate was adjusted to have the etching rate of about 2 μm per minute, the substrate subjected to the foregoing steps was immersed in the etching solution for 1 minute to get the surfaces having the average roughness (Ra) of 1 μm.

(17) Next, the substrate subjected to the foregoing roughing treatment was immersed for 20 minutes in an electroless nickel plating solution at pH 4.5 containing nickel chloride ($2.3 \times 10^{-1}$ mol/L), sodium hypophosphite ($2.8 \times 10^{-1}$ mol/L), and sodium citrate ($1.6 \times 10^{-1}$ mol/L) to form a nickel plating layer 15 in the opening part with the thickness of 5 μm. Further, the resultant substrate was immersed for 7.5 minutes at 80° C. in an electroless plating solution containing potassium cyanoaurate ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/L) to form a gold plating layer 16 on the nickel plating layer 15 with the thickness of 0.03 μm.

Figure 10:
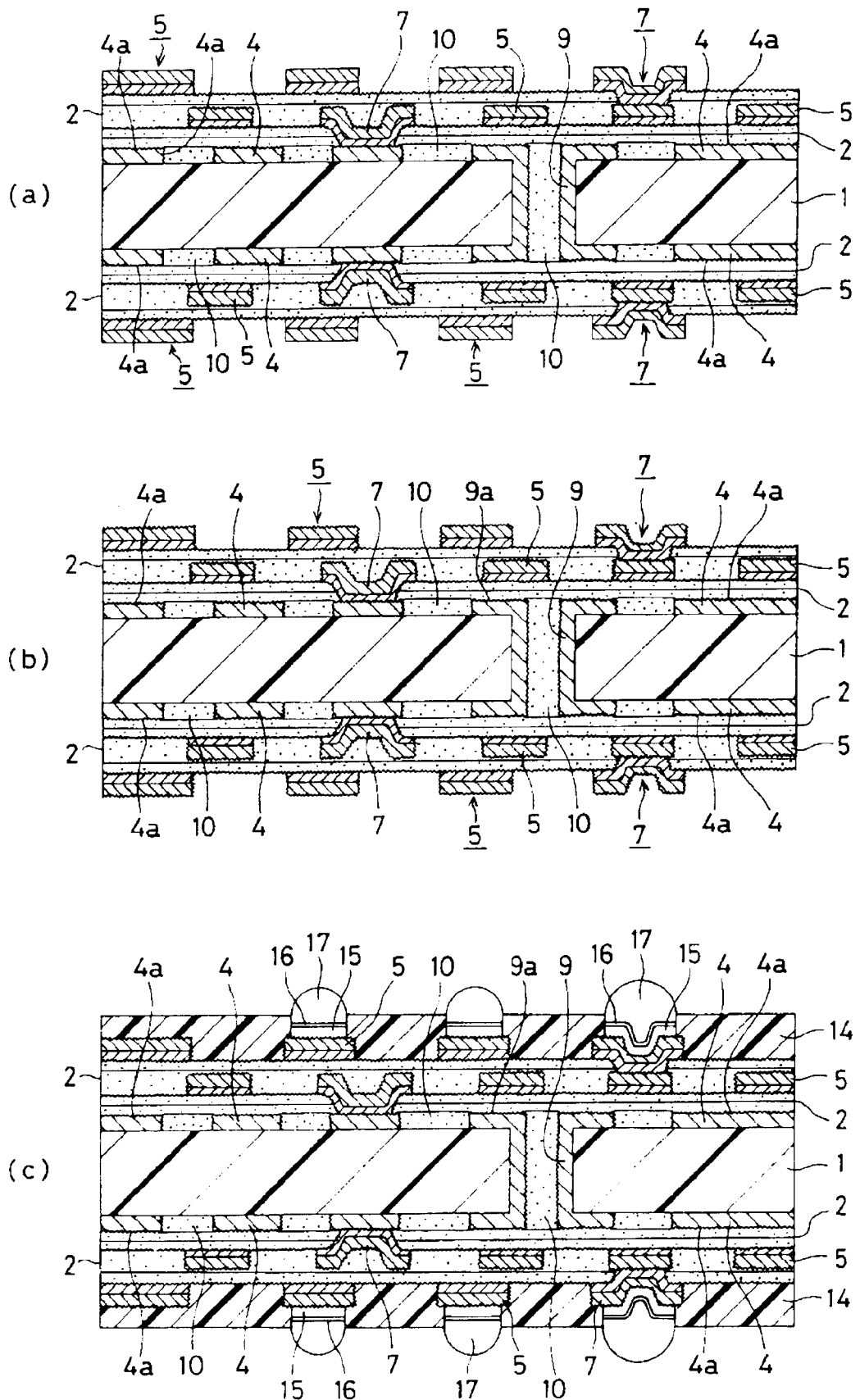
FIGS. 10 (*a*) to (*c*) are cross-section figures showing a part of a manufacturing processes of a multilayered printed circuit board of the present invention.

(18) After that, a solder paste was printed in the opening of the solder resist layer 14 and subjected to reflow at 200° C. to form solder bumps 17 and to manufacture a multilayer printed circuit board having solder bumps 17 (reference to FIG. 10 (*c*)).

Example 3

A multilayered printed circuit board was manufactured in the same manner as the example 1 except that 7 parts by weight of epoxy-terminated polybutadiene was further added as an elastomer in the process of preparing the solder resist composition in the step (16).

Example 4

A multilayered printed circuit board was manufactured in the same manner as the example 2 except that 7 parts by weight of epoxy-terminated polybutadiene was further added as an elastomer in the process of preparing the solder resist composition in the step (14).

Comparative Example 1

A multilayered printed circuit board was manufactured in the same manner as the example 1 except that no inorganic filler was added in the process of preparing the solder resist composition.

Comparative Example 2

A multilayered printed circuit board was manufactured in the same manner as the example 2 except that no inorganic filler was added in the process of preparing the solder resist composition.

The multilayered printed circuit boards obtained in the foregoing examples 1 to 4 and comparative examples 1 to 2 were subjected to a reliability test and then the parts of the solder bumps were observed by a microscope. Incidentally, the reliability test was carried out by keeping the multilayered printed circuit boards under the conditions of 85% relative humidity and 130° C. temperature for 300 hours.

Several parts of the solder resist layers were observed by a microscope by cutting the multilayered printed circuit boards with a cutter after the foregoing test.

Further, the multilayered printed circuit boards were subjected to a heat cycle test and then those multilayered printed circuit boards were cut by a cutter to observe whether cracking took place in the solder resist layers or not. Incidentally, the heat cycle test was carried out by repeating the cycle which keeps the multilayered printed circuit boards in −65° C. atmosphere for 3 minutes and then in 130° C. atmosphere for 3 minutes 2000 times.

As a result, neither cracking nor peeling was observed, also neither any damage nor any break of the solder bumps was observed in the multilayered printed circuit boards obtained by the examples 1 to 4, on the other hand cracking was found in the solder resist layers in the multilayered printed circuit boards of the comparative examples 1, 2 and damages of solder bumps were observed after the reliability test.

Further, regarding the heat cycle test, no cracking was observed in the multilayered printed circuit boards obtained by the examples 1 to 4, whereas cracking was observed in the multilayered printed circuit boards obtained by the comparative examples 1, 2.

Example 5

A multilayered printed circuit board was manufactured in the same manner as the example 1 except that a solder resist composition was prepared according to the following method.

Preparation of the Solder Resist Composition (i) A mixture composition was produced by stirring and mixing 46.67 parts by weight of photosensitivity-provided oligomer (molecular weight: 4000) which was a cresol novolak type epoxy resin (made by Nippon Kayaku Co., Ltd.) whose 50% of epoxy group was acrylated and which was dissolved to be 60 wt. % concentration in diethylene glycol methyl ether (DMDG), 3 parts by weight of a polyfunctional acrylyk monomer, which was a photosensitive monomer, (made by Nippon Kayaku Co., Ltd.; R604), 7 parts by weight of epoxy-terminated polybutadiene, and 0.71 part by weight of a defoaming agent (made by San Nopco Ltd.; trade name: S-65) in a container.

(ii) An another mixture composition was produced by stirring and mixing 15 part by weight of a bisphenol A type epoxy resin (made by Yuka Shell Epoxy CO.; trade name: Epikote 1001) dissolved to be 80% by weight concentration in methyl ethyl ketone and 1.5 part by weight of a polyvalent acrylic monomer (made by Kyoei Chemical Co., Ltd.; trade name: DPE 6A), which was a photosensitive monomer, in another container.

(iii) Further, another mixture composition was produced by mixing and stirring 1.6 part by weight of an imidazole curing agent (made by Shikoku Chemicals Corp.; 2E4MZ-CN), 2.0 part by weight of benzophenon (made by Kanto Chemical Co., Inc.) as a photopolymerization initiator and 0.2 part by weight of Micheler's ketone (made by Kanto Chemical Co., Inc.) as a photosensitizer in further another container.

The mixture compositions obtained in (i), (ii), and (iii) were mixed to give a solder resist composition with 2.0 Pa·s viscosity at 25° C.

The viscosity measurement was carried out by a B-type viscometer (DVL-B type; by Tokyo Instruments Co. Ltd.), using a rotor No. 4 for 60 rpm and a rotor No. 3 for 6 rpm.

Example 6

A multilayered printed circuit board was manufactured in the same manner as the example 2 except that the solder resist composition prepared in the same manner as the example 5 was used.

Example 7

A multilayered printed circuit board was manufactured in the same manner as the example 2 except that a solder resist composition prepared in the following method was used.

(i) A mixture composition was produced by stirring and mixing 46.67 parts by weight of photosensitivity-provided oligomer (molecular weight: 4000) which was a cresol novolak type epoxy resin (made by Nippon Kayaku Co., Ltd.) whose 50% of epoxy group was acrylated and which was dissolved to be 60 wt. % concentration in diethylene glycol methyl ether (DMDG), 3 parts by weight of a polyfunctional acrylic monomer, which was a photosensitive monomer, (made by Nippon Kayaku Co., Ltd.; trade name: R604), 13.5 part by weight of a spherical silica with the average particle diameter of 0.5 µm, 7 part by weight of epoxy-terminated polybutadiene and 0.71 part by weight of a defoaming agent (made by San Nopco Ltd.; trade name: S-65) in a container.

(ii) An another mixture composition was produced by stirring and mixing 15 part by weight of a bisphenol A type epoxy resin (made by Yuka Shell Epoxy CO.; trade name: Epikote 1001) dissolved to be 80% by weight concentration in methyl ethyl ketone and 1.5 part by weight of a polyvalent acrylic monomer (made by Kyoei Chemical Co., Ltd.; trade name: DPE 6A;), which was a photosensitive monomer, in another container.

(iii) Further, another mixture composition was produced by mixing and stirring 1.6 part by weight of an imidazole curing agent (made by Shikoku Chemicals Corp.; 2E4MZ-CN), 2.0 part by weight of benzophenon (made by Kanto Chemical Co., Inc.) as a photopolymerization initiator and 0.2 part by weight of Micheler's ketone (made by Kanto Chemical Co., Inc.) as a photosensitizer in further another container.

The mixture compositions obtained in (i), (ii), and (iii) were mixed to give a solder resist composition with 2.0 Pa·s viscosity at 25° C.

Example 8

A multilayered printed circuit board was manufactured in the same manner as the example 6 except that the solder resist composition prepared in the same manner as in the example 7 was used.

Comparative Example 3

A multilayered printed circuit board was manufactured in the same manner as the example 5 except that epoxy-terminated polybutadiene was not added in the preparation of the solder resist composition.

Comparative Example 4

A multilayered printed circuit board was manufactured in the same manner as the example 6 except that epoxy-terminated polybutadiene was not added in the preparation of the solder resist composition.

The multilayered printed circuit boards obtained in the foregoing examples 5 to 8 and comparative examples 3, 4 were subjected to the same reliability test as that in the example 1 and then several parts of the solder bump were observed by a microscope.

After the foregoing reliability test, several parts of the solder resist layers were observed by a microscope by cutting the multilayered printed circuit boards with a cutter.

Further, the multilayered printed circuit boards were subjected to the same heat cycle test as that in the example 1 and then those multilayered printed circuit boards were cut by a cutter to observe whether cracking took place in the solder resist layers or not.

As a result, although generation of cracking was slightly observed in the multilayered printed circuit boards obtained in the examples 5, 6, the cracking was not so significant to affect the capabilities of the multilayered printed circuit boards. Also, neither generation of peeling nor any damage and break were observed. Further, in the multilayered printed circuit boards of the examples 7, 8, no cracking was observed at all. Also, neither peeling nor any damage and break of the solder bumps were observed. On the other hand, cracks grown wide were found in the solder resist layers after the reliability test in the multilayered printed circuit boards of the comparative examples 3, 4 and also, damages of solder bumps were observed.

Further, regarding the heat cycle test, slight cracking was observed in the examples 1, 2, however it was not so significant to affect the capability of the multilayered printed circuit boards. No cracking was observed in the multilayered printed circuit boards obtained by the examples 3, 4, whereas cracks grown wide were observed in the multilayered printed circuit boards obtained by the comparative examples 1, 2.

Example 9

A. Preparation of a Resin Filler

A resin filler was prepared in the same manner as example 1.

B. Manufacture of a Multilayered Printed Circuit Board (1) A copper-laminated laminate plate composed of a substrate 1 which was made of a 0.8 mm-thick glass epoxy resin or BT (bismaleimide triazine) resin with a 18 µm-thick copper foil 8 laminated on both sides of the substrate 1 was used as a starting material (reference to FIG. 11 (a)). At first, the copper-laminated laminate plate was subjected to drilling by a drill, plating resist was formed, and then electroless copper plating was carried out for the resultant substrate to form plated-through holes 9 and further the copper foil was pattern-etched by an ordinary method to form the inner layer copper patterns (under-level conductor circuits) 4 in both sides of the substrate.

Figure 11:
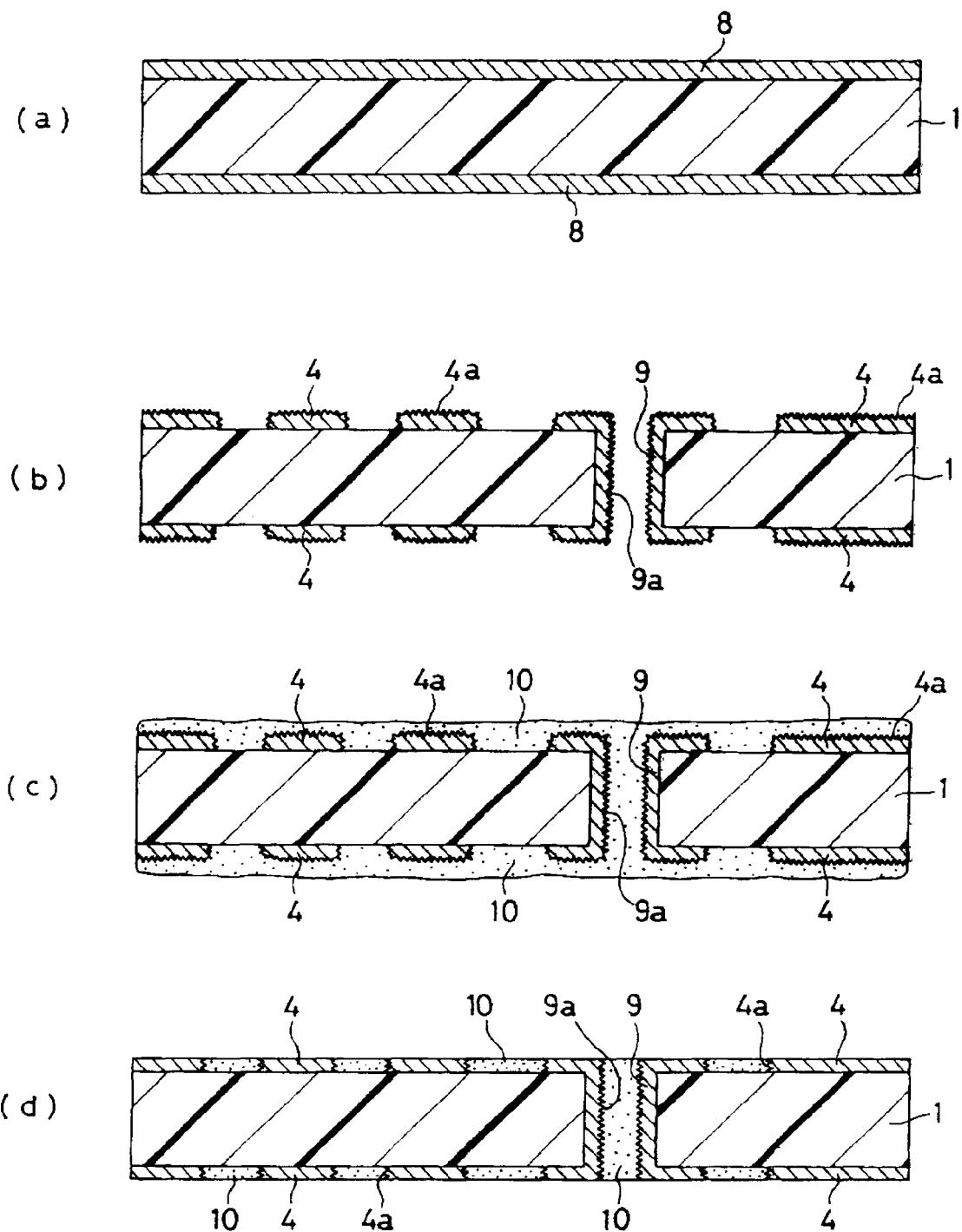
FIGS. 11 (*a*) to (*d*) are cross-section figures showing a part of a manufacturing processes of a multilayered printed circuit board of the present invention.

(2) The substrate on which the under-level conductor circuits 4 were formed was washed with water and dried and then an etching solution was sprayed to both sides of the substrate to etch the surfaces of the under-level conductor circuits and the land surfaces of plated-through holes 9 to form roughened surface 4a, 9a on the entire surfaces of the under-level conductor circuits 4 (reference to FIG. 11 (b)). As the etching solution, used was a solution containing 10 part by weight of imidazole-Cu(II) complex, 7 part by weight of glycoric acid, 5 part by weight of potassium chloride, and 78 part by weight of ion exchanged water.

(3) After the foregoing resin filler was produced, the resin filler 10 was applied within 24 hours after preparation to both sides of the substrate using a printing apparatus to fill the space between the under-level conductor circuits 4 and fill the plated-through holes 9, and then heated and dried. That is, through the step, the space between the under-level conductor circuits 4 and the space in the plated-through holes 9 were filled with the resin filler 10 (reference to FIG. 11 (c)).

(4) The one side of the substrate on which the foregoing treatment (3) was finished was polished by a belt sander polishing using the belt abrasive paper (made by Sankyo Rikagagu Co., Ltd.) to leave no resin filler 10 on the surface of the under-level conductor circuit 4 and the land surface of the plated-through holes 10 and then buffed to eliminate the scars formed by the foregoing belt sander polishing. Such a series of steps were also carried out for the other side of the substrate. After that, heating treatment was carried to completely cure the filled resin filler 10 (reference to FIG. 11 (d)).

In such a manner, the surface layer parts of the resin filler 10 filling the plated-through holes 9 and the like and the roughened layer 4a on the upper surface of the under-level conductor circuits 4 were leveled to obtain an insulating substrate where the resin filler 10 and the side faces of the under-level conductor circuits 4 were firmly stuck to each other through the roughened surfaces 4a, and the inner wall faces of the plated-through holes 9 and the resin filler 10 were firmly stuck to each other by the roughened surfaces 9a.

Figure 12:
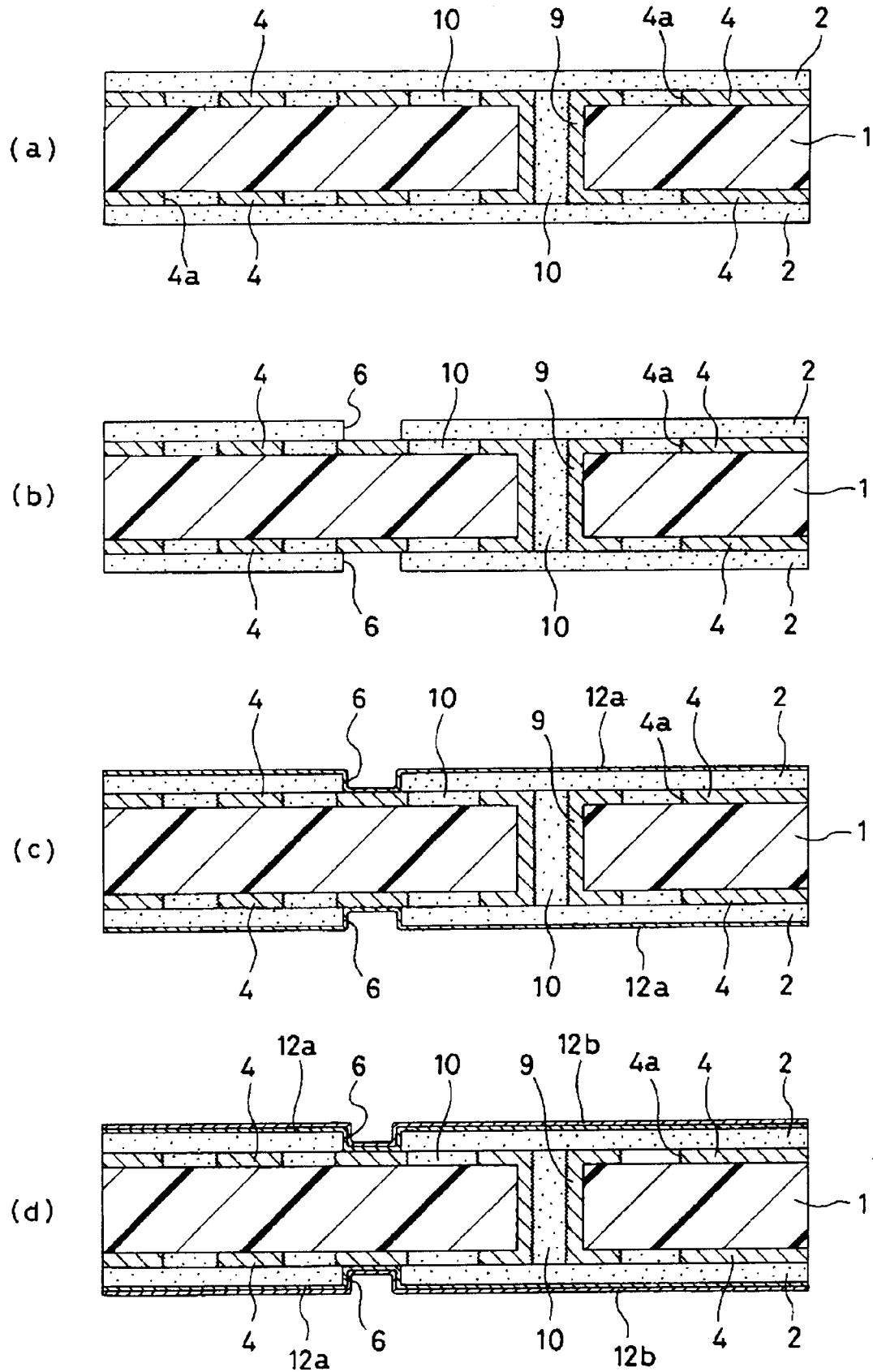
FIGS. 12 (*a*) to (*d*) are cross-section figures showing a part of a manufacturing processes of a multilayered printed circuit board of the present invention.

(5) Next, 50 µm-thick thermosetting type cycloolefin type resin sheets were laminated on both sides of the insulating substrate on which conductor circuits were formed by the foregoing process by vacuum pressure bonding at 0.5 MPa pressure while the temperature being increased up to 50 to 150° C. to form interlaminar resin insulating layers 2 of the cycloolefin type resin (reference to FIG. 12 (a)). The degree of vacuum at the time of the vacuum pressure bonding was 10 mmHg.

(6) Next, opening parts 6 for via-holes with the diameter of 80 µm were formed in the interlaminar resin insulating layers 2 composed of the thermosetting type cycloolefin type resin using excimer laser of 248 nm wavelength. (reference to FIG. 12 (b)). After that, de-smear treatment was carried out using oxygen plasma.

(7) Next, using SV-4540 produced by ULVAC Japan Co., Ltd., sputtering of a Ni target was carried out at 80° C., 0.6 Pa gas pressure, and at the power of 200 W for 5 minutes to form Ni metal layers 12a on the surfaces of the interlaminar resin insulating layers 2 (reference to FIG. 12 (c)). In this case, the thickness of the formed Ni metal layers 12a was 0.1 µm.

(8) Next, the substrate was immersed in an electroless copper plating solution with the following composition to form electroless copper plating films 12b of 0.6 to 1.2 µm in thickness on the entire roughened surface of the Ni metal layers 12a (reference to FIG. 12 (d)).

[Electroless Plating Solution]

| EDTA | 0.08 mol/l |
|---|---|
| copper sulfate | 0.03 mol/l |
| HCHO | 0.05 mol/l |
| NaOH | 0.05 mol/l |
| α,α'-bipyridyl | 80 mg/l |
| PEG (polyethylene glycol) | 0.10 g/l |

[Electroless Plating Condition]
For 20 minutes at 65° C. of solution temperature.

Figure 13:
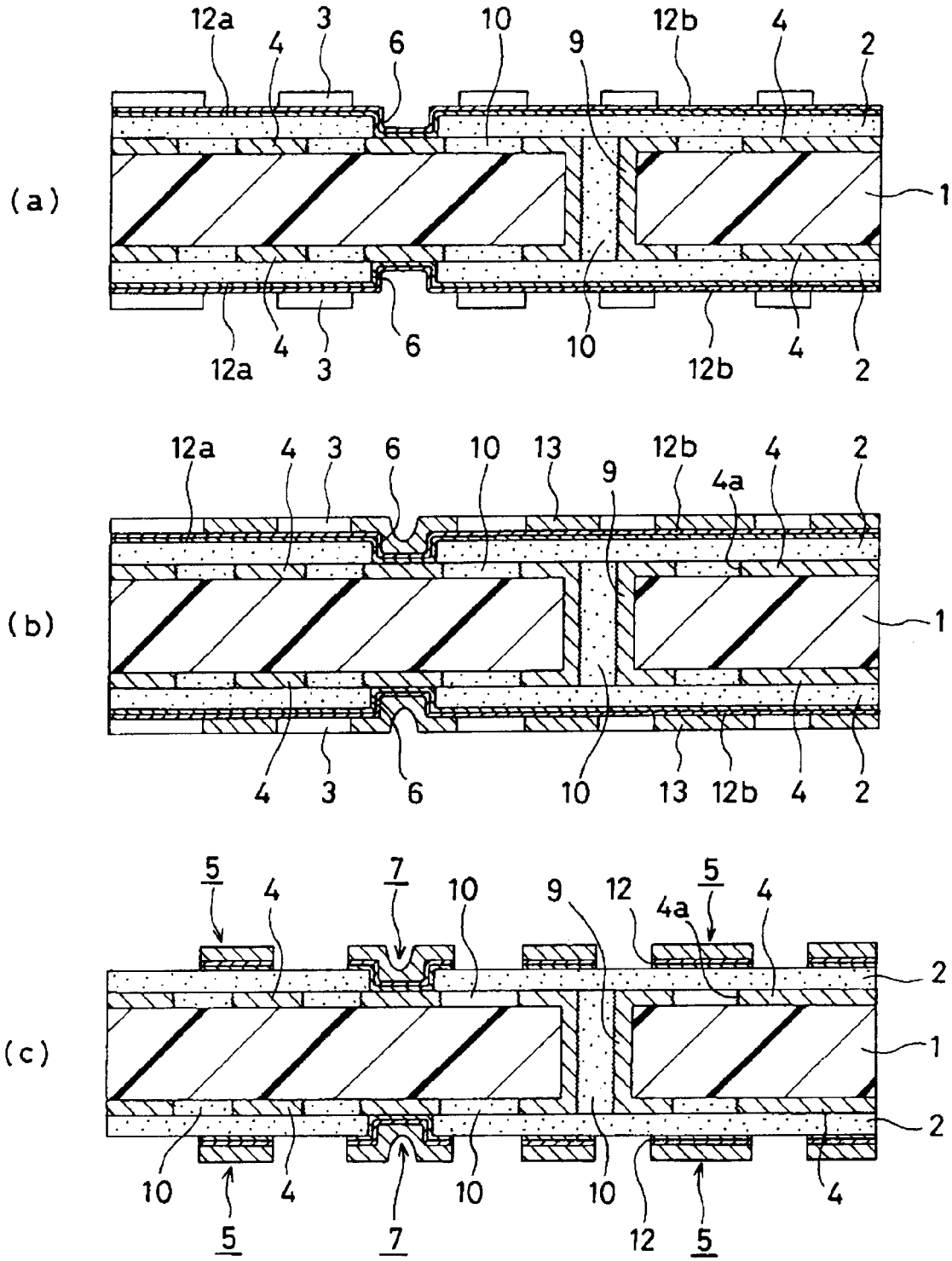
FIGS. 13 (*a*) to (*c*) are cross-section figures showing a part of a manufacturing processes of a multilayered printed circuit board of the present invention.

(9) To both sides of the substrate, photosensitive dry films were stuck to the electroless copper plating films 12 by thermal pressure bonding and photomasks were mounted thereon, and exposure was carried out at 100 mJ/cm$^2$ and development treatment with an aqueous 0.8% sodium carbonate solution was carried out to form a 15 µm-thick plating resist 3 pattern (reference to FIG. 13 (a)).

(10) Next, electroplating was carried out in the following conditions to form 15 µm-thick electrolytic copper plating films 13 (reference to FIG. 13 (b)). Incidentally, by the electroplating films 13, the parts to be conductor circuits 5 in the process described later were thickened, and the parts to be via-holes 7 were filled with plating. In addition, the additive used in the electrolytic plating solution was Cupracid HL by Atotech Japan CO.

[Electroplating Solution]

| sulfuric acid | 2.24 mol/l |
|---|---|
| copper sulfate | 0.26 mol/l | an additive (Cupracid HL; by Atotech Japan CO.) 19.5 mol/l

[Electroless Plating Condition]

| | |
|---|---|
| current density | 1 A/dm$^2$ |
| duration | 65 minutes |
| temperature | 22 ± 2° C. |

(11) After the plating resist 3 was separated and removed with an aqueous 5% KOH solution, the electroless plating films used to be under the plating resist 3 were dissolved and removed by etching with a mixed solution of sulfuric acid and hydrogen peroxide to form independent upper layer conductor circuits 5 (including the via-holes 7) (reference to FIG. 13 (c)).

Figure 14:
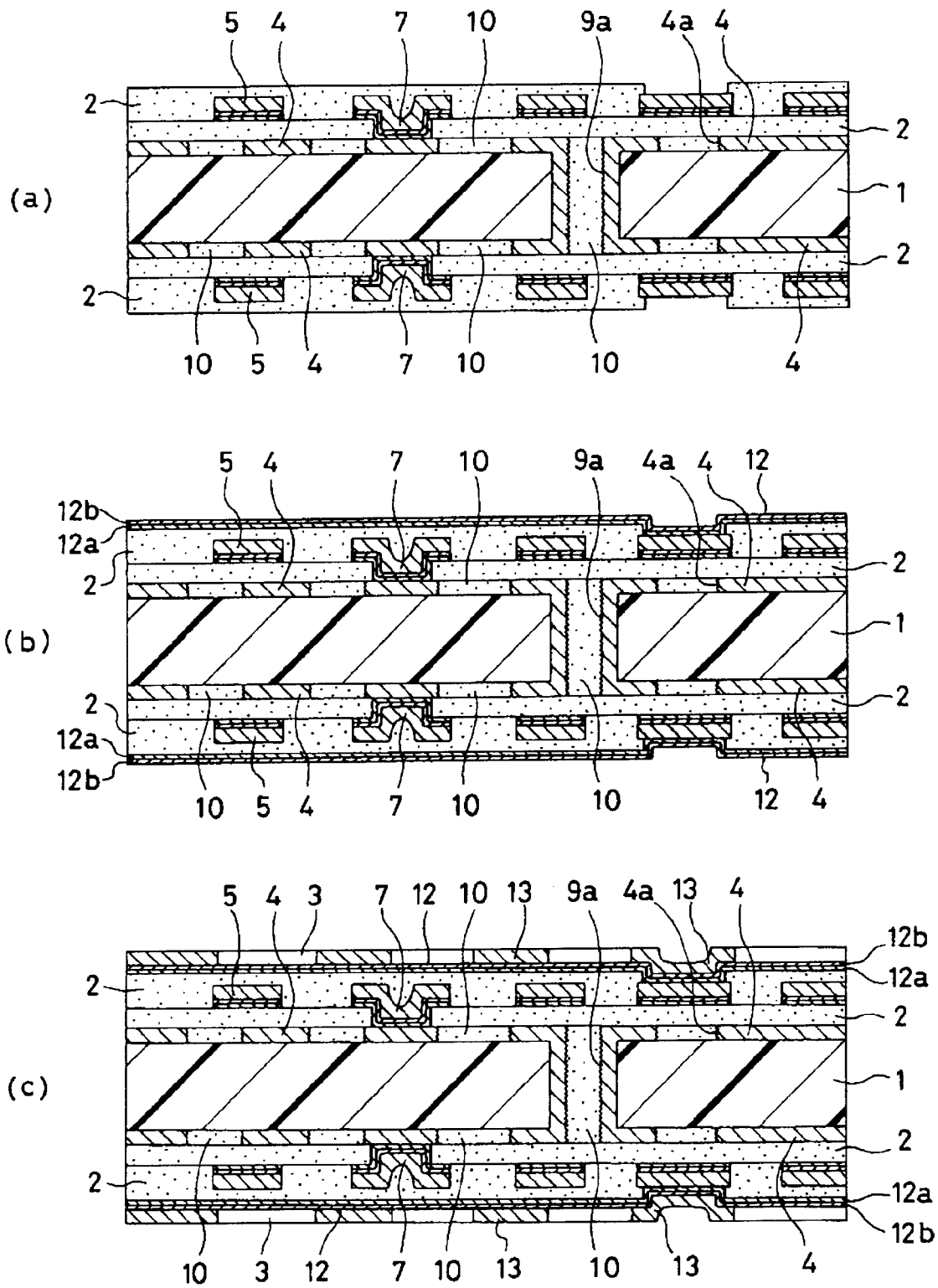
FIGS. 14 (*a*) to (*c*) are cross-section figures showing a part of a manufacturing processes of a multilayered printed circuit board of the present invention.
Figure 15:
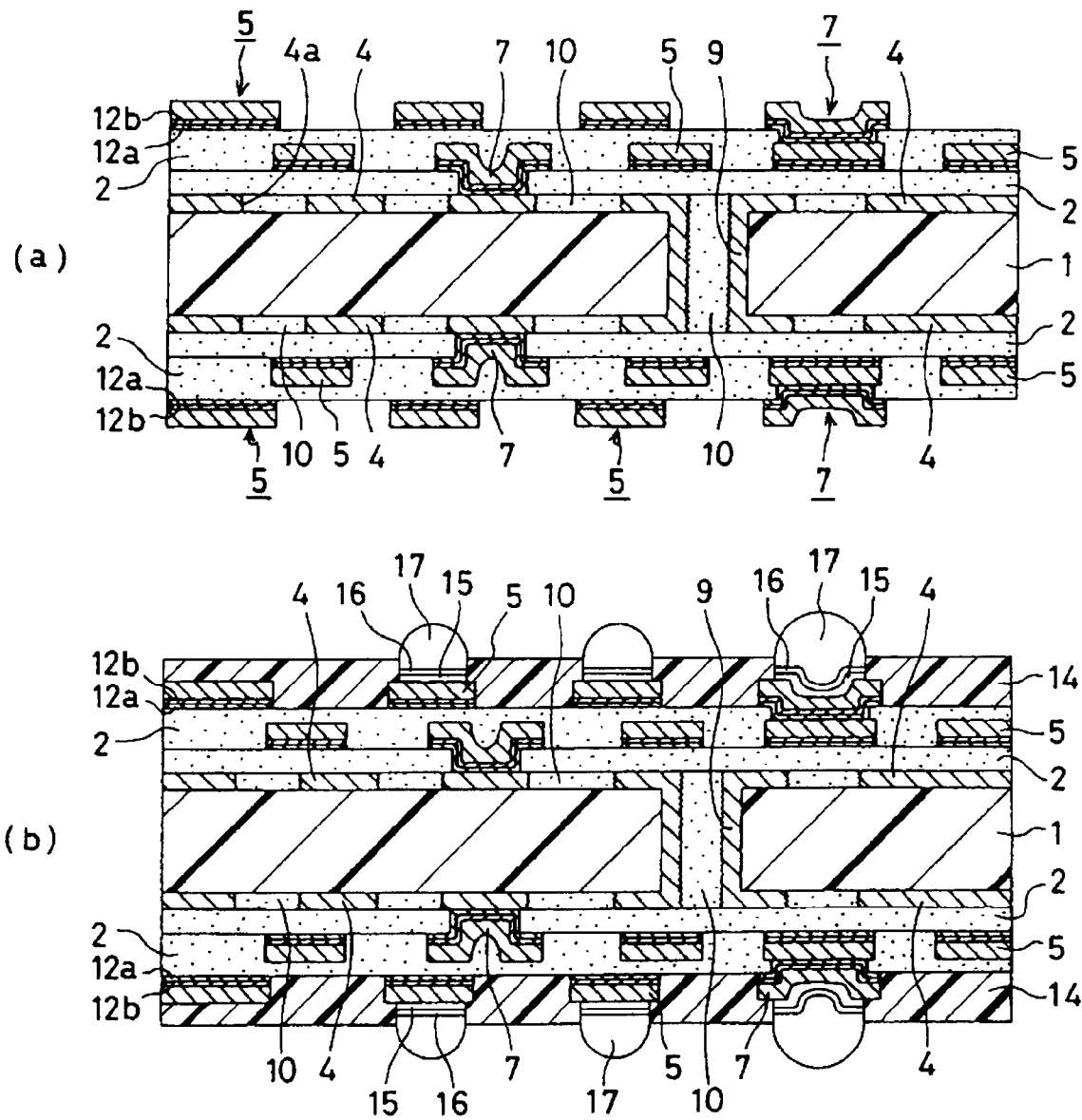
FIGS. 15 (*a*) and (*b*) are cross-section figures showing a part of a manufacturing processes of a multilayered printed circuit board of the present invention.

(12) Successively, the foregoing steps (5) to (11) were repeated to form further upper layer conductor circuits (reference to FIG. 14 (a) to FIG. 15 (a)).

(13) Next, 20 μm-thick thermosetting type polyolefin type resin sheets (made by Sumitomo 3M Ltd.; trade name: 1592) were laminated on both sides of the multilayered circuit substrate on which upper layer conductor circuits were formed by vacuum pressure bonding at 0.5 MPa pressure while the temperature being increased up to 50 to 150° C. to form solder resist layers 14 of the polyolefin type resin. The degree of vacuum at the time of the vacuum pressure bonding was 10 mmHg.

(14) Next, opening parts with the diameter of 200 μm were formed in the solder resist layers 14 composed of the thermosetting type polyolefin type resin using excimer laser of 248 nm wavelength. After that, de-smear treatment was carried out using oxygen plasma to form solder resist layers (an organic resin insulating layers) 14 with 20 μm thickness having opening parts in the solder pad parts.

(15) Next, the substrate in which the solder resist layers (an organic resin insulating layers) 14 were formed was immersed in an electroless nickel plating solution at pH 4.5 containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form 5 μm-thick nickel plating layers 15 in the opening parts. Further, the resultant substrate was immersed in an electroless plating solution containing potassium cyanoaurate ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) at 80° C. for 7.5 minutes to form 0.03 m-thick gold plating layers 16 on the nickel plating layers 15.

(16) After that, a solder paste was printed on the opening parts of the solder resist layers 14 and reflow of the paste was carried out at 200° C. to form solder bumps (solder body) 17 and to manufacture a multilayered printed circuit board having the solder bumps 17 (reference to FIG. 15 (b)).

(17) Using some other part of the multilayered printed circuit board, an IC chip bonding was carried out. That is, after washing with fluxes, using a prescribed installation apparatus, positioning of the solder bumps of the multilayered printed circuit board with bumps formed in the IC chips was carried out using target marks as standard and re-flow of the solder was carried out to join the solder bumps of the multilayered printed circuit board with the bumps of the IC chips. Then, washing with fluxes was carried out and the gaps between the IC chips and the multilayered printed circuit board was filled with under-fill to consequently obtain a multilayered printed circuit board connected with IC chips, that is, a semiconductor device.

Example 10

A multilayered printed circuit board was manufactured in the same manner as the example 9 except that, in the process (13) of example 9, a 20 μm-thick thermosetting type cycloolefin type resin sheet was used in place of the thermosetting type polyolefin type resin sheet to form the solder resist layers comprising the thermosetting type cycloolefin type resin and then a semiconductor device was obtained by connecting IC chips to the obtained multilayered printed circuit board.

Example 11

A. Resin Compositions for Roughened-Surface Formation for an Upper Layer and an Under Layer and a Resin Filler were Prepared in the Same Manner as Example 1

B. Method for Manufacturing a Multilayered Printed Circuit Board (1) A copper-laminated laminate plate composed of a substrate which was made of a 0.8 mm-thick glass epoxy resin or BT (bismaleimide triazine) resin with a 18 μm-thick copper foil 8 laminated on both sides of the substrate 1 was used as a starting material (reference to FIG. 16 (a)). At first, the copper-laminated laminate plate was subjected to drilling by a drill and then electroless plating and pattern-etching to form the under-level conductor circuits 4 and plated-through holes 9 on both sides of the substrate 1.

Figure 16:
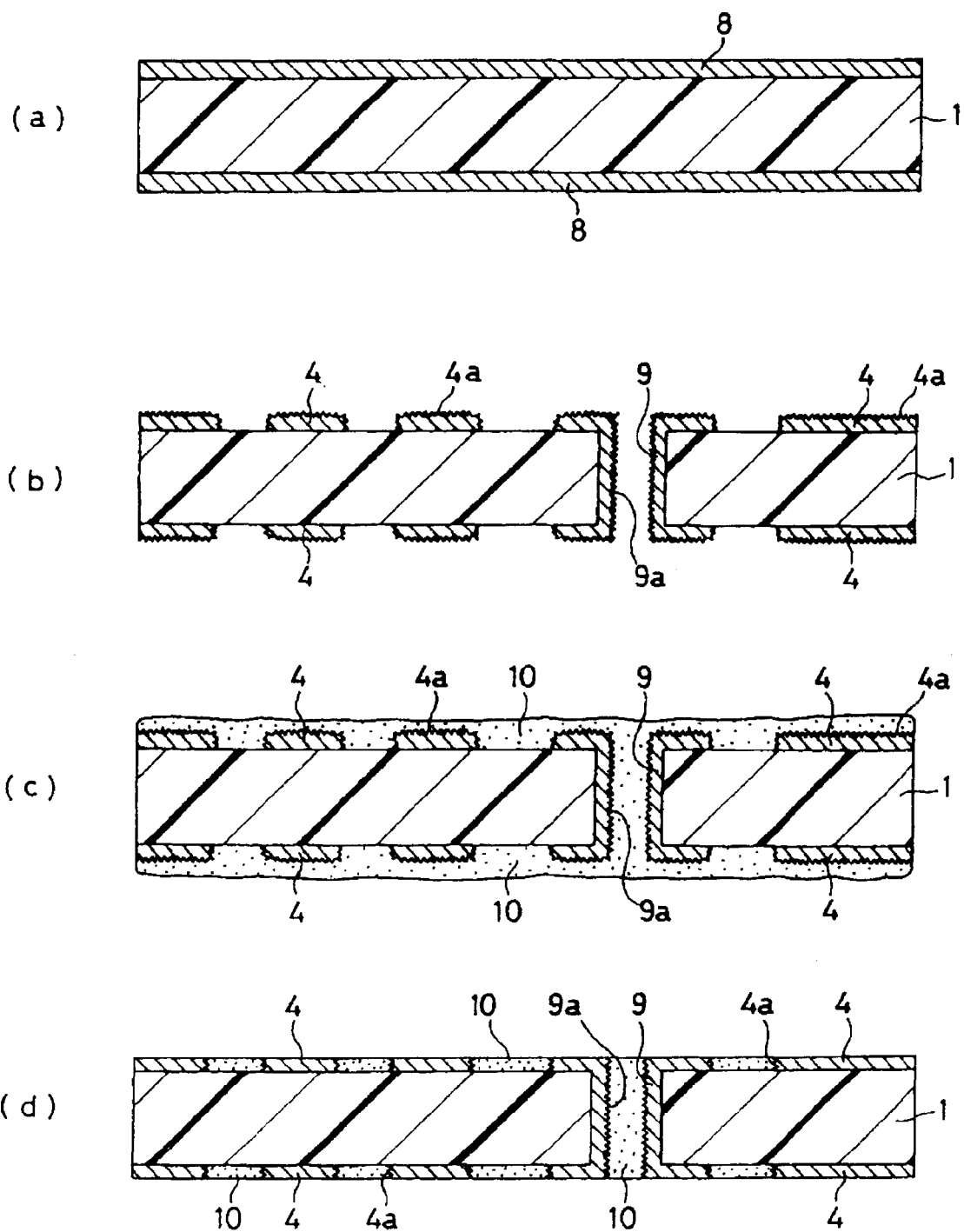
FIGS. 16 (*a*) to (*d*) are cross-section figures showing a part of a manufacturing processes of a multilayered printed circuit board of the present invention.

(2) The substrate on which the plated-through holes 9 and the under-level conductor circuits 4 were formed was washed with water and dried and then subjected to blackening treatment in a blackening bath (an oxidizing bath) of an aqueous solution containing NaOH (10 g/l), NaClO$_2$ (40 g/l), and Na$_3$PO$_4$ (6 g/l) and reducing treatment in a reducing bath containing an aqueous solution containing NaOH (10 μl) and NaBH$_4$ (6 g/l) to form roughened surfaces 4a, 9a on the entire surfaces of the under-level conductor circuits 4 including the plated-through holes 9 (reference to FIG. 16 (b)).

(3) After the foregoing resin filler was produced, the resin filler 10 was applied to both sides of the substrate by a printing apparatus to fill the space between the under-level conductor circuits 4 and to fill the plated-through holes 9 within 24 hours after preparation of the resin filler and then heated and dried. That is, by the process, the space between the under-level conductor circuits 4 and the plated-through holes 9 were filled with the resin filler 10 (reference to FIG. 16 (c)).

(4) The one side of the substrate for which the foregoing step (3) was finished was polished by a belt sander polishing using the belt abrasive paper #600 (made by Sankyo Rikagagu Co., Ltd.) as to leave no resin filler 10 on the surface of the inner layer copper pattern 4 and on the land surfaces of the plated-through holes 9 and then buffed to eliminate the scars formed by the foregoing belt sander polishing. Such series of steps were also carried out for the other side of the substrate.

After that, heating treatment was carried out at 100° C. for 1 hour, at 120° C. for 3 hours, at 150° C. for 1 hour, and 180° C. for 7 hours to cure the resin filler 10.

In such a manner the surface layer parts of the resin filler 10 formed in the plated-through holes 9 and in the non-conductor circuit formed area and the surfaces the under-level conductor circuits 4 were leveled to obtain an insulating substrate (reference to FIG. 16 (d)) where the resin filler 10 and the side faces 4a of the under-level conductor circuits 4 were firmly stuck to each other through the roughened surfaces, and the inner wall faces 9a of the plated-through holes 9 and the resin filler 10 were firmly stuck to each other by the roughened surface.

Figure 17:
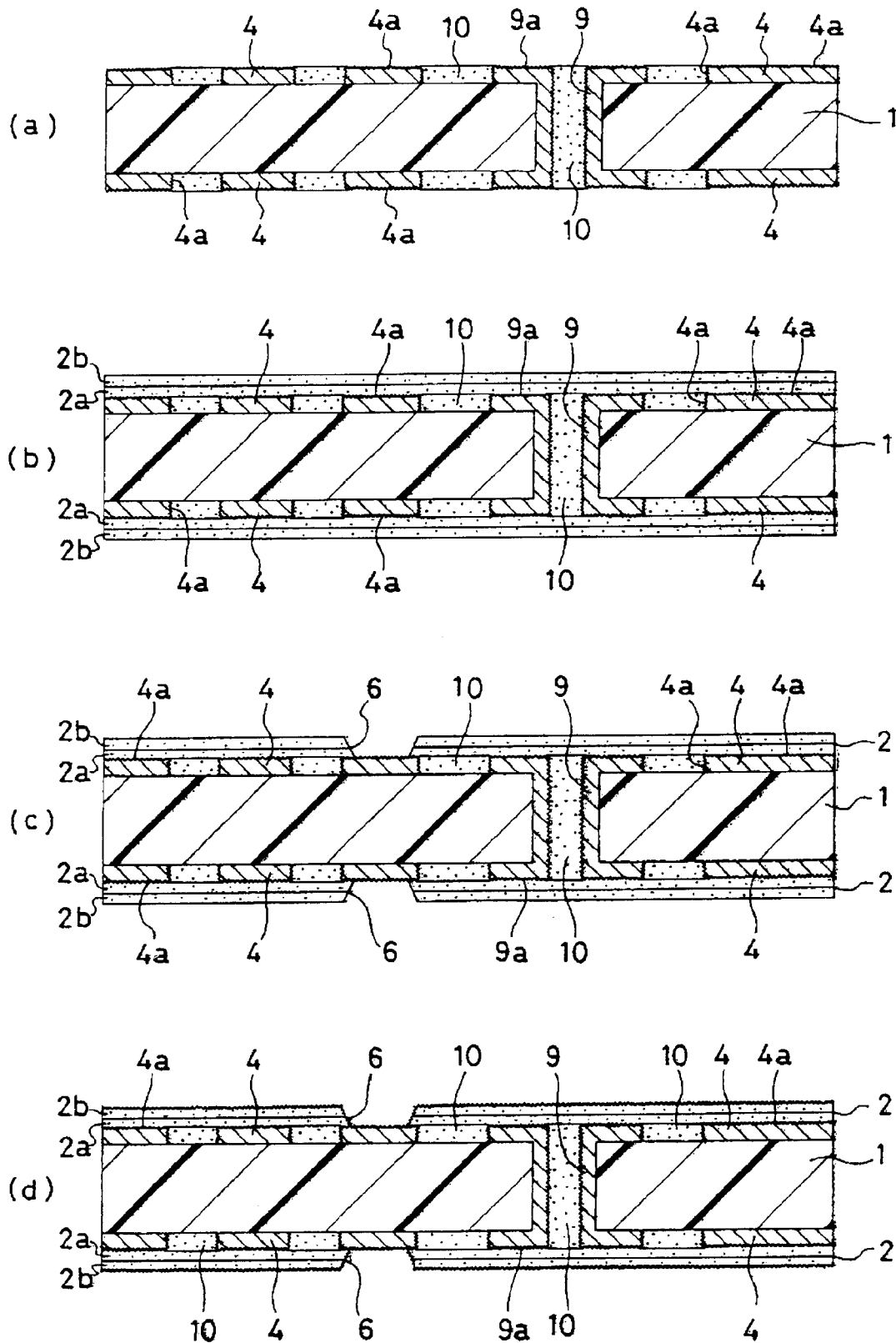
FIGS. 17 (*a*) to (*d*) are cross-section figures showing a part of a manufacturing processes of a multilayered printed circuit board of the present invention.

(5) Next, the foregoing substrate was washed with water, degreased by an acid, and then soft-etched and after that an etching solution was sprayed to both sides of the substrate to etch the surfaces of the under-level conductor circuits 4 and land surfaces and the inner walls of the plated-through holes 9 to form the roughened surfaces 4a, 9a on the entire surfaces of the under-level conductor circuits 4 (reference to FIG. 17 (a)). The etching solution used was an etching solution (Meck etch bond; made by Meck Co.) containing 10 part by weight of imidazole-Cu(II) complex, 7 part by weight of glycoric acid, and 5 part by weight of potassium chloride.

(6) The resin composition (viscosity 1.5 Pa·s) for roughened-surface formation for an under layer was applied to both sides of the substrate by a roll coater within 24 hours after production of the composition and after being kept still horizontally for 20 minutes, drying was carried out at 60° C. for 30 minutes. After that, the resin composition (viscosity 7 Pa·s) for roughened-surface formation for an upper layer was applied to the substrate by a roll coater within 24 hours after production of the composition and after being kept still horizontally for 20 minutes, drying was carried out at 60° C. for 30 minutes to form 35 μm-thick layers 2a, 2b of the resin compositions for roughened-surface formation (reference to FIG. 17 (b)).

(7) Photomasks drawing black circles of 85 μm in diameter of a light shielding ink were closely stuck to both sides of the substrate on which the layers 2a, 2b of the resin compositions for the roughened-surface formation were formed as described in the foregoing step (6). Then, the substrate was exposed to light in 3000 mJ/cm² intensity of an ultra high pressure mercury lamp and then subjected to heating treatment at 100° C. for 1 hour, at 120° C. for 1 hour, and at 150° C. for 3 hours to form 35 μm-thick interlaminar resin insulating layers 2 having opening parts 6 for via-holes of diameter of 85 μm with excellent size precision corresponding to the photomask films (reference to FIG. 17 (c)). Incidentally, the tin plating layers were partly exposed in the opening parts to be via-holes.

(8) The substrate in the which opening parts 6 for via-holes were formed was immersed in an aqueous containing chromic acid for 19 minutes to dissolve and remove the epoxy resin particles existing on the surfaces of the interlaminar resin insulating layers 2 and roughen the surfaces of the interlaminar resin insulating layers 2 to obtain the roughened surfaces (depth of 6 μm). After that, the resultant substrate was immersed in a neutralization solution (made by Shiplay Co., Inc.) and washed with water (reference to FIG. 17 (d)).

Further, a palladium catalyst (Atotech Japan CO.) was supplied on the surface of the substrate subjected to the surface roughening treatment to stick catalyst cores to the surfaces of the interlaminar resin insulating layers 2 and the inner wall faces of the opening parts 6 for via-holes.

Figure 18:
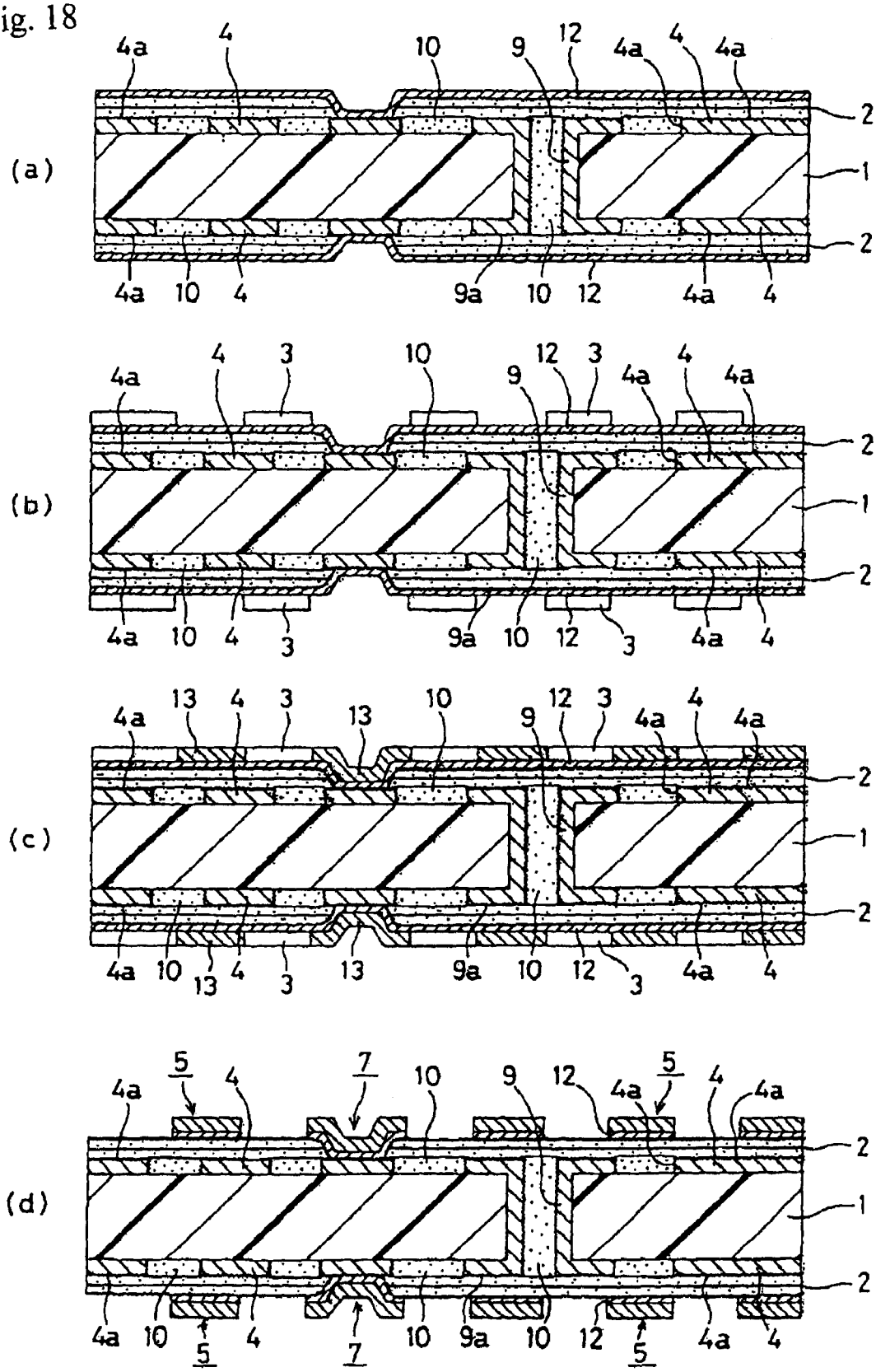
FIGS. 18 (*a*) to (*d*) are cross-section figures showing a part of a manufacturing processes of a multilayered printed circuit board of the present invention.

(9) Next, the substrate was immersed in an electroless copper plating solution with the following composition to form electroless copper plating films 12 of 0.6 to 1.2 μm thickness on the entire roughened surface (reference to FIG. 18 (a)).
[Electroless Plating Solution]

| | |
|---|---|
| NiSO$_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 40 mg/l |
| PEG (polyethylene glycol) | 0.10 g/l |

[Electroless Plating Condition]
For 40 minutes at 35° C. of solution temperature.

(10) A photosensitive dry film sold in the market was stuck by thermal pressure bonding to the electroless copper plating films 12 and a mask was mounted thereon and exposure was carried out at 100 mJ/cm² and development treatment with an aqueous 0.8% sodium carbonate solution was carried out to form 15 μm-thick plating resist 3 (reference to FIG. 18 (b)).

(11) Next, electrolytic copper plating was carried out in the following conditions to form 15 μm-thick electrolytic copper plating films 13 (reference to FIG. 18 (c)).
[Electroplating Solution]

| | |
|---|---|
| sulfuric acid | 2.24 mol/l |
| copper sulfate | 0.26 mol/l | an additive (Cupracid HL; by Atotech Japan CO.) 19.5 mol/l
[Electroless Plating Condition]

| | |
|---|---|
| current density | 1 A/dm² |
| duration | 65 minutes |
| temperature | 22 ± 2° C. |

(12) After the plating resist 3 was separated and removed with an aqueous 5% KOH solution, the electroless plating films 12 used to be under the plating resist 3 was dissolved and removed by etching with a mixed solution of sulfuric acid and hydrogen peroxide to form independent conductor circuits 5 (including via-holes 7) comprising the electroless copper plating films 12 and the electrolytic copper plating films 13 (reference to FIG. 18 (d)).

Figure 20:
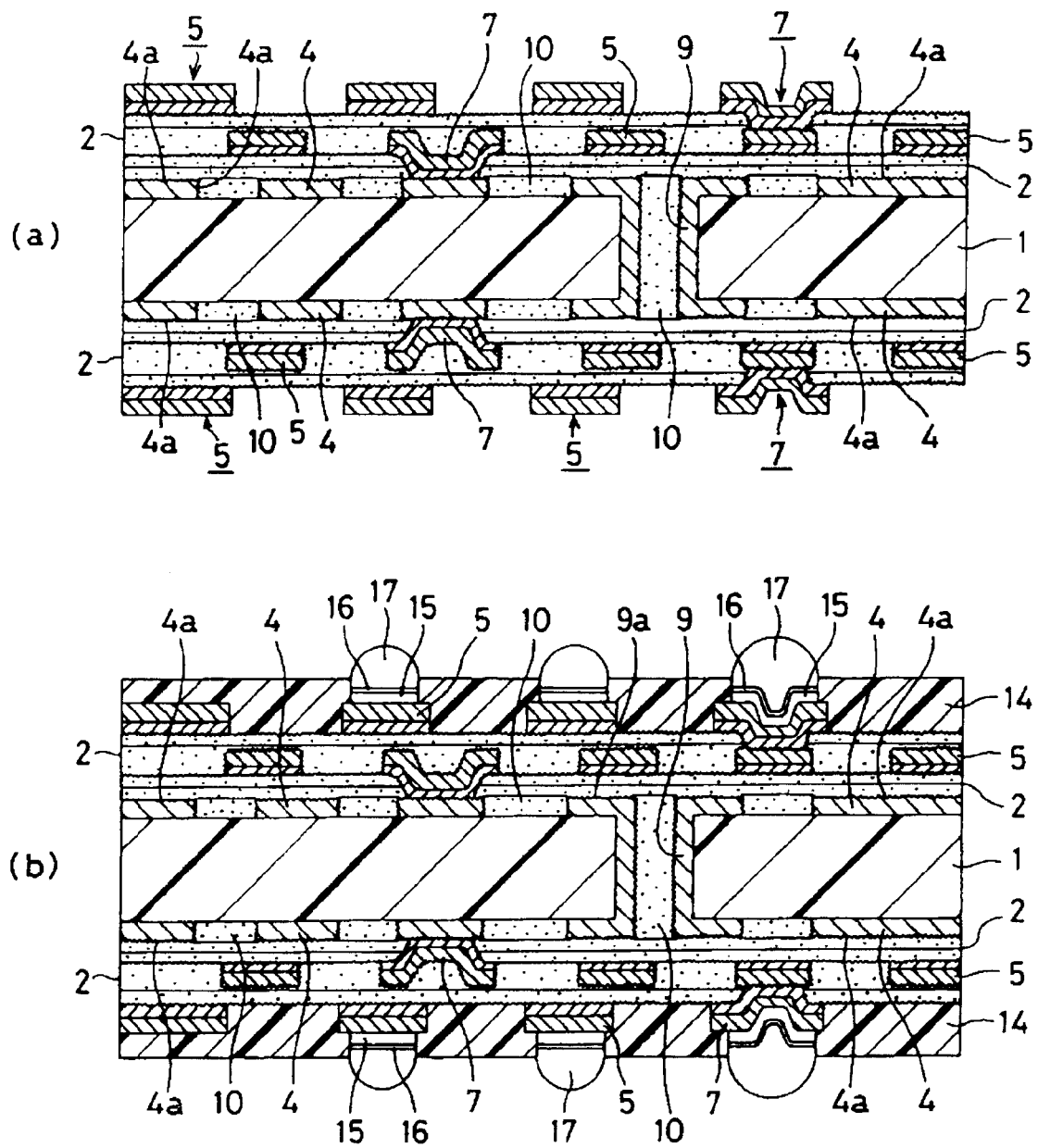
FIGS. 20 (*a*) and (*b*) are cross-section figures showing a part of a manufacturing processes of a multilayered printed circuit board of the present invention.
Figure 2:
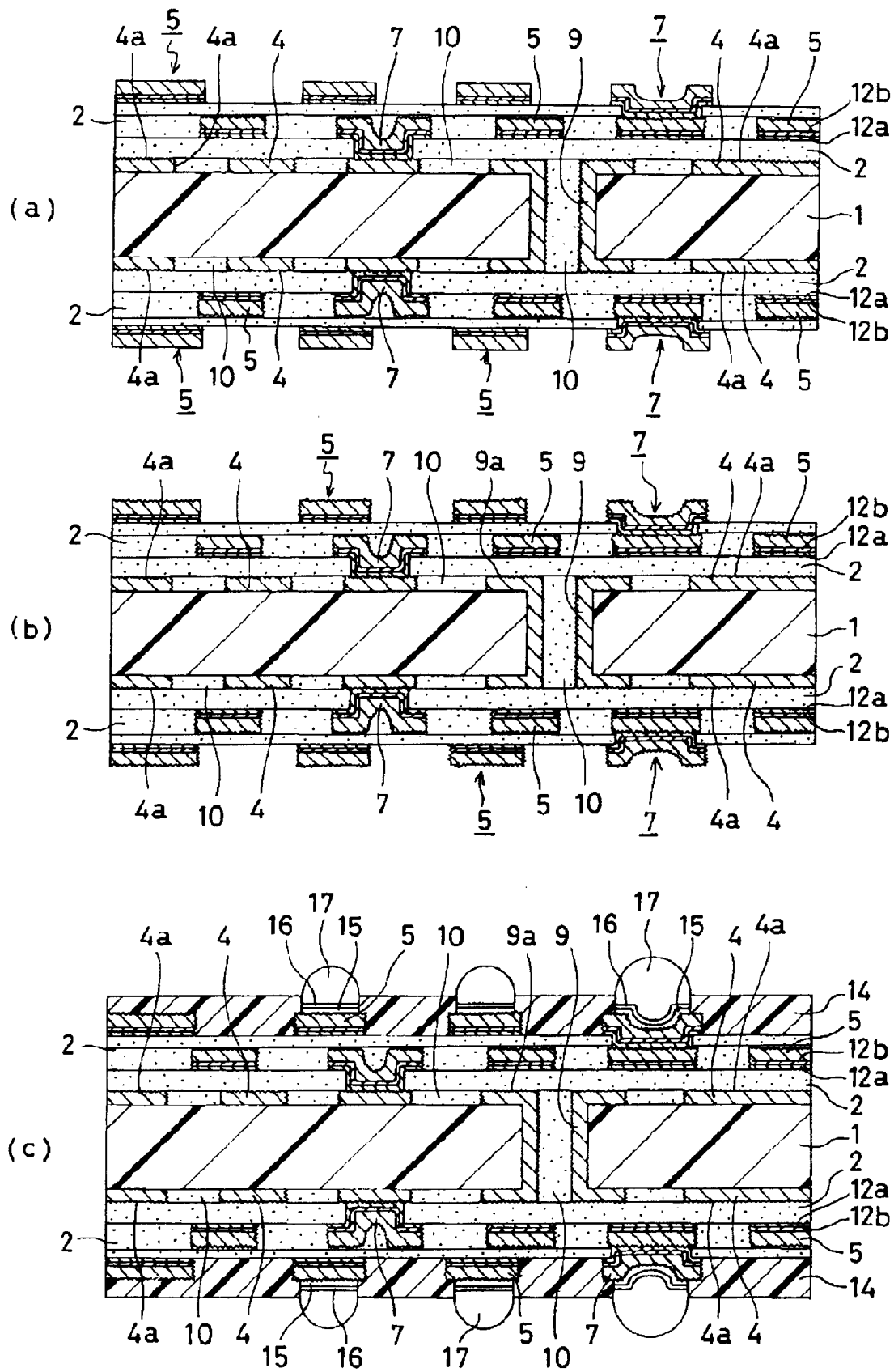
Figure 2:
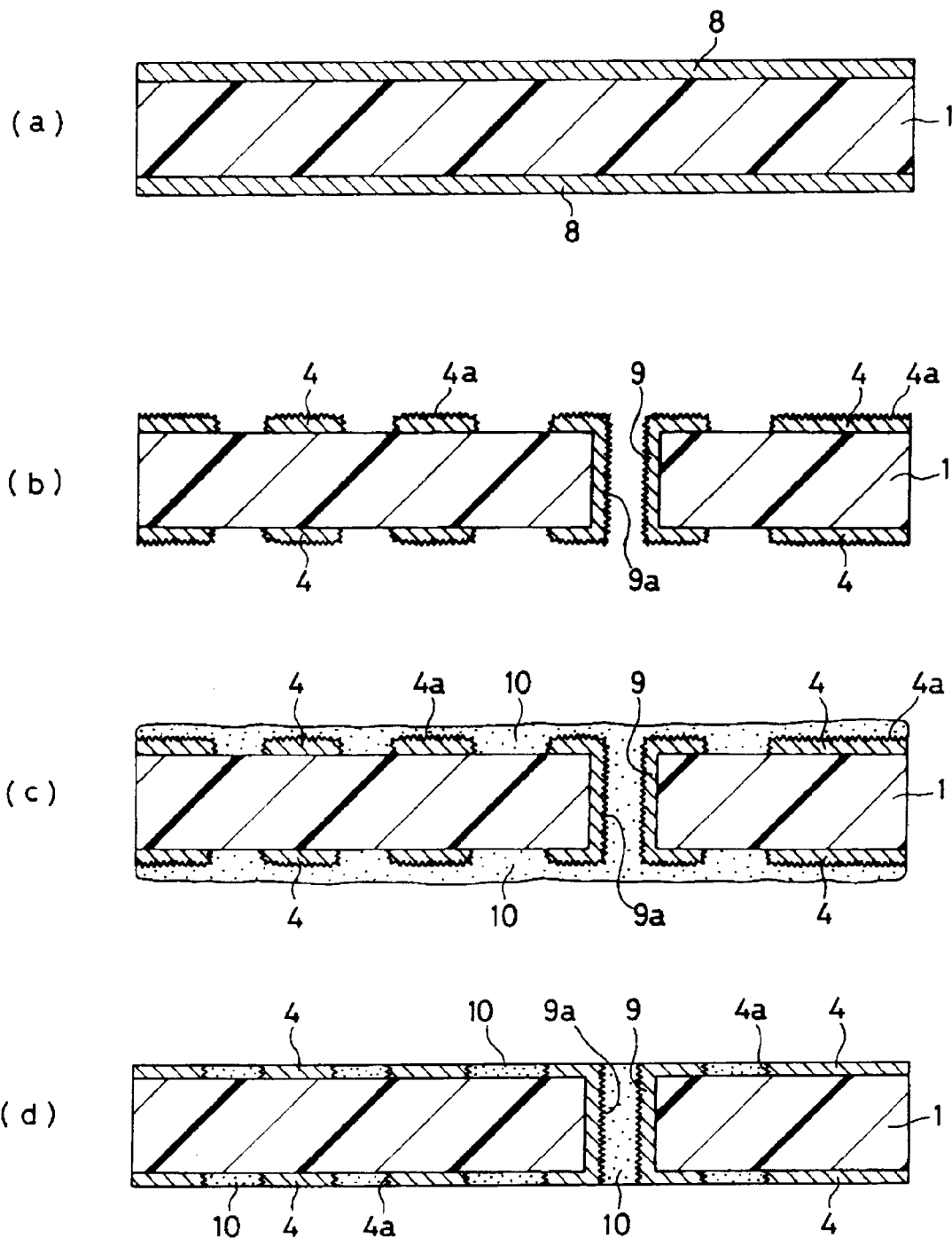

(13) Successively the foregoing steps (5) to (12) were repeated to form further upper interlaminar resin insulating layers and conductor circuits and obtain a multilayered printed circuit board (reference to FIG. 19 (a) to FIG. 20 (a)).

(14) Next, solder resist layers comprising a thermosetting type cycloolefin resin were formed on both sides of the multilayered circuit substrate, in which the upper layer conductor circuits were formed, in the same manner as the example 2 and then the same steps (14) to (16) of the example 9 were carried out to manufacture a multilayered printed circuit board and to obtain a multilayered printed circuit board (a semiconductor device) connected with IC chips using the manufactured multilayered printed circuit board.

Comparative Example 5

(1) A multilayered circuit board was obtained in the same manner as the steps (1) to (13) of the example 11 (reference to FIG. 21 (a)).

(2) Then, roughened surfaces were formed on the surfaces of the conductor circuits 5 (including via-holes 7) by etching the surfaces of the conductor circuits 5 (including via-holes 7) using Meck etch bond produced by Meck Co. (reference to FIG. 21 (b)).

(3) Next, a solder resist resin composition (an organic resin insulating material) with the viscosity of 2.0 Pa·s at 25° C. was obtained by blending 46.67 parts by weight of photosensitivity-provided oligomer (molecular weight: 4000) which was a cresol novolak type epoxy resin (made by Nippon Kayaku Co., Ltd.) whose 50% of epoxy group was acrylated and which was dissolved to be 60 wt. % concentration in diethylene glycol methyl ether (DMDG), 15 parts by weight of a bisphenol A type epoxy resin (made by Yuka Shell Epoxy Co.: Epikote 1001) dissolved in at 80 wt. % concentration in methyl ethyl ketone, 1.6 parts by weight of an imidazole curing agent (made by Shikoku Chemicals Corp.: 2E4MZ-CN), 3 parts by weight of a polyfunctional acrylic monomer, which is a photosensitive monomer (made by Nippon Kayaku Co., Ltd.: R 604), 1.5 parts by weight of also a polyvalent acrylic monomer (made by Kyoei Chemical Co., Ltd.: DPE 6A), and 0.71 parts by weight of a dispersion type defoaming agent (made by San Nopco Ltd.: S-65) in a container and mixing and stirring the obtained mixture and further adding 2.0 parts by weight of benzophenone (made by Kanto Chemical Co., Inc.) as a photopolymerization initiator to the obtained mixture composition and 0.2 parts by weight of Michler's ketone (made by Kanto Chemical Co., Inc.) as a photosensitizer.

Incidentally, the viscosity measurement was carried out by a B-type viscometer (DVL-B type; by Tokyo Instruments Co. Ltd.), using a rotor No. 4 for 60 rpm and a rotor No. 3 for 6 rpm.

(4) Next, the foregoing solder resist composition was applied in 20 μm thickness on both sides of the multilayer circuit substrate and dried at 70° C. for 20 minutes and 70° C. for 30 minutes and after that, a 5 mm-thick photomask drawing a pattern corresponding to the opening parts of the solder resist was closely stuck to the solder resist layers. Exposure by ultraviolet rays of 1000 mJ/cm$^2$ and development treatment by the DMTG solution were successively carried out to form opening parts with 200 μm diameter.

Further, the resultant solder resist layer was cured by heating in conditions: at 80° C. for 1 hour, at 100° C. for 1 hour, at 120° C. for 1 hour, and at 150° C. for 3 hours to form a solder resist layer 14 (an insulating organic resin layer) with the thickness of 20 μm and having openings corresponding to parts for solder pads.

(5) Next, the substrate formed with the solder resist layer (an insulating organic resin layer) 14 was immersed for 20 minutes in an electroless nickel plating solution at pH 4.5 containing nickel chloride ($2.3 \times 10^{-1}$ mol/L), sodium hypophosphite ($2.8 \times 10^{-1}$ mol/L), and sodium citrate ($1.6 \times 10^{-1}$ mol/L) to form a nickel plating layer 15 with the thickness of 5 μm in the opening part. Further, the resultant substrate was immersed for 7.5 minutes at 80° C. in an electroless plating solution containing potassium cyanoaurate ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/L) to form a gold plating layer 16 on the nickel plating layer 15 with the thickness of 0.03 μm.

(6) After that, a solder paste was printed in the openings of the solder resist layer 14 and subjected to reflowing at 200° C. to form solder bumps (solder body) 17 and to manufacture a multilayer printed circuit board having solder bumps 17 (reference to FIG. 21 (c)).

After that, using the obtained multilayered printed circuit board, a semiconductor device was obtained.

Regarding the multilayered printed circuit boards obtained by the examples 9 to 11 and the comparative example 5, the dielectric constants and the dielectric loss tangents were measured and further whether signals delay and signal errors took place or not were tested for the manufactured semiconductor devices. The results were shown in the following Table 1.

TABLE 1

| | dielectric constant ($\epsilon$) | dielectric loss tangent ($\tan \delta$) | signal delay | signal error |
|---|---|---|---|---|
| example 9 | 2.9 | 0.01 | not generated | not generated |
| example 10 | 2.7 | 0.004 | not generated | not generated |
| example 11 | 2.8 | 0.005 | not generated | not generated |
| comparative example 5 | 3.8 | 0.02 | generated | generated |

As being made clear according to the results in the foregoing Table 1, the dielectric constants and the dielectric loss tangents of the entire bodies of the multilayered printed circuit boards were low in case of the multilayered printed circuit boards of the example 9 to 11 and signal delay and signal errors did not at all take place in the semiconductor devices using these multilayered printed circuit boards, whereas signal delay and signal errors took place in the semiconductor device using the multilayered printed circuit board of the comparative example 5.

Example 12

A. Preparation of a Resin Filler

A resin filler was prepared in the same manner as example 1.

B. Manufacture of a Multilayered Printed Circuit Board (1) A copper-laminated laminate plate composed of a substrate 1 which was made of a 0.8 mm-thick glass epoxy resin or BT (bismaleimide triazine) resin with a 18 μm-thick copper foil 8 laminated on both sides of the substrate 1 was used as a starting material (reference to FIG. 22 (a)). At first, the copper-laminated laminate plate was subjected to drilling by a drill, plating resist was formed, and then electroless copper plating was carried out for the resultant substrate to form plated-through holes 9 and further the copper foil was pattern-etched by a conventional method to form the inner layer copper patterns (under-level conductor circuits) 4 on both sides of the substrate.

(2) The substrate on which the under-level conductor circuits 4 were formed was washed with water and dried and then an etching solution was sprayed to both sides of the substrate to etch the surfaces of the under-level conductor circuits and the land surfaces and the inner walls of plated-through holes 9 to form roughened surfaces 4a, 9a in the entire surfaces of the under-level conductor circuits 4 (reference to FIG. 22 (b)). As the etching solution, used was a solution containing 10 part by weight of imidazole-Cu(II) complex, 7 part by weight of glycoric acid, 5 part by weight of potassium chloride, and 78 part by weight of ion exchanged water.

(3) After the foregoing resin filler was produced, the resin filler 10 was applied within 24 hours after preparation to both sides of the substrate using a printing apparatus to fill the space between the under-level conductor circuits 4 and the plated-through holes 9, and then heated and dried. That is, through the step, the space between the under-level conductor circuits 4 and the plated-through holes 9 were filled with the resin filler 10 (reference to FIG. 22 (c)).

(4) One side of the substrate on which the foregoing treatment (3) was finished was polished by a belt sander polishing using the belt abrasive paper (made by Sankyo Rikagagu Co., Ltd.) to leave no resin filler 9 on the surface of the under-level conductor circuit 4 and the land surface of the plated-through holes 10 and then buffed to eliminate the scars formed by the foregoing belt sander polishing. Such a series of steps were also carried out for the other side of the substrate. After that heating treatment was carried to completely cure the filled resin filler 10 (reference to FIG. 22 (d)).

In such a manner the surface layer parts of the resin filler 10 filling the plated-through holes 9 and the like and the roughened layer 4a of the under-level conductor circuits 4 were leveled to obtain a circuit substrate where the resin filler 10 and the side faces of the under-level conductor circuits 4 were firmly stuck to each other through the roughened surfaces 4a, and the inner wall faces of the plated-through holes 9 and the resin filler 10 were firmly stuck to each other by the roughened surfaces 9a.

Figure 23:
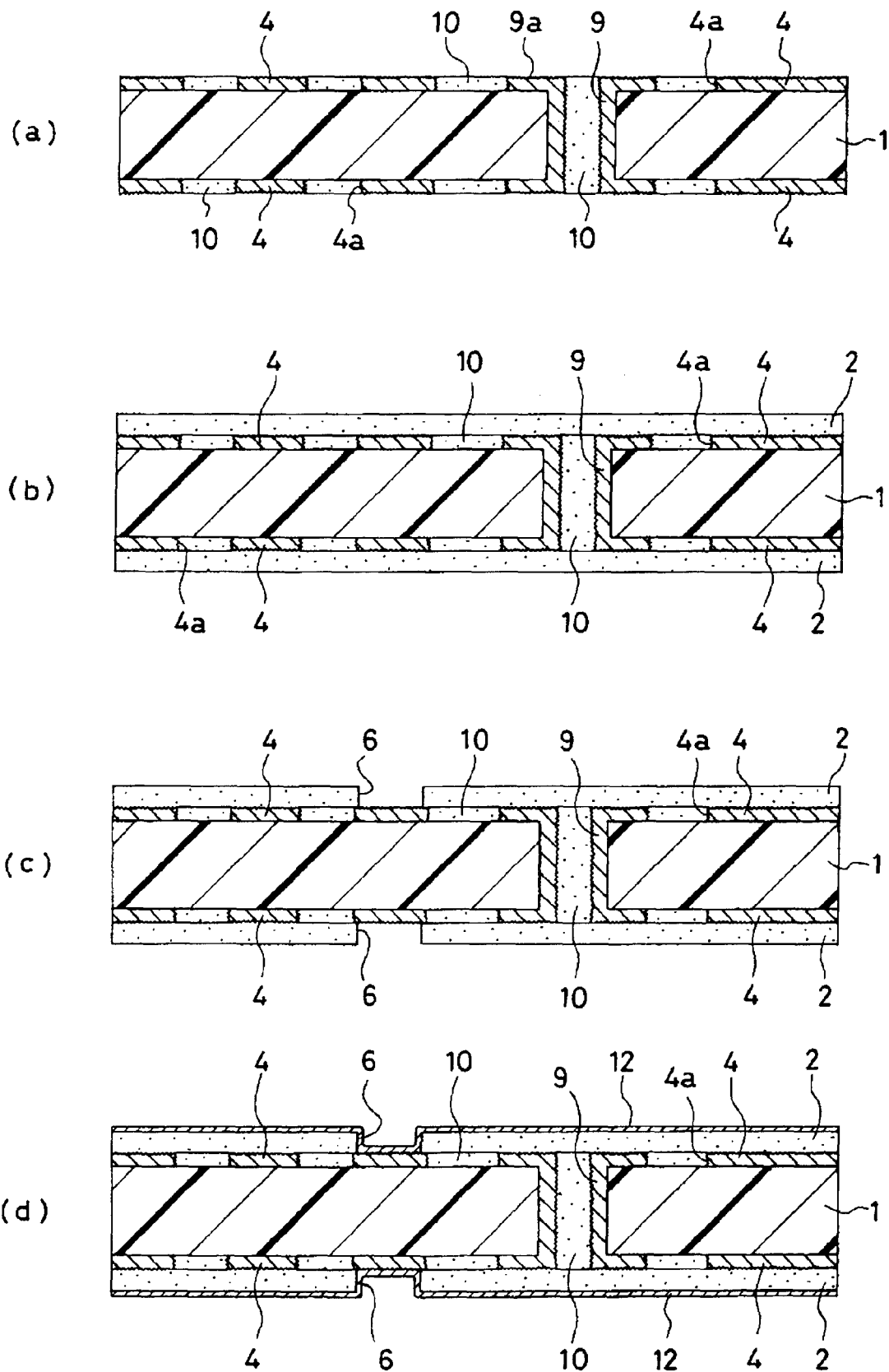
FIGS. 23 (*a*) to (*d*) are cross-section figures showing a part of a manufacturing processes of a multilayered printed circuit board of the present invention.

(5) Next, the foregoing substrate was washed with water, degreased by an acid, and then soft-etched and after that an etching solution was sprayed to both sides of the substrate to etch the surfaces of the under-level conductor circuits 4, and land surfaces and the inner walls of the plated-through holes 9 to form the roughened surfaces 4a, 9a on the entire surfaces of the under-level conductor circuits 4 (reference to FIG. 23 (a)). The etching solution used was an etching solution (made by Meck Co.; Meck etch bond) containing 10 part by weight of imidazole-Cu(II) complex, 7 part by weight of glycoric acid, and 5 part by weight of potassium chloride.

(6) Next, 50 μm-thick thermosetting type polyphenylene ether resin sheets having the foregoing chemical formula [3] (wherein $R^1$ represents —$CH_2$—; and $R^2$ represents —$CH_2$—O—$CH_2$—) were laminated on both sides of the substrate subjected to the forgoing steps by vacuum pressure bonding at 0.5 MPa pressure while the temperature being increased up to 50 to 150° C., to form interlaminar resin insulating layers 2 of the polyphenylene ether resin (reference to FIG. 23 (b)). The degree of vacuum at the time of the vacuum pressure bonding was 10 mmHg.

(7) Next, opening parts 6 for via-holes with the diameter of 80 μm were formed in the interlaminar resin insulating layers 2 comprising the thermosetting type polyphenylene ether resin using excimer laser of 248 nm wavelength. (reference to FIG. 22 (c)). After that, de-smear treatment was carried out using oxygen plasma.

(8) Next, using SV-4540 produced by ULVAC Japan Co., Ltd., sputtering of a Ni target was carried out at 80° C., 0.6 Pa gas pressure, and at the power of 200 W for 5 minutes to form thin film layers (Ni metal layers) 12 on the surfaces of the interlaminar resin insulating layers 2 (reference to FIG. 23 (d)). In this case, the thickness of the formed Ni metal layers was 0.1 μm.

Figure 24:
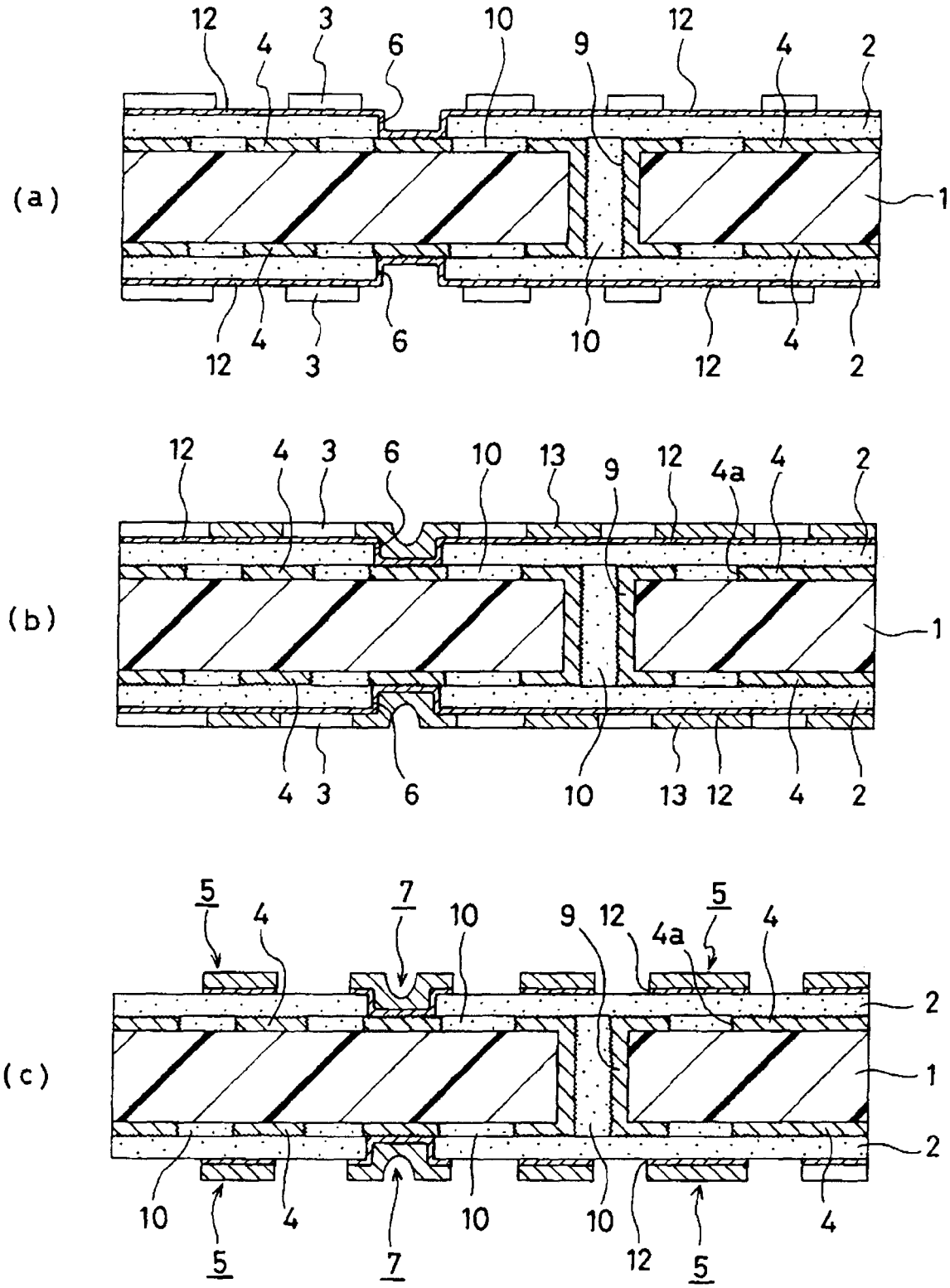
FIGS. 24 (*a*) to (*c*) are cross-section figures showing a part of a manufacturing processes of a multilayered printed circuit board of the present invention.

(9) Next, a photosensitive dry film sold in the market was stuck by thermal pressure bonding on the thin film layers (the Ni metal layers) 12 on both sides of the substrate for which the foregoing treatment was finished and a photomask film was mounted thereon and exposure was carried out at 100 mJ/cm² and development treatment was carried out with an aqueous 0.8% sodium carbonate solution to form 15 μm-thick plating resist 3 (reference to FIG. 24 (a)).

(10) Next, electroplating was carried out in the following conditions to form 15 μm-thick electrolytic plating films 13 (reference to FIG. 24 (b)). Incidentally, by the electroplating films 13, the parts to be conductor circuits 5 in the process described later was thickened and the parts to be via-holes 7 were filled with plating. In addition, the additive used in the electrolytic plating solution was Cupracid HL by Atotech Japan CO.

[Electroplating Solution]

| sulfuric acid | 2.24 mol/l |
| copper sulfate | 0.26 mol/l |
| an additive | 19.5 mol/l |

[Electroless Plating Condition]

| current density | 1 A/dm² |
| duration | 65 minutes |
| temperature | 22 ± 2° C. |

(11) After the plating resist 3 was separated and removed with an aqueous 5% KOH solution, the electroless plating films used to be under the plating resist were dissolved and removed by etching with a mixed, solution of sulfuric acid and hydrogen peroxide to form independent upper layer conductor circuits 5 (including the via-holes 7) (reference to FIG. 24 (c)).

Figure 25:
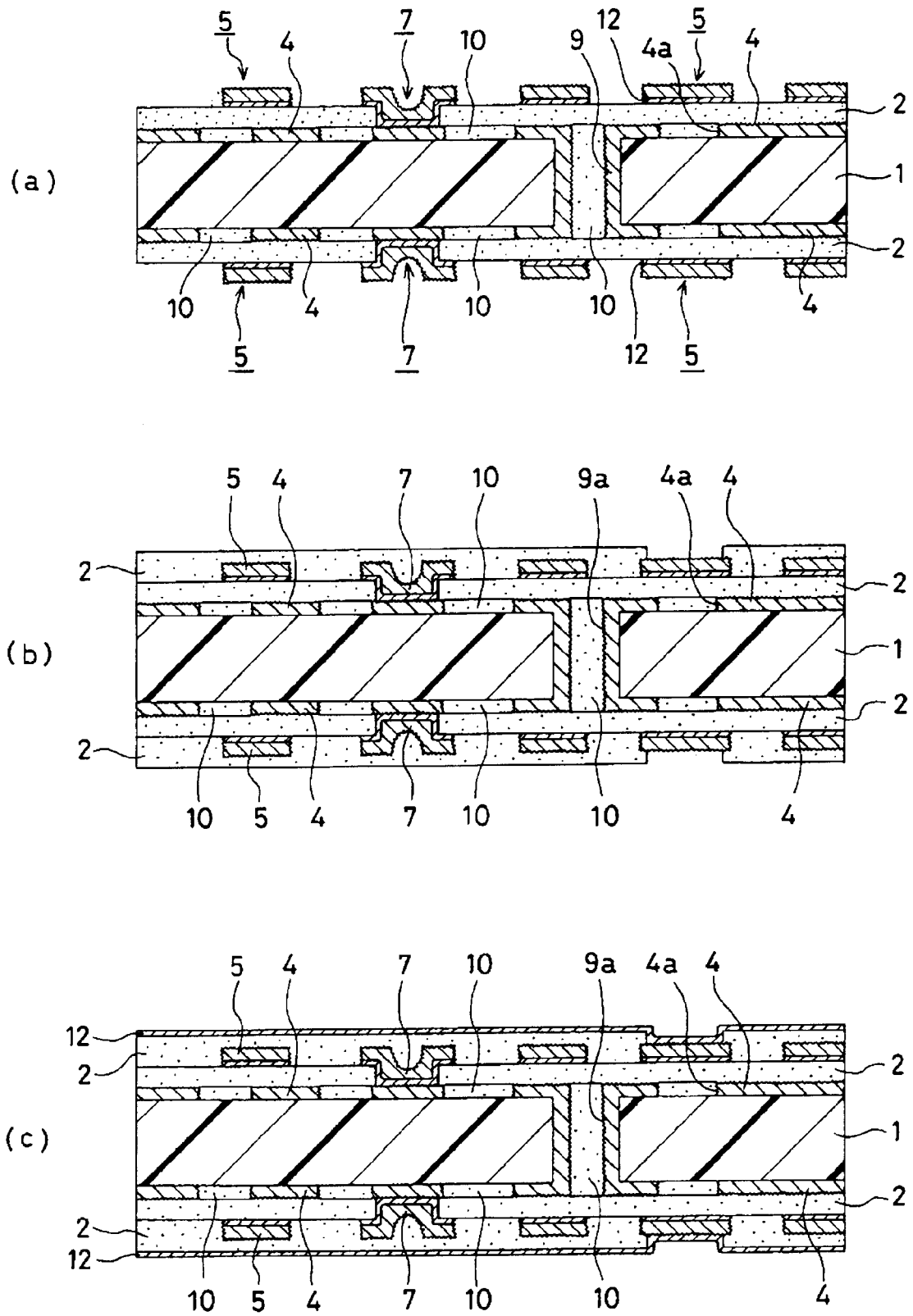
FIGS. 25 (*a*) to (*c*) are cross-section figures showing a part of a manufacturing processes of a multilayered printed circuit board of the present invention.
Figure 26:
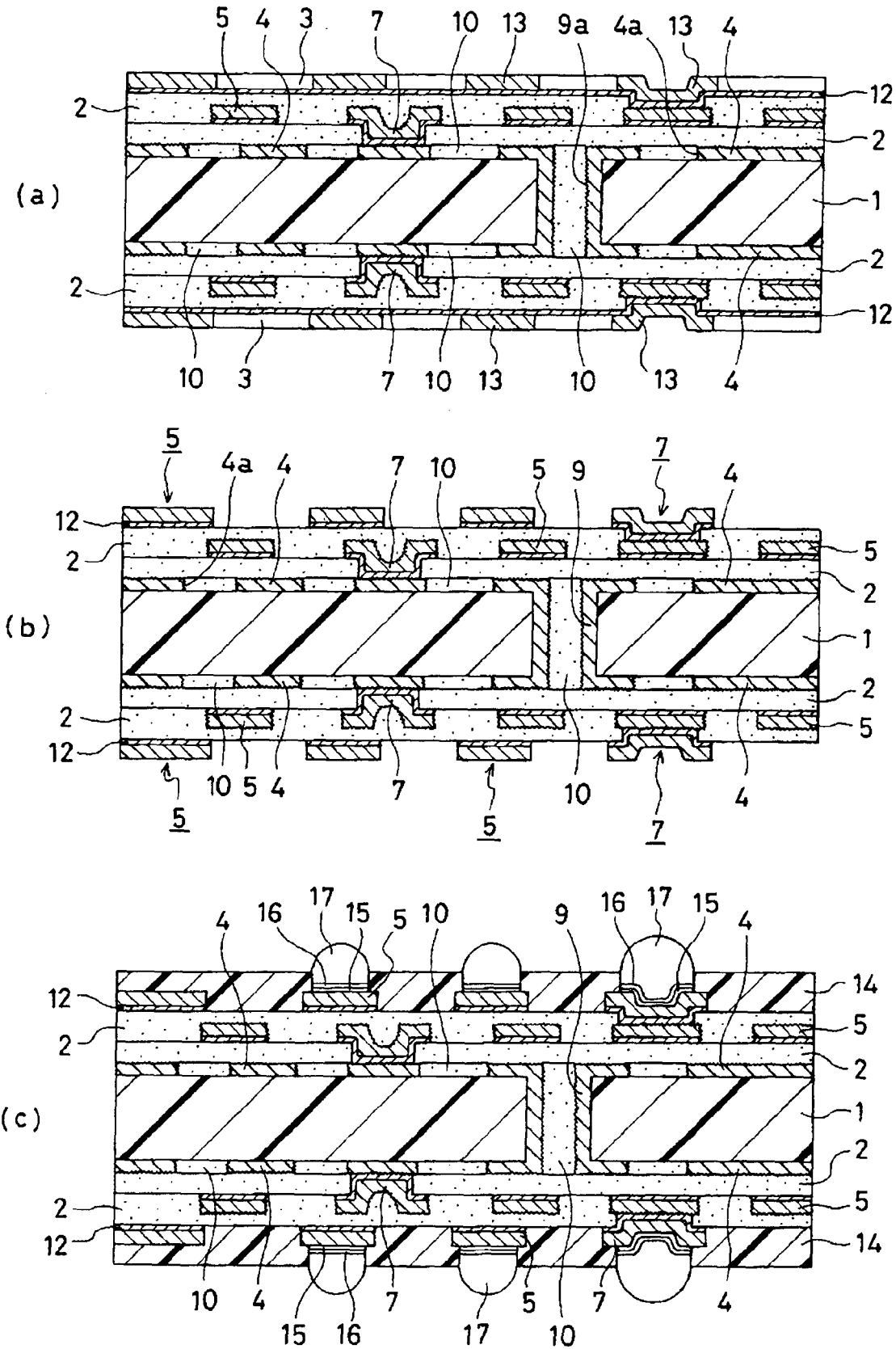
FIGS. 26 (*a*) to (*c*) are cross-section figures showing a part of a manufacturing processes of a multilayered printed circuit board of the present invention.

(12) Successively, the foregoing steps (5) to (11) were repeated to form further upper layer conductor circuits (reference to FIG. 25 (a) to FIG. 26 (b)).

(13) Next, 20 μm-thick thermosetting type polyphenylene ether resin sheets having the foregoing chemical formula [3] (wherein $R^1$ represents —$CH_2$—$CH_2$— and $R^2$ represents —$CH_2$—O—$CH_2$—) were laminated on both sides of the multilayered circuit substrate on which upper layer conductor circuits were formed, by vacuum pressure bonding at 0.5 MPa pressure while the temperature being increased up to 50 to 150° C. to form solder resist layers 14 comprising the polyphenylene ether resin. The degree of vacuum at the time of the vacuum pressure bonding was 10 mmHg.

(14) Next, opening parts with the diameter of 200 μm were formed in the solder resist layers 14 comprising the thermosetting type polyphenylene ether resin using excimer laser of 248 nm wavelength. After that, de-smear treatment was carried out using oxygen plasma to form solder resist layers (an organic resin insulating layers) 14 with 20 μm thickness having opening parts in the solder pad parts.

(15) Next, the substrate in which the solder resist layers (resin insulating layers) 14 were formed was immersed in an electroless nickel plating solution at pH 4.5 containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form 5 μm-thick nickel plating layers 15 in the opening parts. Further, the resultant substrate was immersed in an electroless plating solution containing potassium cyanoaurate ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) at 80° C. for 7.5 minutes to form 0.03 μm-thick gold plating layers 16 on the nickel plating layers 15.

(16) After that, a solder paste was printed on the opening parts of the solder resist layers 14 and reflow of the paste was carried out at 200° C. to form solder bumps (solder bodies) 17 and to manufacture a multilayered printed circuit board having the solder bumps 17 (reference to FIG. 26 (c)).

(17) Using some other part of the multilayered printed circuit board, an IC chip bonding was carried out. That is, after washing with fluxes, using a prescribed installation apparatus, positioning of the solder bumps of the multilayered printed circuit board with bumps formed in the IC chips was carried out using target marks as standard and re-flow of the solder was carried out to join the solder bumps of the multilayered printed circuit board with the bumps of the IC chips. Then, washing with fluxes was carried out and the gaps between the IC chip and the multilayered printed circuit board was filled with under-fill to consequently obtain a multilayered printed circuit board connected with IC chips (a semiconductor device).

Example 13

A multilayered printed circuit board was manufactured in the same manner as the example 12 except that, in the step (6) of example 12, a 20 µm-thick thermosetting type cycloolefin type resin sheet was used for forming the interlaminar resin insulating layers comprising the thermosetting type cycloolefin resin in place of the thermosetting polyphenylene ether resin, and using the multilayered printed circuit board, a semiconductor device connected with an IC chip was obtained.

Comparative Example 6

A. Preparation of the a Resin Composition for Roughend Surface Formation for an Upper Layer (i) A mixture composition was produced by stirring and mixing 35 part by weight of a resin solution produced by dissolving a cresol novolak type epoxy resin (molecular weight 2500; made by Nippon Kayaku Co., Ltd.) acrylated in 25% in diethylene glycol dimethyl ether (DMDG) to be in 80% by weight concentration, 3.15 part by weight of a photosensitive monomer (Aronix M315; made by Toagosei Chemical Industry Co., Ltd.), 0.5 part by weight of a defoaming agent (S-65; made by San Nopco Ltd.), and 3.6 part by weight of N-methylpyrrolidone (NMP) in a container.

(ii) An another mixture composition was produced by stirring and mixing 12 part by weight of a polyether sulfone (PES), 7.2 part by weight of an epoxy resin particle with the average particle diameter of 1.0 µm (Polymerpol; made by Sanyo Chemical Industries, Ltd.) and 3.09 part by weight of the epoxy resin particle with the average particle diameter of 0.5 µm in another container and then further adding 30 part by weight of NMP to the mixture and mixing and stirring the resultant mixture by a bead mill.

(iii) Further, another mixture composition was produced by mixing and stirring 2 part by weight of an imidazole curing agent (made by Shikoku Chemicals Corp.; 2E4MZ-CN), 2 part by weight of a photopolymerization initiator (made by Chiba Specialty Chemicals Corp.; Irgacure I-907), 0.2 part by weight of a photosensitizing agent (made by Nippon Kayaku Co., Ltd.; DETX-S), and 1.5 part by weight of NMP in further another container.

The mixture compositions obtained in (i), (ii), and (iii) were mixed to give a resin composition for the roughened-surface formation.

B. Preparation of a Resin Composition for Roughened-Surface Formation for an Under Layer (i) A mixture composition was produced by stirring and mixing 35 part by weight of a resin solution produced by dissolving a cresol novolak type epoxy resin (molecular weight 2500; by Nippon Kayaku Co., Ltd.) acrylated in 25% in diethylene glycol dimethyl ether (DMDG) to be in 80% by weight, 4 part by weight of a photosensitive monomer (Aronix M315; made by Toagosei Chemical Industry Co., Ltd.), 0.5 part by weight of a defoaming agent (made by San Nopco Ltd.; S-65), and 3.6 part by weight of N-methylpyrrolidone (NMP) in a container.

(ii) An another mixture composition was produced by stirring and mixing 12 part by weight of a polyether sulfone (PES), 14.49 part by weight of an epoxy resin particle with the average particle diameter of 0.5 µm (made by Sanyo Chemical Industries, Ltd.; Polymerpol) in another container and then further adding 30 part by weight of NMP to the mixture and mixing and stirring the resultant mixture by a bead mill.

(iii) Further, another mixture composition was produced by mixing and stirring 2 part by weight of an imidazole curing agent (made by Shikoku Chemicals Corp.; 2E4MZ-CN), 2 part by weight of a photopolymerization initiator (made by Chiba Specialty Chemicals Corp.; Irgacure I-907), 0.2 part by weight of a photosensitizing agent (made by Nippon Kayaku Co., Ltd.; DETX-S), and 1.5 part by weight of NMP in further another container.

The mixture compositions obtained in (i), (ii), and (iii) were mixed to give a resin composition for the roughened-surface formation.

C. Preparation of a Resin Filler

A resin filler was prepared in the same manner as the example 1.

D. Manufacture of a Multilayered Printed Circuit Board (1) A copper-laminated laminate plate composed of a substrate 1 which was made of a 0.8 mm-thick glass epoxy resin or BT (bismaleimide triazine) resin with a 18 µm-thick copper foil 8 laminated on both sides of the substrate 1 was used as a starting material (reference to FIG. 27 (a)). At first, the copper-laminated laminate plate was subjected to drilling by a drill and then electroless plating and pattern-etching to form the under-level conductor circuits 4 and plated-through holes 9 in both sides of the substrate 1.

Figure 27:
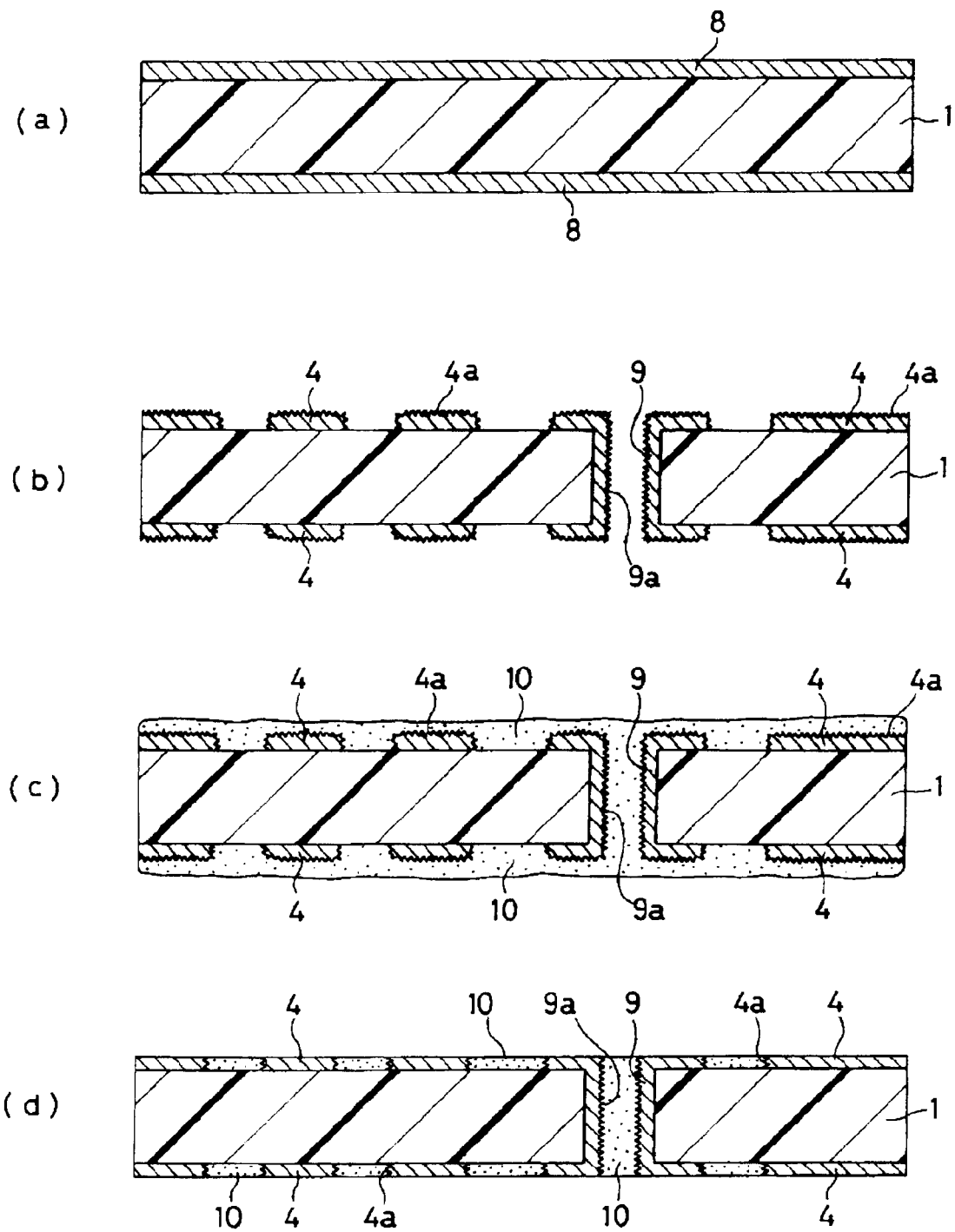
FIGS. 27 (*a*) to (*d*) are cross-section figures showing a part of a manufacturing processes of a multilayered printed circuit board of the present invention.

(2) The substrate on which the plated-through holes 9 and the under-level conductor circuits 4 were formed was washed with water and dried and then subjected to blackening treatment in a blackening bath (an oxidizing bath) of an aqueous solution containing NaOH (10 g/l), $NaClO_2$ (40 g/l), and $Na_3PO_4$ (6 g/l) and reducing treatment in a reducing bath of an aqueous solution containing NaOH (10 g/l) and $NaBH_4$ (6 g/l) to form roughened surfaces 4a, 9a on the entire surfaces of the under-level conductor circuits 4 including the plated-through holes 9 (reference to FIG. 27 (b)).

(3) After the resin filler was produced as described in the foregoing description C, the resin filler 10 was applied to one side of the substrate by a roll coater to fill the space between the under-level conductor circuits 4 and inside the plated-through holes 9 and heated and dried and after that, the space between the under-level conductor circuits 4 in the other side and the plated-through holes 9 were filled with the resin filler 10 in the same manner and heated and dried (reference to FIG. 27 (c)).

(4) One side of the substrate on which the foregoing treatment (3) was finished was polished to leave no resin filler 10 on the surfaces of the inner layer copper patterns 4 and the land surfaces of the plated-through holes 9 by a belt sander polishing using the belt abrasive paper #600 (made by Sankyo Rikagagu Co., Ltd.) and then buffed to eliminate the scars formed by the foregoing belt sander polishing. Such a series of steps were also carried out for the other side of the substrate.

After that, heating treatment was carried out at 100° C. for 1 hour, at 120° C. for 3 hours, at 150° C. for 1 hour and at 180° C. for 7 hours to cure the layers of the resin filler 10.

In such a manner the surface layer parts of the resin filler 10 formed in the plated-through holes 9 and the non-conductor circuit formed area and the surfaces of the under-level conductor circuits 4 were leveled to obtain an insulating substrate (reference to FIG. 27 (*d*)) where the resin filler 10 and the side faces 4*a* of the under-level conductor circuits 4 were firmly stuck to each other through the roughened surfaces, and the inner wall faces 9*a* of the plated-through holes 9 and the resin filler 10 were firmly stuck to each other by the roughened surface.

Figure 28:
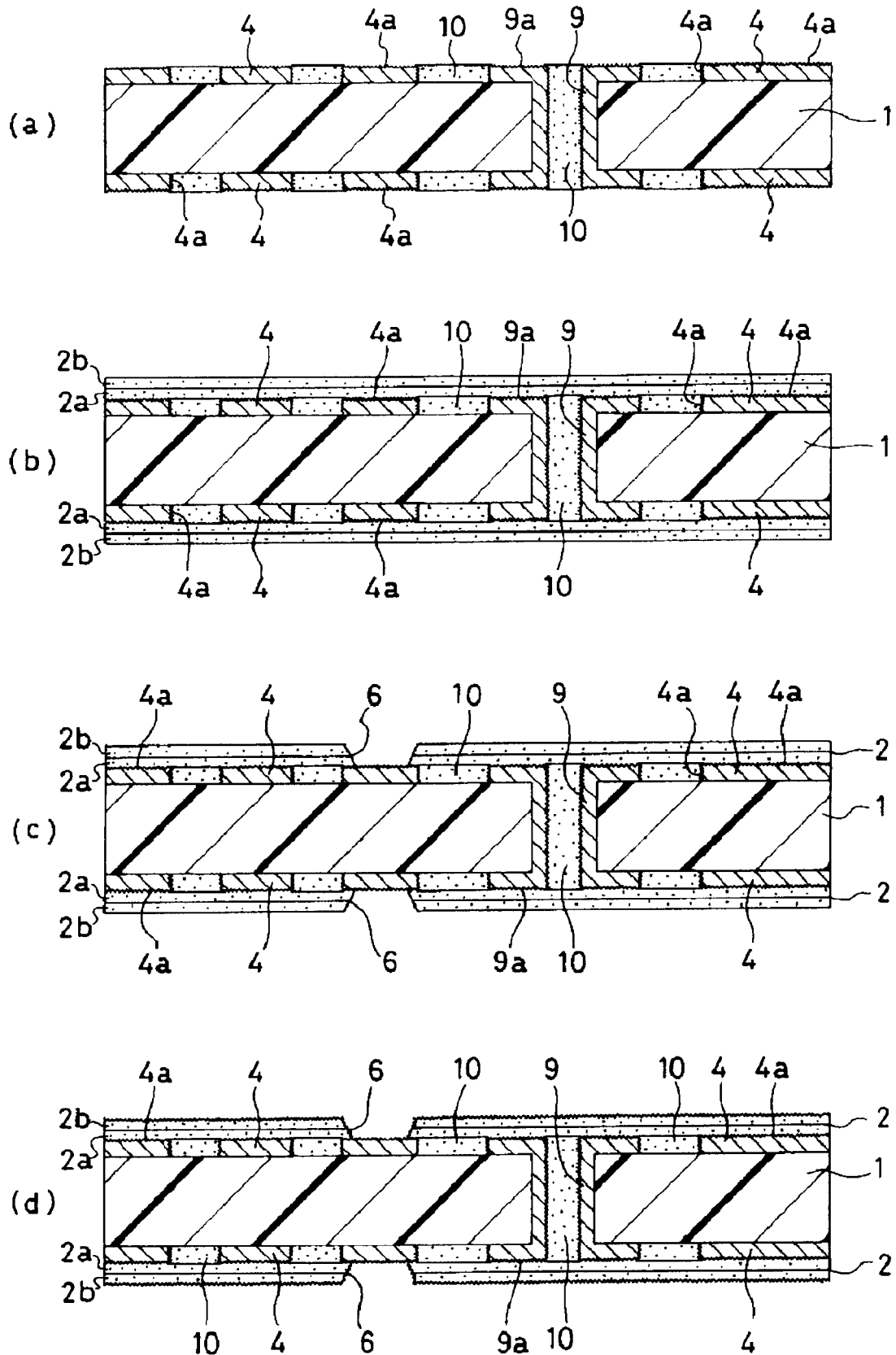
FIGS. 28 (*a*) to (*d*) are cross-section figures showing a part of a manufacturing processes of a multilayered printed circuit board of the present invention.

(5) Next, the forging substrate was degreased with an acid and soft-etched and after that an etching solution was sprayed to both sides of the substrate to etch the surfaces of the under-level conductor circuits 4 and land surfaces and the inner walls of the plated-through holes 9 to form the roughened surfaces 4*a*, 9*a* on the entire surfaces of the under-level conductor circuits 4 (reference to FIG. 28 (*a*)). The etching solution used was an etching solution (made by Meck Co.; Meck etch bond) containing 10 part by weight of imidazole-Cu(II) complex, 7 part by weight of glycoric acid, and 5 part by weight of potassium chloride.

(6) The resin composition (viscosity 1.5 Pa·s) for roughened-surface formation for an under layer was applied to both sides of the substrate by a roll coater within 24 hours after preparation of the composition, and after being kept still horizontally for 20 minutes, drying was carried out at 60° C. for 30 minutes. After that, the resin composition (viscosity 7 Pa·s) for roughened-surface formation for an upper layer was applied to the substrate by a roll coater within 24 hours after preparation of the composition and after being kept still horizontally for 20 minutes, drying was carried out at 60° C. for 30 minutes to form 35 μm-thick layers 2*a*, 2*b* of the resin composition for roughened-surface formation (reference to FIG. 28 (*b*)).

(7) Photomasks drawing black circles of 85 μm diameter of a light shielding ink were closely stuck to both sides of the substrate 1 on which the layers 2*a*, 2*b* of the resin compositions for the roughened-surface formation were formed as described in the foregoing step (6) and the substrate was exposed to light in 3000 mJ/cm² intensity of an ultra high pressure mercury lamp and then heated at 100° C. for 1 hour, at 120° C. for 1 hour, and at 150° C. for 3 hours to form 35 μm-thick interlaminar resin insulating layers 2 having opening parts for via-holes of 85 μm in diameter with excellent size precision corresponding to the photomask films (reference to FIG. 28 (*c*)). Incidentally, the tin plating layers were partly exposed in the opening parts to be via-holes.

(8) The substrate in the which opening parts for via-holes 6 were formed was immersed in an aqueous containing chromic acid for 19 minutes to dissolve and remove the epoxy resin particles existing on the surfaces of the interlaminar resin insulating layers 2 and roughen the surfaces to obtain the roughened surfaces (depth of 6 μm). After that, the resultant substrate was immersed in a neutralization solution (made by Shiplay Co., Inc.) and washed with water (reference to FIG. 28 (*d*)).

Further, a palladium catalyst (Atotech Japan CO.) was supplied to stick catalyst cores to the surfaces of the interlaminar resin insulating layers 2 and the inner wall faces of the opening parts for via-holes 6.

Figure 29:
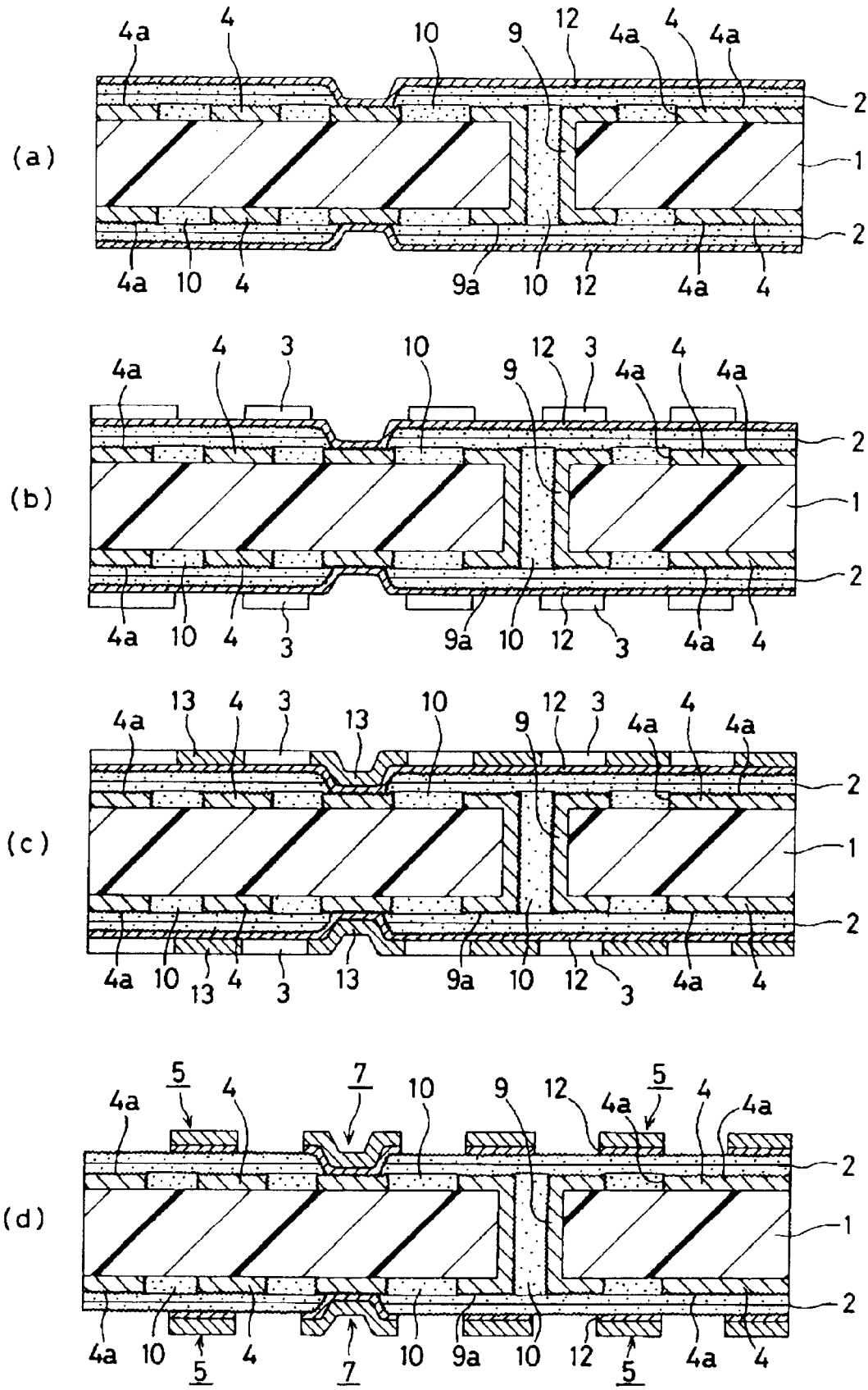
FIGS. 29 (*a*) to (*d*) are cross-section figures showing a part of a manufacturing processes of a multilayered printed circuit board of the present invention.

(9) Next, the substrate was immersed in an electroless copper plating solution with the following composition to form thin film layers (electroless copper plating films) 12 of 0.6 to 1.2 μm thickness on the entire roughened surface (reference to FIG. 29 (*a*)).

[Electroless Plating Solution]

| | |
|---|---|
| $NiSO_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 40 mg/l |
| PEG (polyethylene glycol) | 0.10 g/l |

[Electroless Plating Condition]
For 40 minutes at 35° C. of solution temperature.

(10) A photosensitive dry film sold in the market was stuck to the thin film layers (electroless copper plating films) 12 by thermal pressure bonding and a mask was mounted thereon and exposure was carried out at 100 mJ/cm² and development treatment was carried out with an aqueous 0.8% sodium carbonate solution to form 15 μm-thick plating resist 3 (reference to FIG. 29 (*b*)).

(11) Next, electrolytic copper plating was carried out in the following conditions to form 15 μm-thick electrolytic copper plating films 13 (reference to FIG. 29 (*c*)).

[Electroplating Solution]

| | |
|---|---|
| sulfuric acid | 2.24 mol/l |
| copper sulfate | 0.26 mol/l | an additive (Cupracid HL; by Atotech Japan CO.) 19.5 mol/l
[Electroless Plating Condition]

| | |
|---|---|
| current density | 1 A/dm² |
| duration | 65 minutes |
| temperature | 22 ± 2° C. |

(12) After the plating resist 3 was separated and removed with an aqueous 5% KOH solution, the electroless plating films used to be under the plating resist 3 were dissolved and removed by etching with a mixed solution of sulfuric acid and hydrogen peroxide to form conductor circuits 5 (including via-holes 7) with 18 μm thickness composed of the thin film layers (electroless copper plating layers) 12 and the electrolytic copper plating films 13 (reference to FIG. 29 (*d*)).

Figure 30:
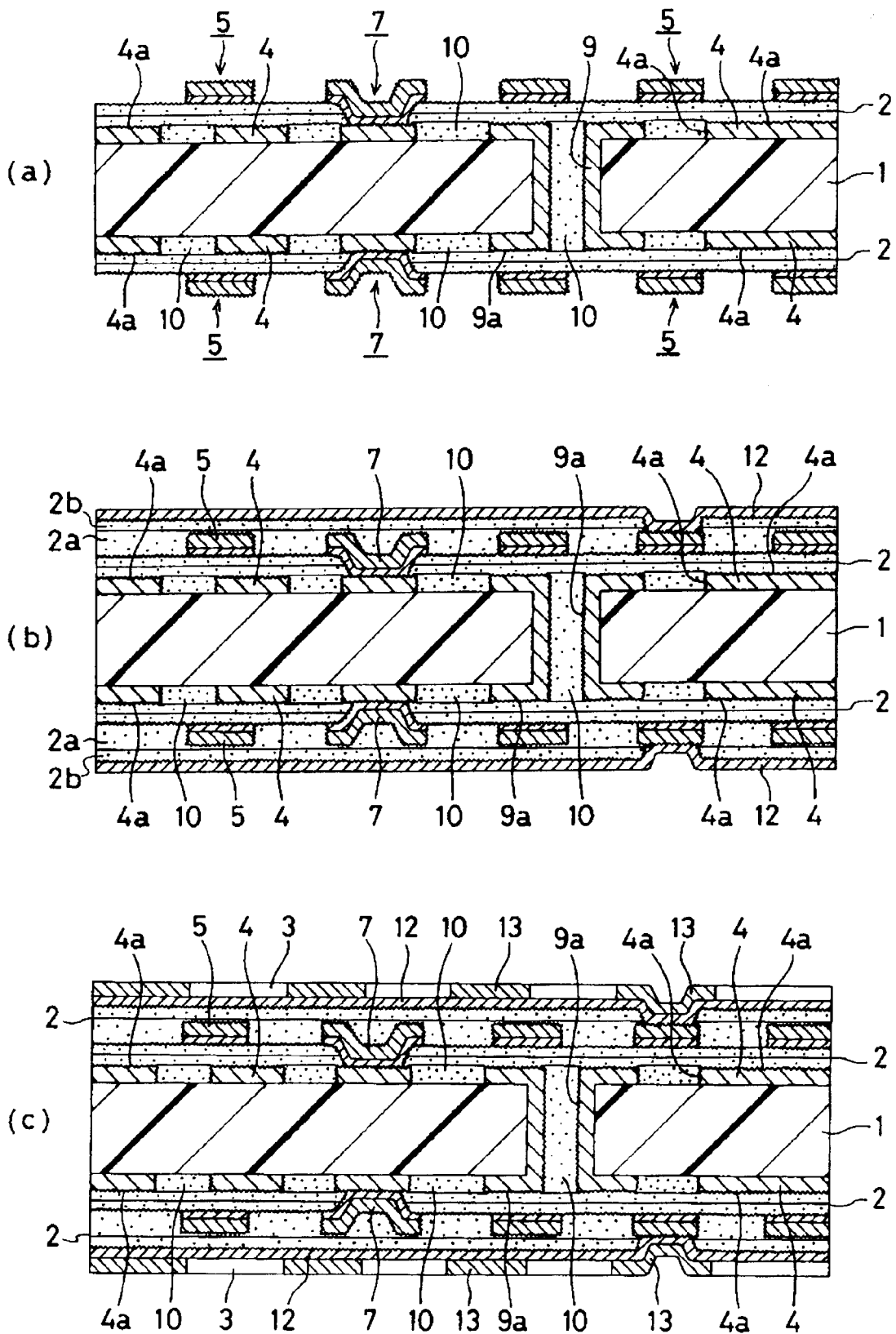
FIGS. 30 (*a*) to (*c*) are cross-section figures showing a part of a manufacturing processes of a multilayered printed circuit board of the present invention.
Figure 31:
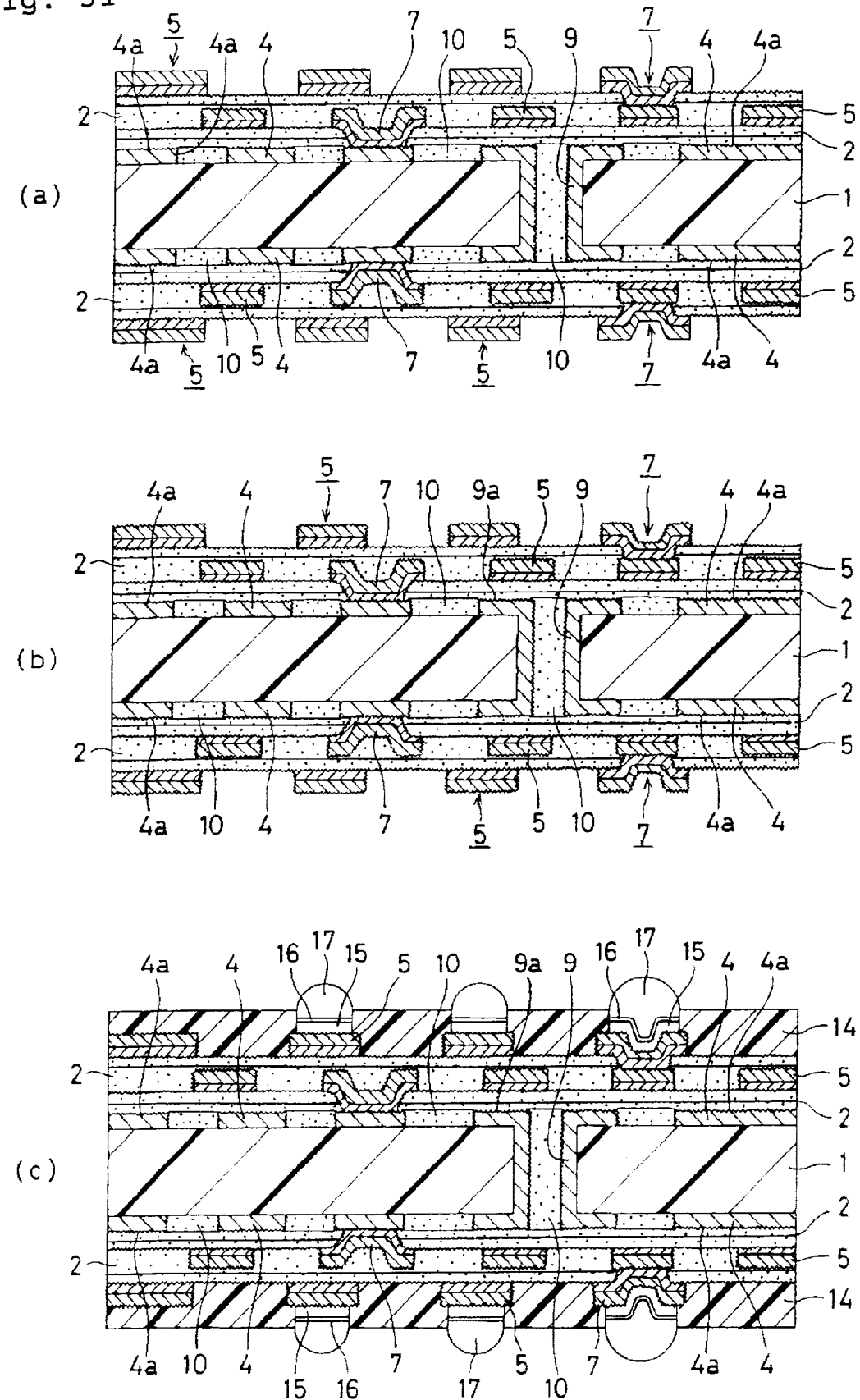
FIGS. 31 (*a*) to (*c*) are cross-section figures showing a part of a manufacturing processes of a multilayered printed circuit board of the present invention.

(13) Successively, the foregoing steps (5) to (12) were repeated to form further upper interlaminar resin insulating layers and upper layer conductor circuits to obtain a multi-layered circuit board (reference to FIG. 30 (*a*) to FIG. 31 (*a*)).

(14) Next, the surfaces of the conductor circuits 5 (including the via-holes 7) were etched using the same etching solution as that used in the foregoing step (5) to form roughened surfaces on the conductor circuits 5 (including the via-holes 7) (reference to FIG. 31 (*b*)).

(15) Next, a solder resist composition (an organic resin insulating material) with an adjusted viscosity of 2.0 Pa·s at 25° C. was prepared by preparing a mixture composition by stirring and mixing 46.67 parts by weight of photosensitivity-provided oligomer (molecular weight: 4000) which was a cresol novolak type epoxy resin (made by Nippon Kayaku Co., Ltd.) whose 50% of epoxy group was acrylated and which was dissolved in diethylene glycol dimethyl ether (DMDG) to be 60% by weight concentration, 15 part by weight of a bisphenol A type epoxy resin (made by Yuka Shell Epoxy CO.; trade name: Epikote 1001) dissolved to be 80% by weight concentration in methyl ethyl ketone, 1.6 part by weight of an imidazole curing agent (made by Shikoku Chemicals Corp.; trade name: 2E4MZ-CN), 3 part by weight of a polyfunctional acrylic monomer, which is a photosensitive monomer, (made by Nippon Kayaku Co., Ltd.; trade name: R 604), 1.5 part by weight of a polyvalent acrylic monomer (made by Kyoei Chemical Co., Ltd.; trade name: DPE 6A), and 0.71 part by weight of a dispersion type defoaming agent (made by San Nopco Ltd.; trade name: S-65) and adding 2.0 part by weight of benzophenone (made by Kanto Chemical Co., Inc.) as a photopolymerization initiator and 0.2 part by weight of Micheler's ketone (made by Kanto Chemical Co., Inc.) as a photosensitizer to the mixture composition.

The viscosity measurement was carried out by a B-type viscometer (DVL-B type; by Tokyo Instruments Co. Ltd.), using a rotor No. 4 for 60 rpm and a rotor No. 3 for 6 rpm.

(16) Next, the foregoing solder resist composition was applied in 20 μm thickness on both sides of the multilayered circuit substrate and dried at 70° C. for 20 minutes and 70° C. for 30 minutes and after that, a 5 mm-thick photomask drawing a pattern corresponding to the opening part of the solder resist was closely stuck to the solder resist layers and exposure by ultraviolet rays of 1000 mJ/cm$^2$ and development treatment by the DMTG solution were successively carried out to form opening parts with 200 μm of diameter.

Further, the solder resist layers were cured by heating at 80° C. for 1 hour, at 100° C. for 1 hour, at 120° C. for 1 hour and at 150° C. for 3 hours to form 20 μm-thick solder resist layers (organic resin insulating layers) 14 having opening parts for solder pad parts.

(17) Next, the substrate in which the solder resist layers (organic resin insulating layers) 14 were formed was immersed in an electroless nickel plating solution at pH 4.5 containing nickel chloride ($2.3 \times 10^{-1}$ mol/l), sodium hypophosphite ($2.8 \times 10^{-1}$ mol/l), and sodium citrate ($1.6 \times 10^{1}$ mol/l) for 20 minutes to form 5 μm-thick nickel plating layers 15 in the opening parts. Further, the resultant substrate was immersed in an electroless plating solution containing potassium cyanoaurate ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) at 80° C. for 7.5 minutes to form 0.03 μm-thick gold plating layers 16 on the nickel plating layers 15.

(18) After that, a solder paste was printed on the opening parts of the solder resist layers 14 and reflow of the paste was carried out at 200° C. to form solder bumps (solder bodies) 17 and to manufacture a multilayered printed circuit board having the solder bumps 17 (reference to FIG. 31 (c)).

After that, using the obtained multilayered printed circuit board, a multilayered printed circuit board (a semiconductor device) connected with IC chips was obtained.

Regarding the multilayered printed circuit boards obtained by the examples 12, 13 and the comparative example 6, the dielectric constants and the dielectric loss tangents were measured and further whether signal delay and signal errors took place or not were tested for the manufactured semiconductor devices. The results were shown in the following Table 2.

TABLE 2

| | dielectric constant ($\epsilon$) | dielectric loss tangent (tan δ) | signal delay | signal error |
|---|---|---|---|---|
| example 12 | 2.6 | 0.0005 | not generated | not generated |
| example 13 | 2.8 | 0.0009 | not generated | not generated |
| comparative example 6 | 3.8 | 0.02 | generated | generated |

As being made clear according to the results in the foregoing Table 2, the dielectric constants and the dielectric loss tangents of the entire bodies of the multilayered printed circuit boards were low in the multilayered printed circuit boards of the examples 12, 13 and signal delay and signal errors did not at all took place in the semiconductor devices using these multilayered printed circuit boards, whereas signal delay and signal errors take place in the semiconductor device using the multilayered printed circuit board of the comparative example 6.

Example 14

A. Preparation of the a Resin Composition for Roughened-Surface Formation for an Upper Layer (1) A mixture composition was produced by stirring and mixing 400 part by weight of a resin solution produced by dissolving a cresol novolak type epoxy resin (molecular weight 2500; made by Nippon Kayaku Co., Ltd.) acrylated in 25% in diethylene glycol dimethyl ether (DMDG) to be in 80% by weight concentration, 60 part by weight of a photosensitive monomer (made by Toagosei Chemical Industry Co., Ltd.; Aronix M325), 5 part by weight of a defoaming agent (made by San Nopco Ltd.; S-65), and 35 part by weight of N-methylpyrrolidone (NMP) in a container.

(2) An another mixture composition was produced by stirring and mixing 80 part by weight of a polyether sulfone (PES), 72 part by weight of an epoxy resin particle with the average particle diameter of 1.0 μm (made by Sanyo Chemical Industries, Ltd.; Polymerpol) and 31 part by weight of the epoxy resin particle with the average particle diameter of 0.5 μm in another container and then further adding 257 part by weight of NMP to the mixture and mixing and stirring the resultant mixture by a bead mill.

(3) Further, another mixture composition was produced by mixing and stirring 20 part by weight of an imidazole curing agent (made by Shikoku Chemicals Corp.; 2E4MZ-CN), 20 part by weight of a photopolymerization initiator (benzophenone), 4 part by weight of a photosensitizing agent (made by Chiba Specialty Chemicals Corp.; EAB), and 16 part by weight of NMP in further another container.

The mixture compositions obtained in (1), (2), and (3) were mixed to give a resin composition for the roughened-surface formation.

B. Preparation of a Resin Composition for Roughened-Surface Formation for an Under Layer (1) A mixture composition was produced by stirring and mixing 400 part by weight of a resin solution produced by dissolving a cresol novolak type epoxy resin (molecular weight 2500; made by Nippon Kayaku Co., Ltd.) acrylated in 25% in diethylene glycol dimethyl ether (DMDG) to be in 80% by weight concentration, 60 part by weight of a photosensitive monomer (made by Toagosei Chemical Industry Co., Ltd.; Aronix M325), 5 part by weight of a defoaming agent (made by San Nopco Ltd.; S-65), and 35 part by weight of N-methylpyrrolidone (NMP) in a container.

(2) An another mixture composition was produced by stirring and mixing 80 part by weight of a polyether sulfone (PES), 145 part by weight of an epoxy resin particle with the average particle diameter of 0.5 μm (made by Sanyo Chemical Industries, Ltd.; Polymerpol) in another container and then further adding 285 part by weight of NMP to the mixture and mixing and stirring the resultant mixture by a bead mill.

(3) Further, another mixture composition was produced by mixing and stirring 20 part by weight of an imidazole curing agent (made by Shikoku Chemicals Corp.; 2E4MZ-CN), 20 part by weight of a photopolymerization initiator (benzophenone), 4 part by weight of a photosensitizing agent (made by Chiba Specialty Chemicals Corp.; EAB) and 16 part by weight of NMP in further another container.

The mixture compositions obtained in (1), (2), and (3) were mixed to give a resin composition for the roughened-surface formation.

C. Preparation of a Resin Filler

A resin filler with the viscosity of 45 to 49 Pa·s at 23±1° C. was produced by mixing and stirring 100 part by weight of a bisphenol F type epoxy monomer (molecular weight 310; made by Yuka Shell Epoxy CO.; YL 983 U), 170 part by weight of a $SiO_2$ spherical particle (made by Admatechs Co., Ltd.; CRS 1101-CE) with the average particle diameter of 1.6 μm and the maximum particle diameter of 15 μm or smaller and coated with a silane coupling agent on the surface, and 1.5 part by weight of a leveling agent (made by San Nopco Ltd.; Perenol S4) in a container.

Incidentally, 6.5 part by weight of an imidazole curing agent (made by Shikoku Chemicals Corp., 2E4MZ-CN) was used as a curing agent.

D. Method for Manufacturing a Multilayered Printed Circuit Board (1) A copper-laminated laminate plate composed of a substrate 1 which was made of a 0.8 mm-thick glass epoxy resin or BT (bismaleimide triazine) resin with a 18 μm-thick copper foil 8 laminated on both sides of the substrate 1 was used as a starting material (reference to FIG. 6 (a)). At first, the copper-laminated laminate plate was subjected to drilling by a drill and then electroless plating and pattern-etching to form the under-level conductor circuits 4 and plated-through holes 9 in both sides of the substrate 1.

(2) The substrate on which the plated-through holes 9 and the under-level conductor circuits 4 were formed was washed with water and dried and then subjected to blackening treatment in a blackening bath (an oxidizing bath) of an aqueous solution containing NaOH (10 g/l), $NaClO_2$ (40 g/l), and $Na_3PO_4$ (6 g/l) and reducing treatment in a reducing bath of an aqueous solution containing NaOH (19 g/l) and $NaBH_4$ (5 g/l) to form roughened surfaces 4a, 9a on the entire surfaces of the under-level conductor circuits 4 including the plated-through holes 9 (reference to FIG. 6 (b)).

(3) After the resin filler was produced as described in the foregoing description D, the layers of the resin filler 10 were formed in the plated-through holes 9 and in the non conductor circuit formed area and the outer rim area of the conductor circuit 4 on one side of the substrate 1.

That is, at first the resin filler was squeezed into the through holes using a squeegee and then dried at 100° C. for 20 minutes. Next, a mask having opening parts in the portions corresponding to the non conductor circuit formed area was put on the substrate and layers of the resin filler 10 were formed in recessed parts, which corresponded to the non conductor circuit formed area, using a squeegee and dried at 100° C. for 20 minutes (reference to FIG. 6 (c)).

(4) The one side of the substrate for which the foregoing step (3) was just finished was polished by a belt sander polishing using the belt abrasive paper #600 (made by Sankyo Rikagagu Co., Ltd.) as to leave no resin filler 10 on the surface of the inner layer copper pattern 4 and on the land surfaces of the plated-through holes 9 and then buffed to eliminate the scars formed by the foregoing belt sander polishing. Such a series of steps were also carried out for the other side of the substrate.

After that, heating treatment was carried out at 100° C. for 1 hour, at 120° C. for 3 hours, at 150° C. for 1 hour, and 180° C. for 7 hours to cure the resin filler 10.

In such a manner, the layer portion close to the surface of the resin filler 10 formed in the plated-through holes 9 and in the non-conductor circuit formed area and the surfaces of the under-level conductor circuits 4 were leveled to obtain an insulating substrate (reference to FIG. 6 (d)) where the resin filler 10 and the side faces 4a of the under-level conductor circuits 4 were firmly stuck to each other through the roughened surfaces, and the inner wall faces 9a of the plated-through holes 9 and the resin filler 10 were firmly stuck to each other by the roughened surface. By these steps, the surfaces of the resin filler 10 and the surface of the under-level conductor circuits 4 were made to be in the same planes.

(5) Next, the foregoing substrate was washed with water, degreased by an acid, and then soft-etched and after that an etching solution was sprayed to both sides of the substrate to etch the surfaces of the under-level conductor circuits 4 and land surfaces and the inner walls of the plated-through holes 9 to form the roughened surfaces 4a, 9a on the entire surfaces of the under-level conductor circuits 4 (reference to FIG. 7 (a)). The etching solution used was an etching solution (made by Meck Co.; Meck etch bond) containing 10 part by weight of imidazole-Cu(II) complex, 7 part by weight of glycoric acid, and 5 part by weight of potassium chloride.

(6) The resin composition (viscosity 1.5 Pa·s) for roughened-surface formation according to foregoing B was applied to both sides of the substrate by a roll coater, and after being kept still horizontally for 20 minutes, the resin composition was dried at 60° C. for 30 minutes to form the resin layers 2a for roughened-surface formation.

Further, after that, the resin composition (viscosity 7 Pa·s) for roughened-surface formation according to forgoing A was applied to the resin layers 2a for roughened-surface formation and after being kept still horizontally for 20 minutes, the resin composition was dried at 60° C. for 30 minutes to form resin layers for roughened-surface formation 2b, and finally obtained 35 μm-thick resin layers for roughened-surface formation (reference to FIG. 7(b)).

(7) Photomasks drawing black circles of 85 μm diameter were closely stuck to both sides of the substrate 1 on which the layers of the resin compositions for the roughened-surface formation were formed as described in the foregoing step (6) and the substrate was exposed to light in 500 $mJ/cm^2$ intensity by an ultra high pressure mercury lamp and then subjected to spray development with a DMDG solution. After that, the resultant substrate was exposed to the light in 3000 $mJ/cm^2$ intensity of an ultra high pressure mercury lamp and then subjected to heating treatment at 100° C. for 1 hour, at 120° C. for 1 hour, and at 150° C. for 3 hours to form 35 μm-thick interlaminar resin insulating layers 2 having opening parts 6 for via-holes of 85 μm diameter with excellent size precision corresponding to the photomask films (reference to FIG. 7(c)).

(8) The substrate in which the opening parts for via-holes 6 were formed was immersed in a solution containing 800 g/l of chromic acid for 19 minutes at 70° C. to dissolve and remove the epoxy resin particles existing on the surfaces of the interlaminar resin insulating layers 2 and roughen the surfaces of the interlaminar resin insulating layers 2 to obtain the roughened surfaces (depth of 3 μm) (reference to FIG. 7 (d)).

(9) After that, the resultant substrate was immersed in a neutralization solution (made by Shiplay Co., Inc.) and washed with water.

Further, a palladium catalyst (Atotech Japan CO.) was supplied to the surface of the substrate subjected to the surface roughening treatment to stick catalyst cores to the surfaces of the interlaminar resin insulating layers 2 and the inner wall faces of the opening parts for via-holes 6.

(10) Next, the substrate was immersed in an electroless copper plating solution with the following composition to form electroless copper plating layers 12 of 0.8 μm thickness on the entire roughened surface (reference to FIG. 8 (a)).
[Electroless Plating Solution]

| NiSO$_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 40 mg/l |
| PEG (polyethylene glycol) | 0.10 g/l |

[Electroless Plating Condition]
For 40 minutes at 35° C. of solution temperature.

(11) A photosensitive dry film sold in the market was stuck to the electroless copper plating layers 12 and a mask was mounted thereon and exposure was carried out at 100 mJ/cm$^2$ and development treatment was carried out with an aqueous 0.8% sodium carbonate solution to form 25 μm-thick plating resist 3 (reference to FIG. 8 (b)).

(12) Next, after the substrate was washed with water at 50° C., degreased, and washed with water at 25° C. and further with sulfuric acid, electrolytic copper plating was carried out in the following conditions to form electrolytic copper plating layers 13 (reference to FIG. 8 (c)).
[Electroplating Solution]

| sulfuric acid | 2.24 mol/l |
| copper sulfate | 0.26 mol/l | an additive (Cupracid HL; by Atotech Japan CO.) 19.5 mol/l
[Electroless Plating Condition]

| current density | 1 A/dm$^2$ |
| duration | 65 minutes |
| temperature | 22 ± 2° C. |

(13) After the plating resist 3 was separated and removed with 5% KOH, the electroless plating layers 12 used to be under the plating resist 3 was dissolved and removed by etching with a mixed solution of sulfuric acid and hydrogen peroxide to form independent conductor circuits 5 (including via-holes 7) (reference to FIG. 8 (d)).

(14) The foregoing steps (5) to (13) were repeated to form further upper conductor circuits and obtain a multilayered printed circuit board. (reference to FIG. 9 (a) to FIG. 10 (b)).

(15) Next, a solder resist composition containing a P atom-containing epoxy resin was prepared by the following method.

A solder resist composition with an adjusted viscosity of 1.4±0.3 Pa·s at 25° C. was prepared by preparing a mixture composition by stirring and mixing 46.67 part by weight of a photosensitivity-provided oligomer (molecular weight 4000), which was a P atom-containing epoxy resin having the foregoing general formula [4] (wherein $X^1$ and $X^2$ are O (oxygen)) of which 50% epoxy group was acrylated and dissolved in diethylene glycol dimethyl ether (DMDG) to be in 60% by weight concentration, 6.67 part by weight of a bisphenol A type epoxy resin dissolved in methyl ethyl ketone to be in 80% by weight concentration, 1.6 part by weight of an imidazole curing agent (made by Shikoku Chemicals Corp.; 2E4MZ-CN), 4.5 part by weight of a bifunctional acrylic monomer (made by Nippon Kayaku Co., Ltd.; R 604), which was a photosensitive monomer, 1.5 part by weight of also a polyvalent acrylic monomer (made by Kyoei Chemical Co., Ltd.; DPE 6A), and 0.36 part by weight of a leveling agent (made by Kyoei Chemical Co., Ltd.; Polyflow No. 75) composed of an acrylic acid ester polymer in a container and adding 2.0 part by weight of benzophenone (made by Kanto Chemical Co., Inc.) as a photopolymerization initiator, 0.2 part by weight of Micheler's ketone (made by Kanto Chemical Co., Inc.) as a photosensitizer and 0.6 part by weight of DMDG to the mixture composition.

The viscosity measurement was carried out by a B-type viscometer (DVL-B type; by Tokyo Instruments Co. Ltd.), using a rotor No. 4 for 60 rpm and a rotor No. 3 for 6 rpm.

(16) Next, the foregoing solder resist composition was applied in 20 μm thickness on both sides of the multilayered circuit substrate and dried at 70° C. for 20 minutes and 70° C. for 20 minutes and after that, a 5 mm-thick photomask drawing a pattern corresponding to the opening parts of the solder resists were closely stuck to the solder resist layers and exposure by ultraviolet rays of 900 mJ/cm$^2$ and development treatment with pure water were successively carried out to form opening parts with 125 μm diameter.

Further, the solder resist layers were cured by UV curing treatment of 3000 mJ/cm$^2$ and by heating at 80° C. for 1 hour, at 100° C. for 1 hour, at 120° C. for 1 hour, and at 150° C. for 3 hours to form 25 μm-thick solder resist layers 14 having opening parts.

(17) After that, the substrate in which the solder resist layers 14 were formed was immersed in an electroless nickel plating solution at pH 5 containing nickel chloride (30 g/l), sodium hypophosphite (10 g/l), and sodium citrate (10 g/l) for 20 minutes to form 5 μm-thick nickel plating layers 15 in the opening parts. Further, the resultant substrate was immersed in an electroless plating solution containing potassium cyanoaurate (2 g/l), ammonium chloride (75 g/l), sodium citrate (50 g/l), and sodium hypophosphite (10 g/l) at 93° C. for 23 seconds to form 0.03 μm-thick gold plating layers 16 on the nickel plating layers 15.

(18) After that, a solder paste was printed on the opening parts of the solder resist layers 14 and reflow of the paste was carried out at 200° C. to form bumps (solder bodies) 17 and to manufacture a multilayered printed circuit board having the solder bumps 17 (reference to FIG. 10 (c)).

Example 15

A. Production of a Resin Film for an Interlaminar Resin Insulating Layer

An epoxy resin composition was prepared by dissolving 30 part by weight of bisphenol A type epoxy resin (epoxy equivalent 469; made by Yuka Shell Epoxy CO.; Epikote 1001), 40 part by weight of cresol novolak type epoxy resin (Epichlon N-673; epoxy equivalent 215; Dainippon Ink and Chemicals, Inc.), 30 part by weight of triazine structure-containing phenol novolak resin (Phenolite KA-7052; phenolic hydroxyl equivalent 120; Dainippon Ink and Chemicals, Inc.) in 20 part by weight of ethylene glycol acetate and 20 part by weight of solvent naphtha while heating and stirring them, and then adding 15 part by weight of epoxy-terminated polybutadiene rubber (made by Nagase Chemicals Ltd.; Denalex R-45EPT), 1.5 part by weight of a pulverized product of 2-phenyl-4,5-bis(hydroxymethyl)imidazole, 2 part by weight of a finely pulverized silica, and 0.5 part by weight of a silicon type defoaming agent to the resultant mixture.

The obtained epoxy resin composition was applied to a 38 µm-thick PET film by a roll coater, the thickness thereof is controlled to be 50 µm after drying, and then dried at 80 to 120° C. for 10 minutes to produce a resin film for an interlaminar resin insulating layer.

B. Method for Manufacturing a Multilayered Printed Circuit Board (1) A copper-laminated laminate plate composed of a substrate 1 which was made of a 1.0 mm-thick glass epoxy resin or BT (bismaleimide triazine) resin with 18 µm-thick copper foils 8 laminated on both sides of the substrate 1 was used as a starting material (reference to FIG. 32 (*a*)). At first, the copper-laminated laminate plate was pattern-etched to form the under-level conductor circuits 4 on both sides of the substrate 1.

Figure 32:
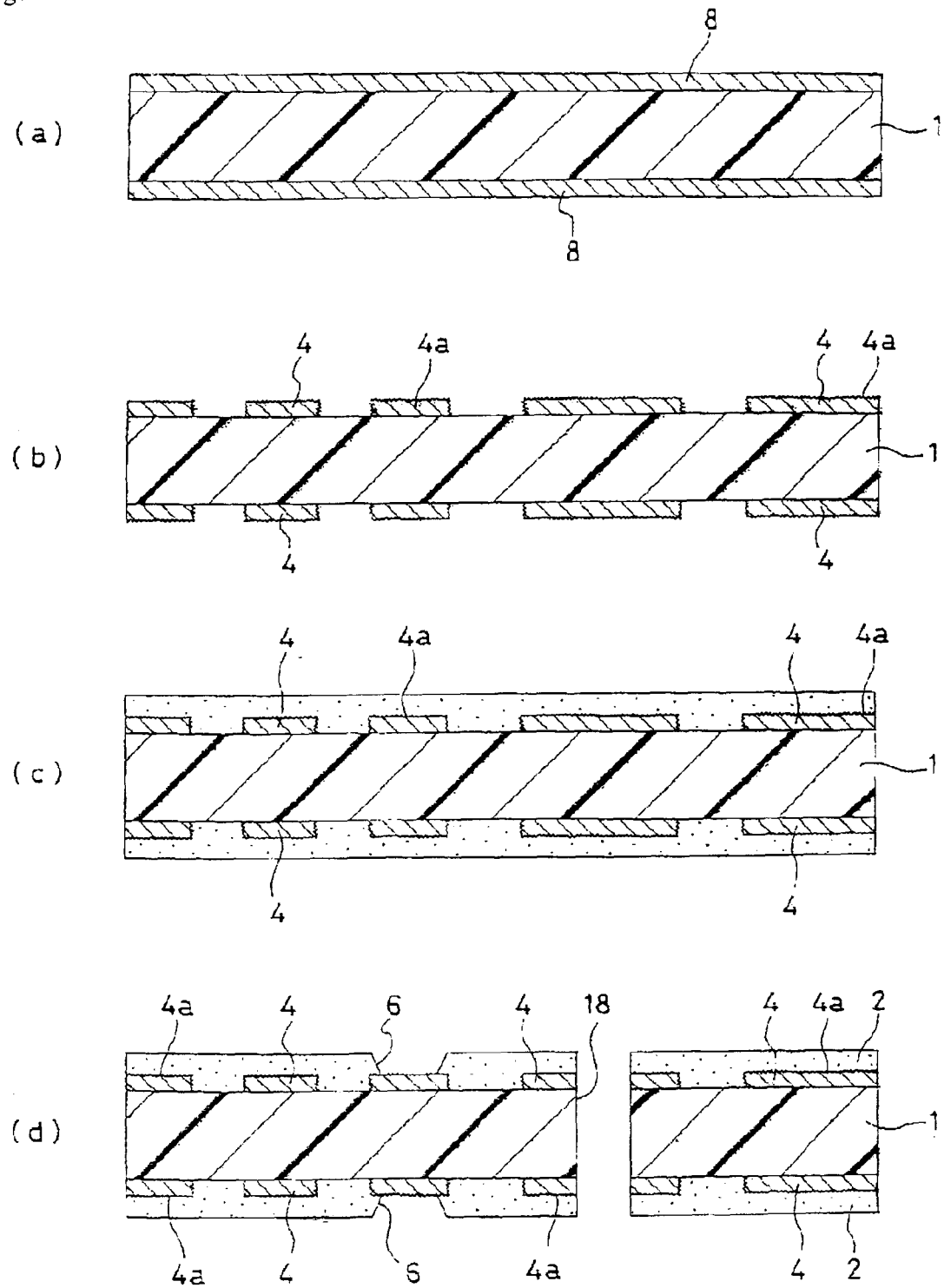
FIGS. 32 (*a*) to (*d*) are cross-section figures showing a part of a manufacturing processes of a multilayered printed circuit board of the present invention.

(2) The foregoing substrate was washed with water, degreased by an acid, and then soft-etched and after that an etching solution was sprayed to both sides of the substrate to etch the surfaces of the under-level conductor circuits 4 to form the roughened surfaces 4*a* on the entire surfaces of the under-level conductor circuits 4 (reference to FIG. 32 (*b*)). The etching solution used was an etching solution (made by Meck Co.; Meck etch bond) containing 10 part by weight of imidazole-Cu(II) complex, 7 part by weight of glycoric acid, and 5 part by weight of potassium chloride.

(3) Resin films for interlaminar resin insulating layers produced according to the description A, size of which is slightly larger than the substrate, were mounted on both sides of the substrate and temporarily pressure bonded at 0.4 MPa pressure and 80° C. temperature for 10 seconds and cut and after that, the films were stuck in the following conditions using a vacuum laminator equipment to form interlaminar resin insulating layers 2 (reference to FIG. 32 (*c*)). That is, the resin films for interlaminar resin insulating layers were mounted on the substrate and actually pressure-bonded in conditions of the degree of vacuum at 0.5 Torr, the pressure of 0.4 MPa, and the temperature of 80° C. for pressure-bonding duration of 60 seconds and then thermally cured at 170° C. for 30 minutes.

(4) Opening parts for via-holes 6 with 80 µm diameter were formed in the interlaminar resin insulating layers 2 by radiating $CO_2$ gas laser of 10.4 µm wavelength through a 1.2 mm-thick mask having through holes in conditions of the beam diameter of 4.0 mm, the top hat mode, the pulse width of 8.0 µs, 1.0 mm diameter of the through holes of the mask, and one shot.

Further, the substrate on which the interlaminar resin insulating layers 2 were formed was drilled by a drill to form through holes 18 (reference to FIG. 32 (*d*)).

Figure 33:
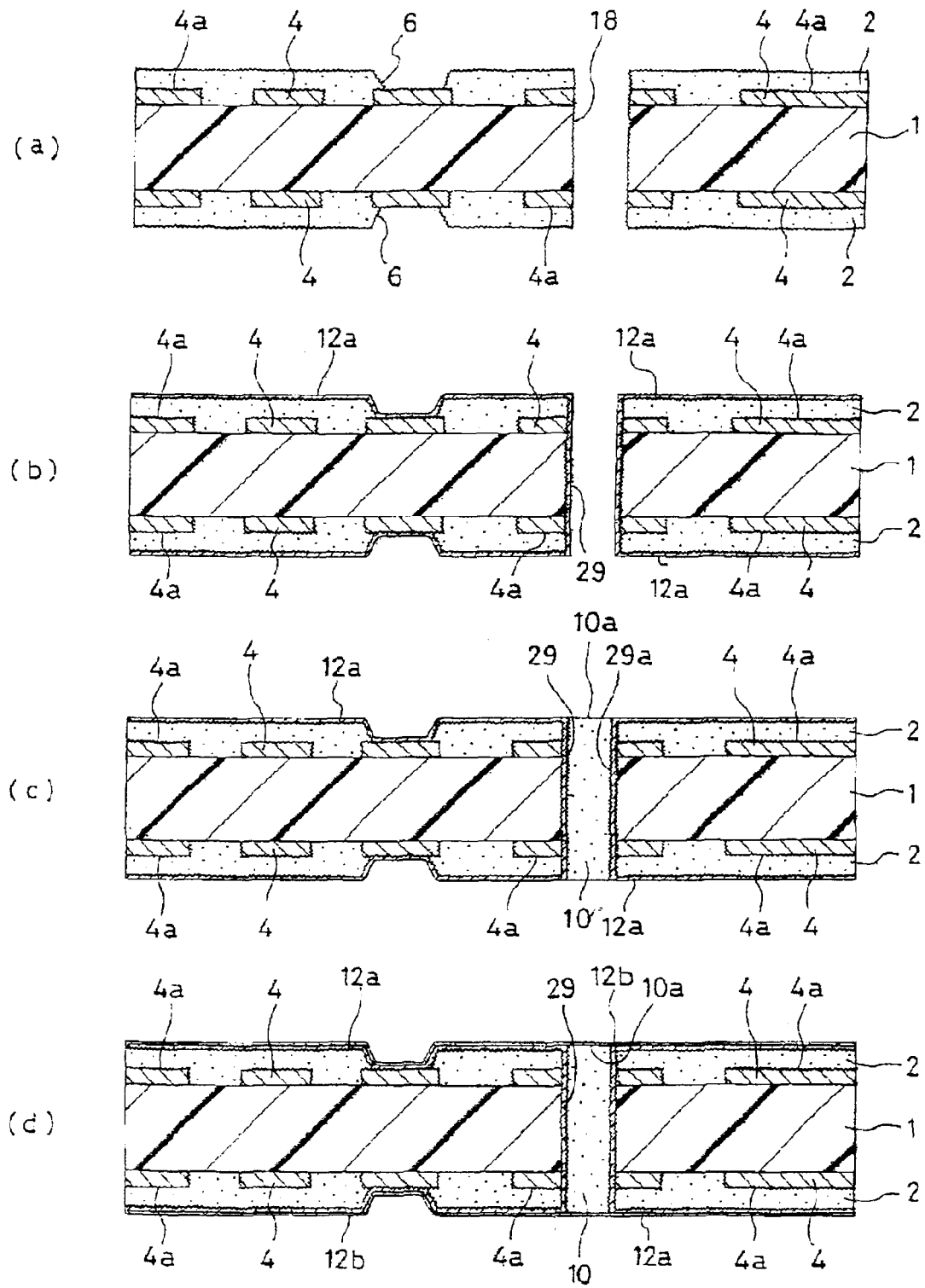
FIGS. 33 (*a*) to (*d*) are cross-section figures showing a part of a manufacturing processes of a multilayered printed circuit board of the present invention.

(5) The substrate in which the opening parts for via-holes 6 and the through holes 18 were formed was immersed in a solution containing 60 g/l of permanganic acid at 80° C. for 10 minutes to dissolve and remove the epoxy resin particle existing on the surfaces of the interlaminar resin insulating layers 2 and roughen the surfaces of the interlaminar resin insulating layers 2 (reference to FIG. 33 (*a*)).

Further, a palladium catalyst (Atotech Japan CO.) was supplied to the resultant substrate subjected to the surface-roughening treatment (roughening depth 6 µm) to stick catalyst cores to the surfaces of the interlaminar resin insulating layers 2, the surfaces of the through holes 18, and the inner wall faces of the opening parts 6 for via-holes.

(6) Next, the substrate was immersed in an electroless copper plating solution with the following composition to form electroless copper plating films 12*a* of 0.6 to 3.0 µm thickness on the entire roughened surface (reference to FIG. 33 (*b*)).

[Electroless Plating Solution]

| | |
|---|---|
| $NiSO_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 40 mg/l |
| PEG (polyethylene glycol) | 0.10 g/l |

[Electroless Plating Condition]
For 40 minutes at 35° C. of solution temperature.

(7) The substrate on which the electroless plating films 12*a* were formed was washed with water and dried and then subjected to blackening treatment in a blackening bath (an oxidizing bath) of an aqueous solution containing NaOH (10 g/l) $NaClO_2$ (40 g/l), and $Na_3PO_4$ (6 g/l) and reducing treatment in a reducing bath of an aqueous solution containing NaOH (10 g/l) and $NaBH_4$ (6 g/l) to form roughened surfaces on the entire surfaces of the electroless plating films 12*a*.

(8) After the foregoing resin filler was prepared according to the foregoing description B, the resin filler 10 was squeezed into the plated-through holes 29 within 24 hours after preparation of the resin filler as described below.

That is, the resin filler was squeezed into the plated-through holes 29 using a squeegee and then dried at 100° C. for 20 minutes.

On completion of the drying, buffing was carried out to level the surfaces of the electroless plating films 12*a* and the surface layer parts 10*a* of the resin filler. After that, heating treatment was carried out at 100° C. for 1 hour, at 120° C. for 3 hours, at 150° C. for 1 hour, and 180° C. for 7 hours to cure the resin filler 10 (reference to FIG. 33 (*c*)).

(9) A palladium catalyst (Atotech Japan CO.) was supplied on the surface layer parts 10*a* of the resin filler to stick catalyst cores to the surface layer parts 10*a* of the resin filler. Further, an electroless plating was carried out in the same conditions as those in the foregoing step (6) to further form electroless plating films 12*b* of 0.6 to 3.0 µm thickness on the electroless plating films 12*a* formed in the foregoing step (6) and the surface layer parts 10a of the resin filler (reference to FIG. 33 (d)). By the process, cover plating layers were formed on the plated-through holes 29.

Figure 34:
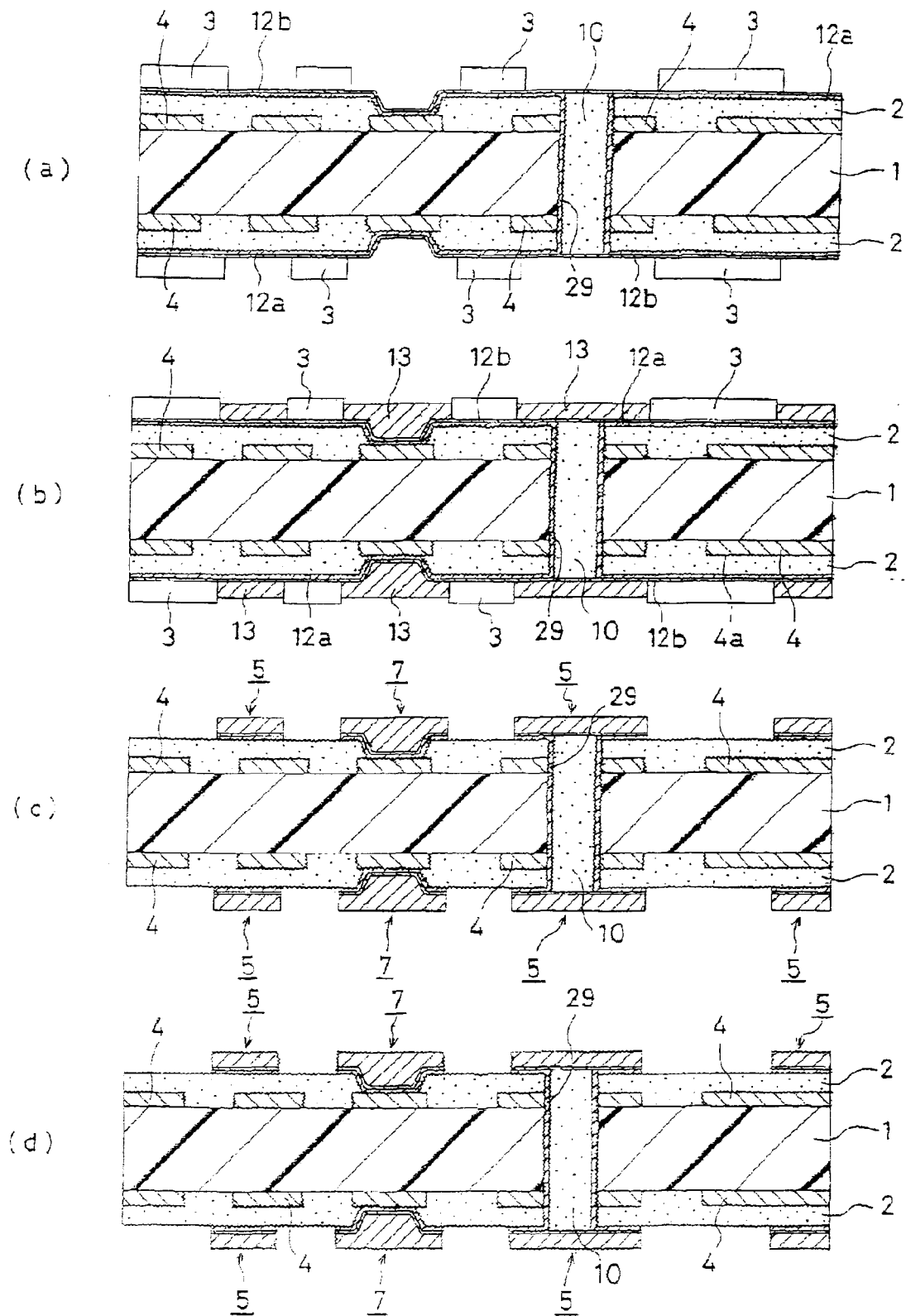
FIGS. 34 (*a*) to (*d*) are cross-section figures showing a part of a manufacturing processes of a multilayered printed circuit board of the present invention.

(10) A photosensitive dry film sold in the market was stuck to the electroless plating films 12b, then a mask was mounted thereon, after that, exposure was carried out at 100 mJ/cm$^2$, and development treatment was carried out with an aqueous 0.8% sodium carbonate solution to form 30 μm-thick plating resist 3 (reference to FIG. 34 (a)).

(11) Next, the substrate was washed with water at 50° C. and degreased, washed again with water at 25° C., and further washed with sulfuric acid and then, electrolytic copper plating was carried out in the following conditions to form 20 μm-thick electrolytic copper plating films 13 (reference to FIG. 34 (b)).

[Electroplating Solution]

| | |
|---|---|
| sulfuric acid | 2.24 mol/l |
| copper sulfate | 0.26 mol/l |
| an additive | 19.5 mol/l |

(Cupracid HL; by Atotech Japan Co.)
[Electroless Plating Condition]

| | |
|---|---|
| current density | 1 A/dm$^2$ |
| duration | 65 minutes |
| temperature | 22 ± 2° C. |

(12) After the plating resist 3 was separated and removed with 5% NaOH, the electroless plating films 12a, 12b used to be under the plating resist 3 were dissolved and removed by etching with a mixed solution of sulfuric acid and hydrogen peroxide to form conductor circuits 5 (including via-holes 7) with 18 μm thickness comprising the electroless copper plating layers 12 and the electrolytic copper plating films 13 (reference to FIG. 34 (c)).

(13) The same treatment of the step (5) was carried out and then roughened surface was formed by an etching solution containing a cupric complex and an organic acid (reference to FIG. 34 (d)).

Figure 35:
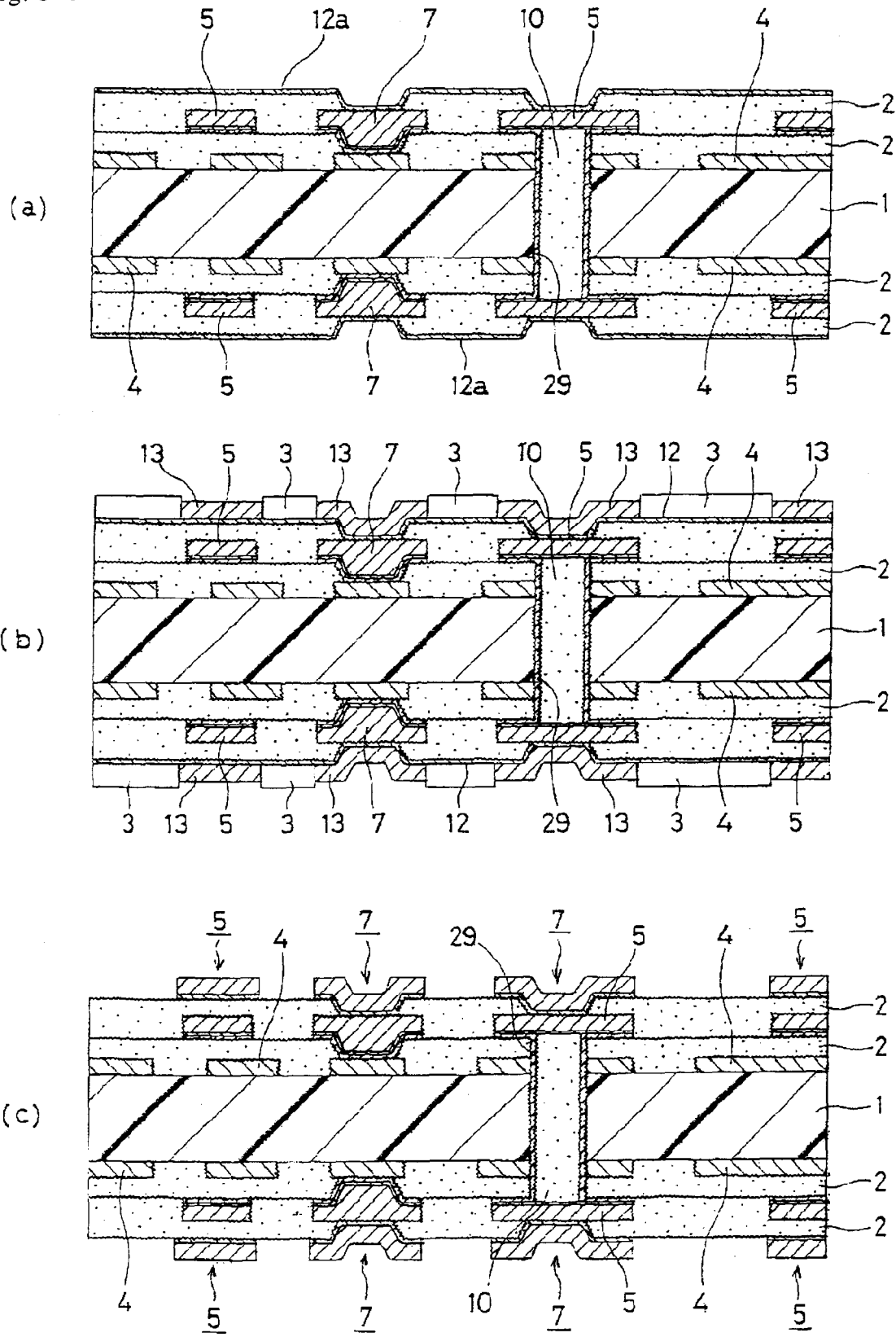
FIGS. 35 (*a*) to (*c*) are cross-section figures showing a part of a manufacturing processes of a multilayered printed circuit board of the present invention.
Figure 36:
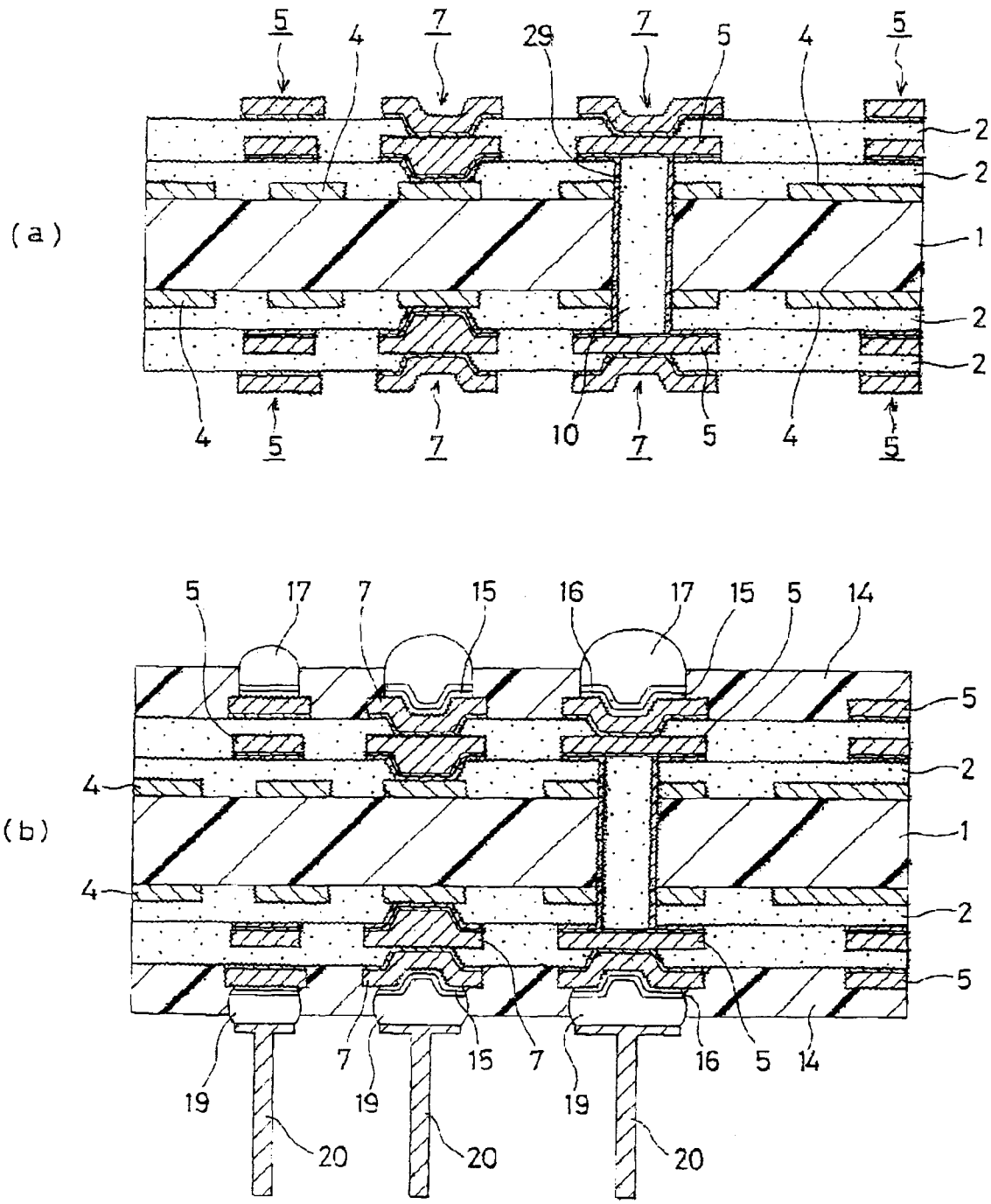
FIGS. 36 (*a*) and (*b*) are cross-section figures showing a part of a manufacturing processes of a multilayered printed circuit board of the present invention.

(14) The foregoing steps (6) to (13) were repeated to form further upper layer conductor circuits and obtain a multilayered circuit board (reference to FIG. 35 (a) to FIG. 36 (a)).

(15) Next, a solder resist composition containing a P atom-containing epoxy resin was prepared by the following method.

A solder resist composition with an adjusted viscosity of 1.4±0.3 Pa·s at 25° C. was prepared by preparing a mixture composition by stirring and mixing 46.67 parts by weight of photosensitivity-provided oligomer (molecular weight: 4000) which was a cresol novolak type epoxy resin (made by Nippon Kayaku Co., Ltd.) whose 50% of epoxy group was acrylated and which was dissolved to be 60 wt. % concentration in diethylene glycol methyl ether (DMDG), 6.67 part by weight of a P atom-containing epoxy resin having the foregoing general formula [4] (wherein X$^3$ represents a single bond and R represents butyl group) dissolved in methyl ethyl ketone to be in 80% by weight concentration, 1.6 part by weight of an imidazole curing agent (made by Shikoku Chemicals Corp.; 2E4MZ-CN), 4.5 part by weight of a bifunctional acrylic monomer (made by Nippon Kayaku Co., Ltd.; R 604), which was a photosensitive monomer, 1.5 part by weight of also a polyvalent acrylic monomer (made by Kyoei Chemical Co., Ltd.; DPE 6A), and 0.36 part by weight of a leveling agent (Polyflow No. 75; Kyoei Chemical Co., Ltd.) composed of an acrylic acid ester polymer in a container and adding 2.0 part by weight of benzophenone (made by Kanto Chemical Co., Inc.) as a photopolymerization initiator, 0.2 part by weight of Micheler's ketone (made by Kanto Chemical Co., Inc.) as a photosensitizer and 0.6 part by weight of DMDG to the mixture composition.

(16) Next, the foregoing solder resist composition was applied in 20 μm thickness on both sides of the multilayered circuit substrate and dried at 70° C. for 20 minutes and 70° C. for 20 minutes, and after that, a 5 mm-thick photomask drawing a pattern corresponding to the opening part of the solder resist was closely stuck to the solder resist layers and exposure by ultraviolet rays of 900 mJ/cm$^2$ and development treatment with pure water were successively carried out to form opening parts with 125 μm diameter.

Further, the solder resist layers were cured by UV curing treatment of 3000 mJ/cm$^2$ and by heating at 80° C. for 1 hour, at 100° C. for 1 hour, at 120° C. for 1 hour, and at 150° C. for 3 hours to form 25 μm-thick solder resist layers 14 having opening parts.

(17) After that, the substrate in which the solder resist layers 14 were formed was immersed in an electroless nickel plating solution at pH 4.5 containing nickel chloride (2.3× 10$^{-1}$ mol/l), sodium hypophosphite (2.8×10$^{-1}$ mol/l), and sodium citrate (1.6×10$^{-1}$ mol/l) for 20 minutes to form 5 μm-thick nickel plating layers 15 in the opening parts. Further, the resultant substrate was immersed in an electroless gold plating solution containing potassium cyanoaurate (7.6× 10$^{-3}$ mol/l), ammonium chloride (1.9×10$^{-1}$ mol/l), sodium citrate (1.2×10$^{-1}$ mol/l), and sodium hypophosphite (1.7× 10$^{-1}$ mol/l) at 80° C. for 7.5 minutes to form 0.03 μm-thick gold plating layers 16 on the nickel plating layers 15.

(18) After that, a solder paste containing tin-lead was printed on the opening parts of the solder resist layer 14 on the side of the substrate where IC chips were to be mounted and a solder paste containing tin-antimony was printed on the opening parts of the solder resist layer 14 on the other side of the substrate, and pins were set on the latter solder paste, and after that, reflow of the pastes was carried out at 200° C. to form solder bumps (solder bodies) 17 in the side where the IC chips were to be mounted and to form PGA in the other side and thus manufacture a multilayered printed circuit board (reference to FIG. 36 (b)).

Example 16

A multilayered printed circuit board was manufactured in the same manner as the example 14 except that a solder resist composition was prepared by additionally adding 10 part by weight of a spherical silica with the average particle diameter of 1.0 μm as an inorganic filler in the step (15) in the example 14.

Example 17

A multilayered printed circuit board was manufactured in the same manner as the example 14 except that a solder resist composition was prepared by additionally adding 10 part by weight of a spherical silica with the average particle diameter of 1.0 μm as an inorganic filler in the step (15) in the example 14.

Comparative Example 7

A multilayered printed circuit board was manufactured in the same manner as the example 14 except that a solder resist resin composition adjusted as to have a viscosity of 1.4±0.3 Pa·s at 25° C. was obtained by blending 46.67 parts by weight of photosensitivity provided oligomer (molecular weight: 4000) which was a cresol novolak type epoxy resin (made by Nippon Kayaku Co., Ltd.) whose 50% of epoxy group was acrylated and which was dissolved in 60 wt. % concentration in diethylene glycol methyl ether (DMDG), 6.67 parts by weight of a bisphenol A type epoxy resin (made by Yuka Shell Epoxy Co.: Epikote 1001) dissolved to be 80 wt. % concentration in methyl ethyl ketone, 1.6 parts by weight of an imidazole curing agent (made by Shikoku Chemicals Corp.: 2E4MZ-CN), 4.5 parts by weight of a bifunctional acrylic monomer, which is a photosensitive monomer, (made by Nippon Kayaku Co., Ltd.: R 604), 1.5 parts by weight of also a polyvalent acrylic monomer (made by Kyoei Chemical Co., Ltd.: DPE 6A), 0.36 part by weight of a leveling agent (Polyflow No. 75; Kyoei Chemical Co., Ltd.) comprising an acrylic acid ester polymer in a container and mixing and stirring the obtained mixture and further adding 2.0 parts by weight of benzophenone (made by Kanto Chemical Co., Inc.) as a photopolymerization initiator to the obtained mixture composition and 0.2 parts by weight of Michler's ketone (made by Kanto Chemical Co., Inc.) as a photosensitizer and 0.6 part by weight of DMDG to the mixture composition.

Comparative Example 8

A multilayered printed circuit board was manufactured in the same manner as the example 15 except that a solder resist composition the same as that in the comparative example 1 was prepared.

Next, regarding the multilayered printed circuit boards manufactured in the examples 14 to 17 and comparative examples 7, 8, the flame retardancy, the openability of holes, generation of the peeling between a solder resist layer and a conductor circuit, and generation of the cracking in a solder resist layer were evaluated by the following methods and the results were shown in Table 3.

Evaluation Method
(1) Evaluation of the Flame Retardancy

According to the standard of UL 94, multilayered printed circuit boards were cut and subjected to a flame retardancy test by a perpendicular method and evaluated based on the following evaluation standard. Incidentally, the size of the testing specimen was 12.7 mm×127 mm× the appointed thickness.

Evaluation Standard
○: clear the judgment standard of 94V-0
x: not clear the judgment standard of 94V-0
(2) Evaluation of the Openability of Holes In examples 1 to 4 and comparative examples 1, 2, after an opening part was formed in a solder resist layer and cured, the shape of the opening part was observed by a microscope before a plating layer was formed in the opening part and further, on completion of the manufacture of a multilayered printed circuit board, the part where a solder bump of the multilayered printed circuit board was formed was cut and the cut cross-section was observed by a microscope to observe the cross-section shape of the opening part formed in the solder resist layer and evaluate the shape based on the following evaluation standard.

Evaluation Standard
○: The shape of the opening part observed in a plain view was a desired one and resin was not left in the conductor circuit surface exposed out the opening.

x: The shape of the opening part was gradually narrowed and resin was left on the conductor circuit surface exposed out the opening, or opening part was not opened.
(3) Observation of the Generation of the Peeling and Cracking In the same manner as the foregoing (2), a multilayered printed circuit board was cut and the cross-section was observed by a microscope to observe whether peeling took place between a solder resist layer and a conductor circuit or not and further whether cracking took place in the solder resist layer.

Further, a heat cycle test was carried out by repeating the cycle of keeping a multilayered printed circuit board in −65° C. environments for 3 minutes and in 130° C. environments for 3 minutes 1000 times and then in the same manner as described above, whether peeling took place between a solder resist layer and a conductor circuit or not was observed and further whether cracking took place in the solder resist layer or not was observed.

TABLE 3

|  | examples | | | | comparative examples | |
| --- | --- | --- | --- | --- | --- | --- |
|  | 14 | 15 | 16 | 17 | 7 | 8 |
| flame retardancy | ○ | ○ | ○ | ○ | X | X |
| openability of holes | ○ | ○ | ○ | ○ | ○ | ○ |
| generation of peeling or cracking before a heat cycle test | none | none | none | none | none | none |
| generation of peeling or cracking after a heat cycle test | none | none | none | none | none | none |

As being made clear in Table 3, the multilayered printed circuit boards manufactured by the examples 14 to 17 satisfied the judgment standard of 94V-0 in the test standard of UL 94.

Further, the solder resist layers formed in the multilayered printed circuit boards had excellent openability of holes and were free from cracking and peeling from the conductor circuits. On the other hand, the multilayered printed circuit board manufactured by the comparative examples 7, 8 did not satisfy the judgment standard of 94V-0 owing to long combustioning duration and were inferior in the flame retardancy.

INDUSTRIAL APPLICABILITY

As described above, according to a multilayered printed circuit board of the first invention of the first group of the present invention, since the foregoing solder resist layer of the multilayered printed circuit board contains an inorganic filler, the linear expansion coefficient is lowered to prevent generation of cracking attributed to the difference of the thermal expansion coefficient between the solder resist layer and other parts in the manufacturing process of the printed circuit board and after the electronic parts and the like such as an IC chip are mounted on the printed circuit board and the like.

Further, according to a solder resist composition of the second invention of the first group of the present invention, since the solder resist composition contains an inorganic filler, a solder resist layer containing the inorganic filler can be formed in the printed circuit board by using the solder resist composition and consequently no cracking and the like takes place attributed to the difference of the thermal expansion coefficient between the solder resist layer and other parts in the manufacturing process of the printed circuit board and the like.

Further, according to a method for manufacturing a multilayered printed circuit board of the third invention of the first group of the present invention, a multilayered printed circuit board of the first invention of the first group of the present invention can desirably be manufactured.

Further, according to a multilayered printed circuit board of the first invention of the second group of the present invention, since the solder resist layer of the multilayered printed circuit board contains an elastomer component, the stress affecting the solder resist layer of the multilayered printed circuit board can be absorbed and moderated and consequently, cracking does not easily take place attributed to the difference of the thermal expansion coefficient between the solder resist layer and other parts, in the manufacturing process of the printed circuit board and after the electronic parts of such as an IC chip are mounted on the printed circuit board and even if cracking takes place, the cracks do not grow big.

Further, according to a solder resist composition of the second invention of the second group of the present invention, since the solder resist composition contains an elastomer component, a solder resist layer containing the elastomer component can be formed in the printed circuit board by using the solder resist composition and consequently, cracking does not easily take place attributed to the difference of the thermal expansion coefficient between the solder resist layer and other parts in the manufacturing process of the printed circuit board and the like, and even if cracking takes place, the cracks do not grow big.

Further, according to a method for manufacturing a multilayered printed circuit board of the third invention of the second group of the present invention, a multilayered printed circuit board of the first invention of the second group of the present invention can desirably be manufactured.

Further, since a multilayered printed circuit board of the first invention of the third group of the present invention has a dielectric constant of 3.0 or lower at 1 GHz, signal delay and signal errors do not easily take place even if high frequency signals in the GHz band are used.

Further, since a multilayered printed circuit board of the second invention of the third group of the present invention comprises a polyolefin type resin for the solder resist layer, signal delay and signal errors do not easily take place even if high frequency signals in the GHz band are used.

Further, since a semiconductor device of the third invention of the third group of the present invention comprises a polyolefin type resin for the solder resist layer and a polyolefin type resin for the resin interlaminar insulating layers, the dielectric constant and the dielectric loss tangent are low and consequently, even in case of a semiconductor device on which an IC chip and the like utilizing high frequency signals in the GHz band are mounted, signal delay and signal errors do not easily take place.

In a multilayered printed circuit board of the first invention of the fourth group of the present invention, since the solder resist layer has a dielectric loss tangent of 0.01 or lower at 1 GHz, signal delay and signal errors do not easily take place even if high frequency signals in the GHz band are used.

Further, in a multilayered printed circuit board of the second invention of the fourth group of the present invention, since a polyphenylene ether resin is used for the solder resist layer, signal delay and signal errors do not easily take place even if high frequency signals in the GHz band are used.

Further, in a semiconductor device of the third invention of the fourth group of the present invention, since a polyphenylene ether resin is used for the solder resist layer and a polyphenylene ether resin and the like is used for the resin interlaminar insulating layers, the dielectric constant and the dielectric loss tangent are low and consequently, even in case of a semiconductor device on which an IC chip and the like utilizing high frequency signals in the GHz band are mounted, signal delay and signal errors do not easily take place.

A multilayered printed circuit board of the fifth group of the present invention comprises a solder resist layer having excellent flame retardancy, a high adhesion strength to a conductor circuit and opening parts with a desired shape.

What is claimed as new and desired to be secured by Letters Patent of the United States is:

1. A multilayered printed circuit board comprising:
   a substrate;
   a plurality of conductor circuits formed over the substrate and including an outermost conductor circuit;
   at least one resin insulating layer formed over the substrate and between the conductive circuits; and
   a solder resist layer comprising one of a photo-setting resin and a thermo-setting resin, the solder resist further comprising an inorganic filler comprising a plurality of inorganic particles, the inorganic particles being dispersed in the solder resist layer in an amount and a size sufficient to decrease a thermal expansion coefficient of the solder resist layer such that a stress generated in the solder resist layer due to thermal expansion is moderated,
   wherein the solder resist layer is formed over the conductor circuits and resin insulating layer and provided as an outermost layer with respect to the conductor circuits and resin insulating layer, and the outermost conductor circuit has a pad portion exposed by an opening of the solder resist layer and configured to be connected to an IC chip;
   wherein said solder resist layer contains an elastomer having a content in a range from 1% to 20% by weight.

2. The multilayered printed circuit board according to claim 1, wherein said inorganic filler is at least one member selected from the group consisting of an aluminum compound, a calcium compound, a potassium compound, a magnesium compound and a silicon compound.

3. The multilayered printed circuit board according to claim 1, wherein said inorganic filler has a particle diameter within a range from 0.1 to 5.0 μm.

4. The multilayered printed circuit board according to claim 1, wherein the mixing ratio of the inorganic filler is within a range from 3 to 50% by weight.

5. The multilayered printed circuit board according to claim 1, wherein the inorganic filler in the solder resist layer has a content in a range from 5 to 40% by weight.

6. The multilayered printed circuit board according to claim 1, wherein the elastomer in the solder resist layer has a content in a range from 5 to 10% by weight.

7. The multilayered printed circuit board according to claim 1, wherein the amount of the inorganic particles is sufficient to lower a linear expansion coefficient of the solder resist layer.

* * * * *